(12) United States Patent
Takahashi

(10) Patent No.: US 8,446,171 B2
(45) Date of Patent: May 21, 2013

(54) SIGNAL PROCESSING UNIT

(75) Inventor: Yasuyuki Takahashi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/453,160

(22) Filed: Apr. 23, 2012

(65) Prior Publication Data

US 2012/0274356 A1 Nov. 1, 2012

(30) Foreign Application Priority Data

Apr. 29, 2011 (JP) ................................ 2011-102574
May 14, 2011 (JP) ................................ 2011-108903

(51) Int. Cl.
*G06F 7/38* (2006.01)
*H03K 19/173* (2006.01)

(52) U.S. Cl.
USPC .................. 326/46; 326/62; 326/80; 326/93

(58) Field of Classification Search
None
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,788,567 B2 * | 9/2004 | Fujimori ........................ 365/154 |
| 6,944,045 B2 * | 9/2005 | Fujimori ........................ 365/145 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Kamiya Toshio; Nomura Kenji; Hosono Hideo Carrier transport properties and electronic structures of amorphous oxide semiconductors: the present status Kotai Butsuri, vol. 44, Issue 9, pp. 621-633, published in Japan in 2009.

(Continued)

*Primary Examiner* — Anh Tran
(74) *Attorney, Agent, or Firm* — Eric J. Robinson; Robinson Intellectual Property Law Office, P.C.

(57) ABSTRACT

A signal processing unit with reduced power consumption is provided. A transistor in which a channel is formed in an oxide semiconductor is used for a storage circuit included in the signal processing unit, so that data can be held (stored) even while supply of power is stopped. Non-destructive reading can be performed on the data stored in the storage circuit even when supply of power to the signal processing unit is stopped.

19 Claims, 29 Drawing Sheets

U.S. PATENT DOCUMENTS

| | | |
|---|---|---|
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0089975 A1 | 4/2011 | Yamazaki et al. |
| 2011/0101332 A1 | 5/2011 | Yamazaki et al. |
| 2011/0121878 A1 | 5/2011 | Kato et al. |
| 2011/0148463 A1 | 6/2011 | Kato et al. |
| 2011/0176357 A1* | 7/2011 | Koyama et al. ............... 365/149 |
| 2011/0187410 A1 | 8/2011 | Kato et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-078836 | 3/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-006290 | 1/2007 |
| WO | WO-2004/114391 | 12/2004 |

OTHER PUBLICATIONS

Jeon.S et al., "180nm Gate Length Amorphous InGaZnO Thin Film Transistor for High Density Image Sensor Applications,", IEDM 10: Technical Digest of International Electron Devices Meeting, Dec. 6, 2010, pp. 504-507.

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO system,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applies Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition: The "Blue Phase",", Physics Letters, Sep. 10, 1973, vol. 45A, No. 2, pp. 115-116.
Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09:SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic film and its Bending Properties,", SID Digest '09 : SID International Symposium Digest of Technical Papers, May 31, 2009, pp. 983-985.
Sakata.J et al., "Development of 4.0-IN. AMOLED Display With Driver Circuit Using Amorphous In-Ga-Zn-Oxide TFTS,", IDW '09 : Proceedings of the 16th International Display Workshops, 2009, pp. 689-692.
Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.
Osada.T et al., "Development of Driver-Integrated Panel Using Amorphous In-Ga-Zn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.
Ohara.H et al., "21.3:4.0 IN. QVGA AMOLED Display Using In-Ga-Zn-Oxide TFTS With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3-A2O3-BO Systems [A; Fe, Ga, Or Al; B: Mg, Mn, Fe, Ni, Cu,Or Zn] at Temperatures Over 1000° C,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", JpnN. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S at al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Elecreochemical Society), 2008, vol. 155, No. 12, H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

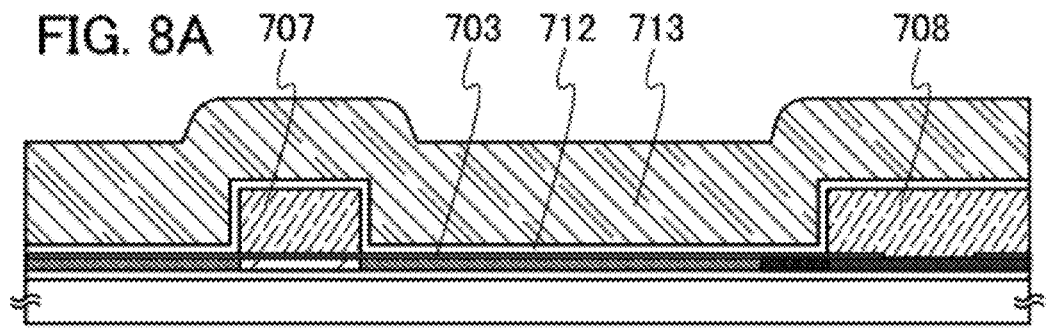
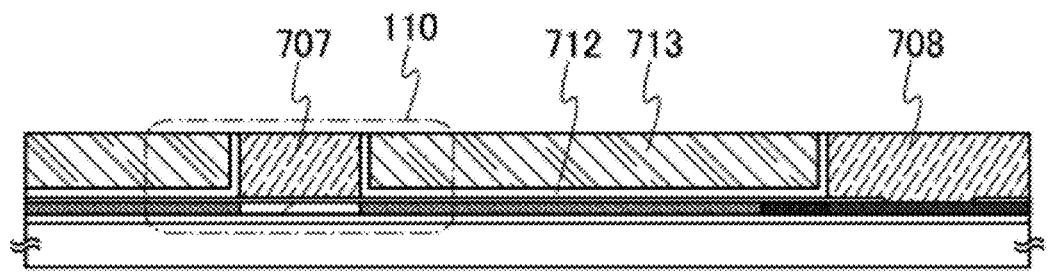
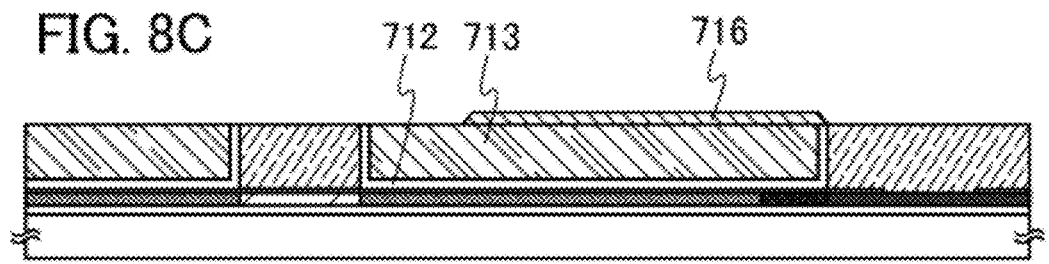

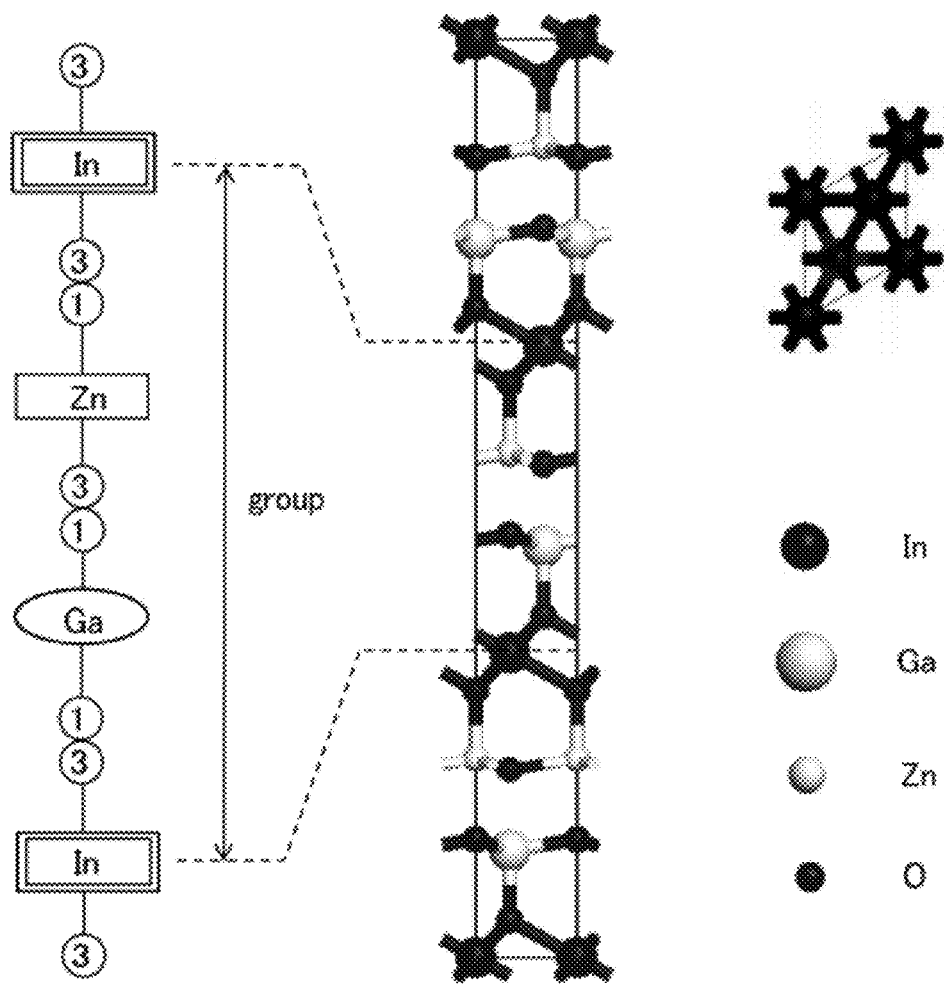

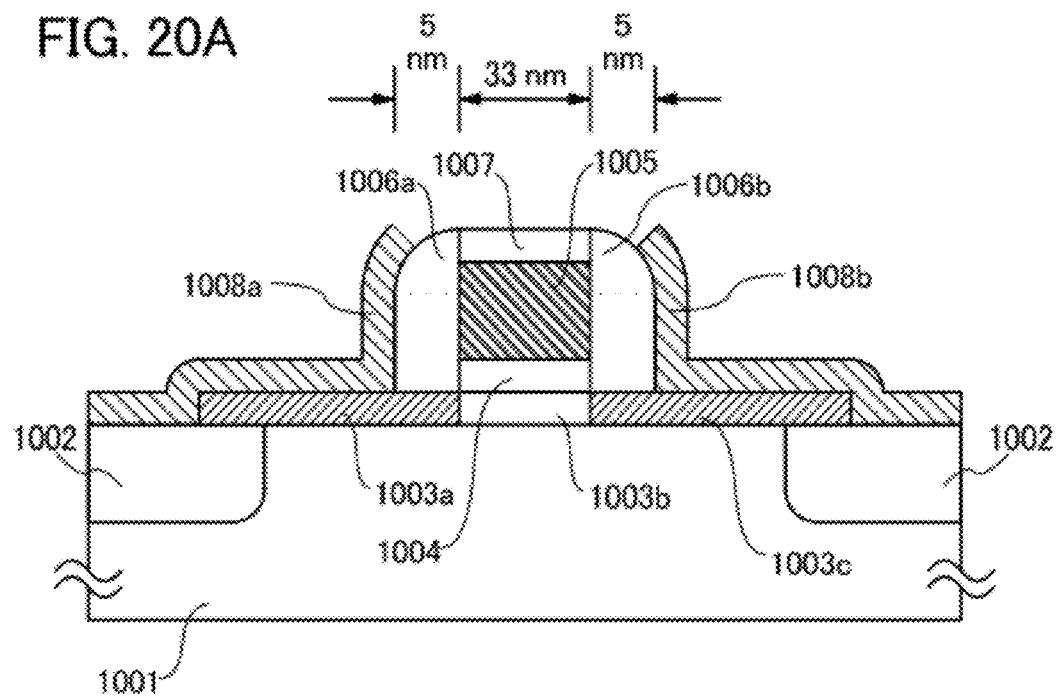
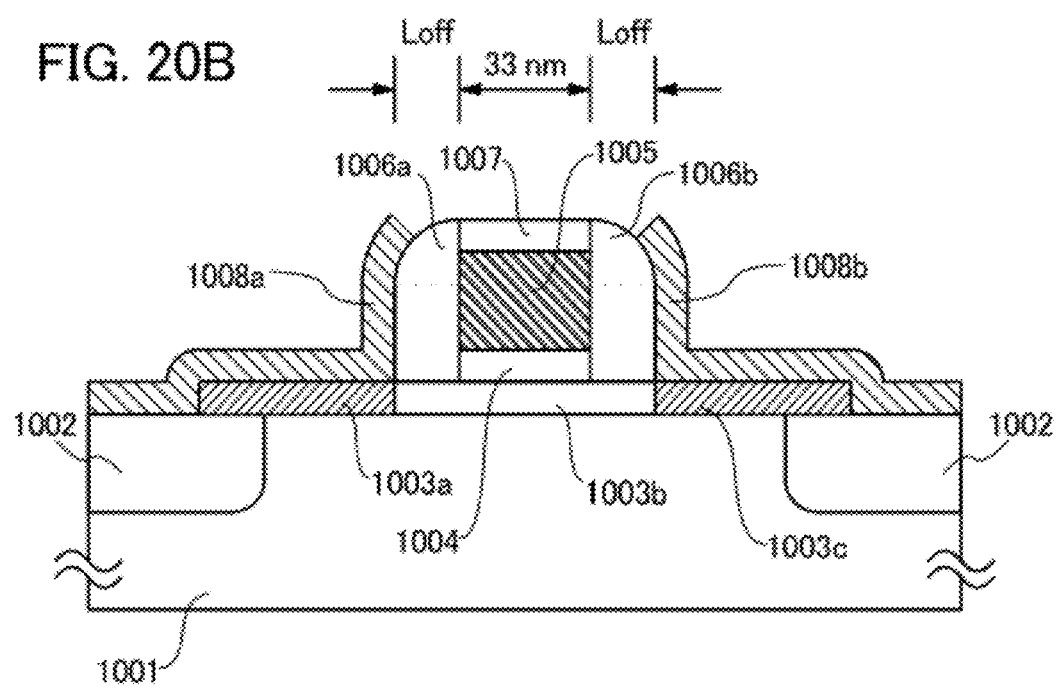

SIGNAL PROCESSING UNIT

BACKGROUND OF THE INVENTION

1. Field of the Invention

The present invention relates to a signal processing unit that can keep data even when a power source is turned off. The present invention also relates to a signal processing unit that can read data stored even when a power source is turned off.

In this specification, a "semiconductor device" refers to a device that can function by utilizing semiconductor characteristics; a semiconductor element, an electro-optical device, a storage device, a signal processing unit, a semiconductor circuit, and an electronic device are all included in the category of the semiconductor device.

2. Description of the Related Art

A signal processing circuit such as a central processing unit (CPU) has a variety of configurations depending on its application but is generally provided with some kinds of storage devices such as a register and a cache memory as well as a main memory for storing data or a program. A register has a function of temporarily holding data for carrying out arithmetic processing, holding a program execution state, or the like. In addition, a cache memory is located between an arithmetic circuit and a main memory in order to reduce access to the main memory and speed up the arithmetic processing.

In a storage device such as a register or a cache memory, writing of data needs to be performed at higher speed than in a main memory. Thus, in general, a flip-flop or the like is used as a register, and a static random access memory (SRAM) or the like is used as a cache memory. That is, a volatile storage device in which data is erased when power supply potential is stopped is used for such a register, a cache memory, or the like.

In order to reduce power consumption, a method for temporarily stopping supply of power to a signal processing circuit in a period during which data is not input and output has been suggested. In the method, a nonvolatile storage device is located in the periphery of a volatile storage device such as a register or a cache memory, so that the data is temporarily stored in the nonvolatile storage device. Thus, the data signal stored in the register, the cache memory, or the like can be held even while supply of power supply potential is stopped in the signal processing circuit (for example, see Patent Document 1).

In addition, when supply of power is stopped for a long time in a signal processing circuit, data in a volatile storage device is transferred to an external storage device such as a hard disk or a flash memory before the supply of power is stopped, so that the data can be prevented from being erased.

REFERENCE

[Patent Document]
[Patent Document 1] Japanese Published Patent Application No. H10-078836

SUMMARY OF THE INVENTION

In the case where data of a volatile storage device is stored in a nonvolatile storage device located in the periphery of the volatile storage device while the supply of power is stopped in a signal processing unit, such a nonvolatile storage device is mainly formed using a magnetic element or a ferroelectric; thus, the manufacturing process of the signal processing unit is complex.

In the case where data of the volatile storage device is stored in the external storage device while supply of power is stopped in the signal processing unit, it takes a long time for returning data from the external storage device to the volatile storage device. Therefore, back up of data using the external storage device is not suitable in the case where the supply of power is stopped for a short time to reduce power consumption.

In view of the foregoing, it is an object of one embodiment of the present invention to provide a signal processing unit that can reduce power consumption.

Further, it is another object of one embodiment of the present invention to provide a signal processing unit that can read data stored even while supply of power is stopped.

A transistor in which a channel is formed in an oxide semiconductor is used for a storage circuit, so that data can be held (stored) even while supply of power is stopped. Further, data stored can be read even while supply of power is stopped.

A storage circuit including a transistor in which a channel is formed in an oxide semiconductor can perform non-destructive reading; therefore, data can be read plural times even while supply of power is stopped.

A signal processing unit of one embodiment of the present invention includes a power supply circuit, a logic circuit, and a storage circuit. The storage circuit includes a capacitor and a transistor that controls supply, holding, and release of charge in the capacitor. The power supply circuit supplies power to the logic circuit and the storage circuit. The logic circuit stores an arithmetic result of a signal input in the storage circuit. The storage circuit holds the arithmetic result even when supply of power is stopped in such a manner that a transistor is turned off before supply of power from the power supply circuit is stopped.

Further, a signal processing unit of one embodiment of the present invention includes a first power supply circuit, a logic circuit, and a storage circuit. The storage circuit includes a capacitor and a transistor that controls supply, holding, and release of charge in the capacitor. The first power supply circuit supplies power to the logic circuit and the storage circuit. The logic circuit stores an arithmetic result of a signal input in the storage circuit. The storage circuit holds the arithmetic result even when supply of power is stopped in such a manner that a transistor is turned off before supply of power from the first power supply circuit is stopped. The arithmetic result held in the storage circuit is detected by a reading circuit connected to the storage circuit.

The reading circuit is connected to a second power supply circuit, and supplied with power from the second power supply circuit. Thus, even when power is not supplied from the first power supply circuit to the signal processing unit, the arithmetic result (data) held in the storage circuit can be read.

The off-state current of the transistor in which a channel is formed in an oxide semiconductor is significantly small. Thus, even while power is not supplied to the signal processing unit, the movement of charge in the storage circuit can be reduced with the transistor.

As the oxide semiconductor, a material containing In and one or more of elements selected from Sn, Zn, Ga, Al, Mn, and Co can be used.

The signal processing unit disclosed in this specification holds data in the storage circuit after arithmetic processing; thus, supply of power can be stopped. Accordingly, power consumption can be markedly reduced. A semiconductor device with reduced power consumption can be manufactured with the signal processing unit disclosed in this specification.

Further, a plurality of storage circuits may be provided in the signal processing unit. The storage circuit can hold data needed when the signal processing unit returns from a state where supply of power is stopped.

According to one embodiment of the present invention, a signal processing unit with low power consumption can be provided.

According to one embodiment of the present invention, a signal processing unit that can read data stored even while supply of power is stopped can be provided.

One embodiment of the present invention can achieve at least one of the above objects.

BRIEF DESCRIPTION OF THE DRAWINGS

FIGS. 8A to 8C illustrate manufacturing steps of a transistor.

FIGS. 15A to 15C illustrate a structure of an oxide semiconductor material.

FIGS. 20A and 20B are diagrams each illustrating a cross-sectional structure of a transistor on which calculation is performed.

DETAILED DESCRIPTION OF THE INVENTION

Figure 1:
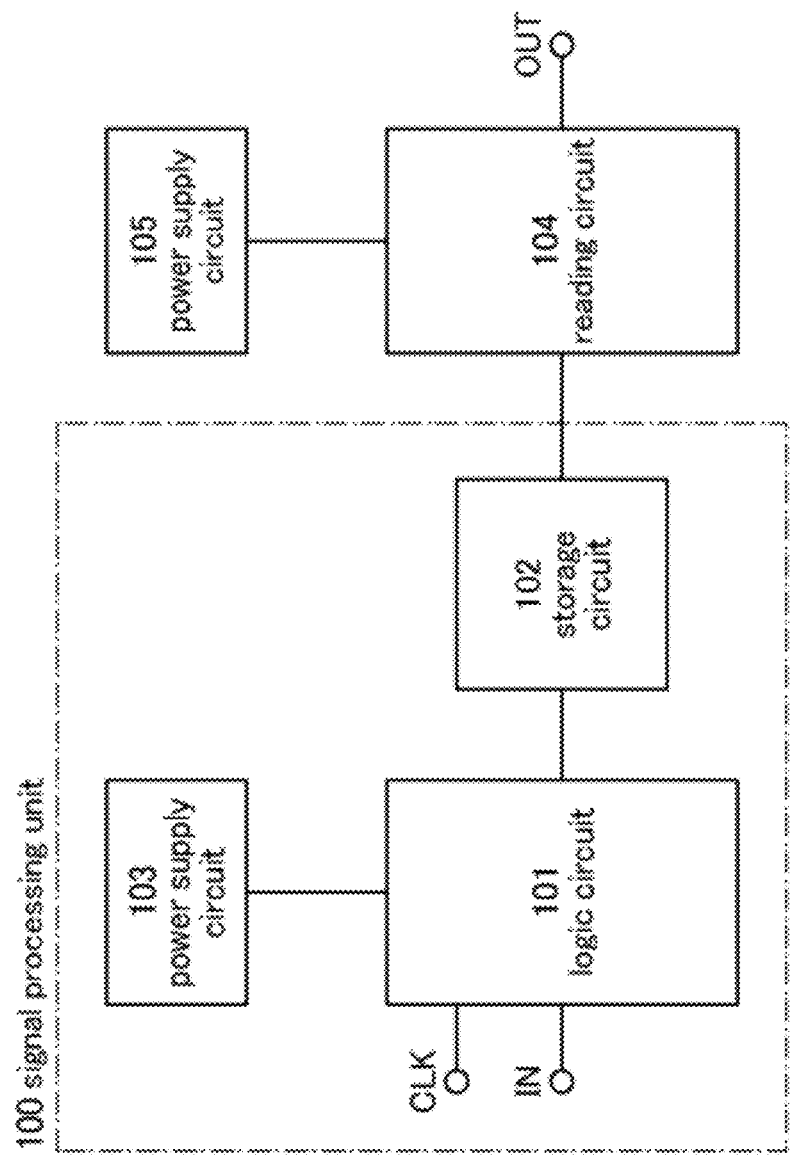
FIG. 1 is a block diagram illustrating a structure of a signal processing unit and a reading circuit.

Hereinafter, embodiments of the present invention are described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below.

Note that functions of a "source" and a "drain" may be switched in the case where transistors of different polarities are employed or in the case where the direction of a current flow changes in a circuit operation, for example. Therefore, the terms "source" and "drain" can be used to denote the drain and the source, respectively, in this specification.

Note that in this specification and the like, the term "electrically connected" includes the case where components are connected through an "object having any electric function". There is no particular limitation on the "object having any electric function" as long as electric signals can be transmitted and received between the components connected through the object. Examples of an "object having any electric function" are a switching element such as a transistor, a resistor, an inductor, a capacitor, and an element with a variety of functions as well as an electrode and a wiring.

In addition, even when a circuit diagram shows independent components as if they are electrically connected to each other, there is actually a case where one conductive film has functions of a plurality of components such as a case where part of a wiring also functions as an electrode. The "electrical connection" in this specification includes in its category such a case where one conductive film has functions of a plurality of components.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

Note that in this specification and the like, ordinal numbers such as "first", "second", and "third" are used in order to avoid confusion among components and do not limit the number.

Note that a voltage refers to the difference between potentials of two points, and a potential refers to electrostatic energy (electric potential energy) of a unit charge at a given point in an electrostatic field. Note that in general, a difference between a potential of one point and a reference potential is merely called a potential or a voltage, and a potential and a voltage are used as synonymous words in many cases.

Thus, in this specification, a potential may be rephrased as a voltage and a voltage may be rephrased as a potential unless otherwise specified.

(Embodiment 1)

A structure of a signal processing unit of one embodiment of the present invention is described with reference to FIG. 1 and FIG. 2. FIG. 1 is a block diagram illustrating a structure of a signal processing unit 100 and a reading circuit 104 connected to the signal processing unit 100.

Note that a large scale integrated circuit (LSI) such as a CPU, a microprocessor, an image processing circuit, a digital signal processor (DSP), or a field programmable gate array (FPGA), and the like are included in the signal processing unit of the preset invention in its category.

The signal processing unit 100 includes a logic circuit 101 for performing a variety of processing based on data input, a power supply circuit 103 for supplying power to the logic circuit 101, and a storage circuit 102 for storing data processed in the logic circuit 101.

Further, the storage circuit 102 is connected to the reading circuit 104. The reading circuit 104 is supplied with power from a power supply circuit 105 that is different from the power supply circuit 103. Note that the power supply circuit 103 can be alternatively referred to as a first power supply circuit, and the power supply circuit 105 can be alternatively referred to as a second power supply circuit.

The logic circuit 101 includes a variety of logic circuits, data input from an input terminal IN is processed in synchronization with a clock signal CLK input from the outside, and the data is output to the reading circuit 104 via the storage circuit 102. A plurality of storage circuits 102 may be provided in the signal processing unit 100.

Figure 2:
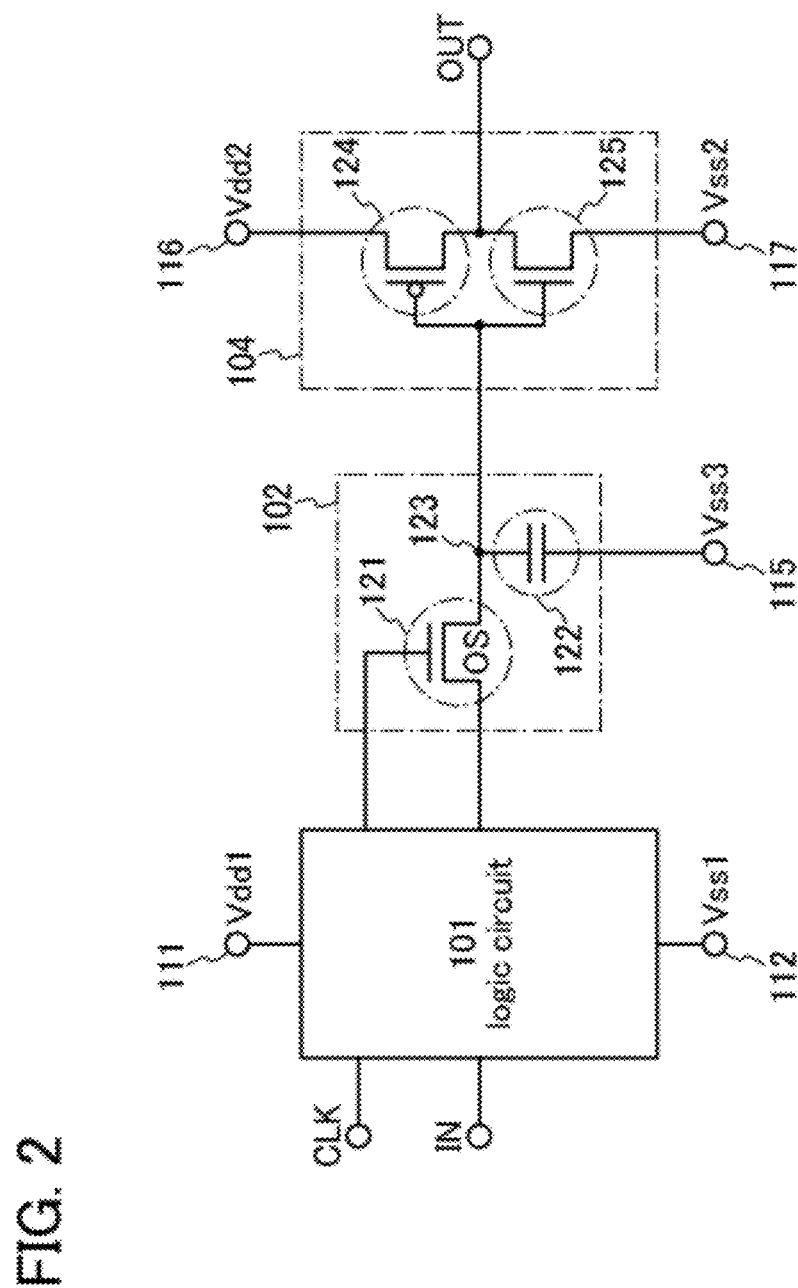
FIG. 2 is a circuit diagram illustrating a configuration of a storage circuit and a reading circuit.

FIG. 2 illustrates an example of a specific circuit configuration that can be applied to the storage circuit 102 and the reading circuit 104. The storage circuit 102 illustrated in FIG. 2 includes a transistor 121 and a capacitor 122. The transistor 121 is a transistor that includes an oxide semiconductor as a semiconductor layer in which a channel is formed. Note that the storage circuit 102 may further include another circuit element such as a diode, a resistor, or an inductor, as needed. In FIG. 2, "OS" is written beside the transistor 121 in order to indicate that the transistor 121 includes an oxide semiconductor as a semiconductor layer in which a channel is formed.

Note that the capacitor 122 can be omitted as long as the parasitic capacitance of the transistor or the like is actively utilized.

In the storage circuit 102, a gate of the transistor 121 and one of a source and a drain thereof are electrically connected to the logic circuit 101, and the other of the source and the drain of the transistor 121 is electrically connected to one of a pair of electrodes of the capacitor 122. Further, the other electrode of the capacitor 122 is electrically connected to a power supply terminal 115. A portion in which the other of the source and the drain of the transistor 121 is electrically connected to the one of the pair of electrodes of the capacitor 122 is referred to as a node 123.

The reading circuit 104 illustrated in FIG. 2 includes a transistor 124 that is a p-type transistor and a transistor 125 that is an n-type transistor. One of a source and a drain of the transistor 124 is electrically connected to a power supply terminal 116, and the other of the source and the drain of the transistor 124 is electrically connected to one of a source and a drain of the transistor 125. The other of the source and the drain of the transistor 125 is electrically connected to a power supply terminal 117.

Gates of the transistors 124 and 125 are connected to the node 123. The other of the source and the drain of the transistor 124 and the one of the source and the drain of the transistor 125 are electrically connected to an output terminal OUT. FIG. 2 illustrates an example in which a CMOS inverter circuit is used as the reading circuit 104; however, the present invention is not limited thereto. Another circuit element such as a diode, a resistor, or an inductor may be further included, as needed.

The power supply terminal 116 is supplied with a high power supply potential $V_{dd}2$ from the power supply circuit 105, and the power supply terminal 117 is supplied with a low power supply potential $V_{ss}2$. A power supply terminal 111 of the logic circuit 101 is supplied with a high power supply potential $V_{dd}1$ from the power supply circuit 103, and a power supply terminal 112 is supplied with a low power supply potential $V_{ss}1$.

Note that the "high power supply potential" refers to a signal having a potential that is higher than a reference potential, and the "low power supply potential" refers to a signal having a potential that is lower than or equal to the reference potential. Both a high power supply potential and a low power supply potential are preferably potentials such that a transistor operates. In other words, a transistor to be turned on when a signal of a high power supply potential is supplied to a gate, and a transistor to be turned off when a signal of a low power supply potential is supplied to a gate.

The high power supply potential $V_{dd}1$ supplied to the power supply terminal 111 and the high power supply potential $V_{dd}2$ supplied to the power supply terminal 116 may be the same potential or different potentials. The low power supply potential $V_{ss}1$ supplied to the power supply terminal 112, a low power supply potential $V_{ss}3$ supplied to the power supply terminal 115, and the low power supply potential $V_{ss}2$ supplied to the power supply terminal 117 may be any of a reference potential, a common potential, and a ground potential. Further, in the case of a fixed potential, the low power supply potential $V_{ss}1$ supplied to the power supply terminal 112, the low power supply potential $V_{ss}3$ supplied to the power supply terminal 115, and the low power supply potential $V_{ss}2$ supplied to the power supply terminal 117 may be potentials different from each other.

For example, the off-state current of a transistor that includes an oxide semiconductor layer in which a channel is formed is much lower than that of a transistor in which a channel is formed in crystalline silicon. Thus, such a transistor that includes an oxide semiconductor layer in which a channel is formed is used as the transistor 121, the movement of charge in the capacitor 122 can be suppressed even while power is not supplied to the signal processing unit 100. Accordingly, a potential of the node 123 can be kept.

Further, the transistor 121 may be a transistor including two gates above and below an oxide semiconductor layer. A control signal is input to one gate, and a different control signal may be input to the other gate. The different control signal may be a signal with a fixed potential. The fixed potential may be either a low power supply potential or a high power supply potential. Note that the two gates may be electrically connected to each other and the control signal may be input to the gates. The threshold voltage or the like of the transistor 121 can be controlled by a signal input to the other gate. Further, the off-state current of the transistor 121 can be further reduced. The on-state current of the transistor 121 can also be increased.

In the case where the logic circuit 101 and the reading circuit 104 each include a transistor, the transistor may be a transistor in which a channel is formed in a layer or substrate composed of a semiconductor other than an oxide semiconductor. For example, the transistor can be a transistor in which a channel is formed in a silicon layer or a silicon substrate. Alternatively, all the transistors that are used in the logic circuit 101 and the reading circuit 104 can be transistors each of which includes an oxide semiconductor layer in which a channel is formed. Alternatively, some of the transistors that are used as the logic circuit 101 and the reading circuit 104 can be transistors each of which includes an oxide semiconductor layer in which a channel is formed, and the other transistors can be transistors that have channels in layers made of a semiconductor other than an oxide semiconductor or substrates made of a semiconductor other than an oxide semiconductor.

The transistor in which a channel is in the silicon layer or the silicon substrate has higher switching speed and higher on-state current than the transistor that includes an oxide semiconductor layer in which a channel is formed. Thus, in a circuit that includes the transistor in which a channel is in the silicon layer or the silicon substrate and the transistor that includes an oxide semiconductor layer in which a channel is formed in combination, the operating speed of the circuit is improved and leakage current can be reduced. With the use of the combination of the transistor in which a channel is in the silicon layer or the silicon substrate and the transistor that includes an oxide semiconductor layer in which a channel is formed in the signal processing unit 100, the operating speed of the signal processing unit 100 is improved and power consumption can be reduced.

Figure 3:
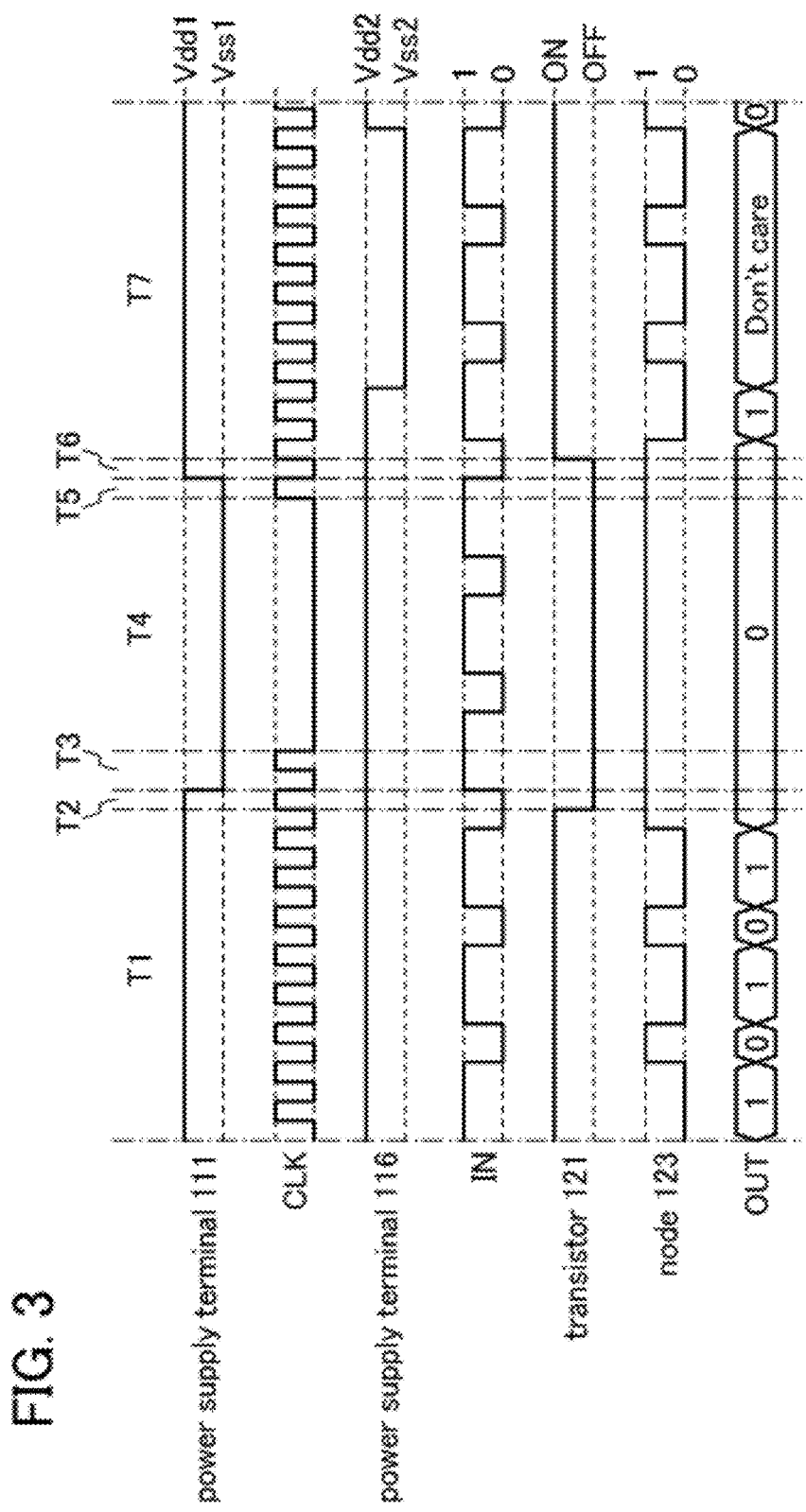
FIG. 3 is a timing chart illustrating operation of a signal processing unit.

Next, an example of operation of the signal processing unit 100 is described with reference to a timing chart in FIG. 3. An example in which the case where a signal (potential) input or output is at high level corresponds to data "1" and the case where the signal is at low level corresponds to data "0" is shown in FIG. 3; however, the present invention is not limited thereto. The case where the signal is at low level may correspond to data "1", and the case where the signal is at high level may correspond to data "0".

In the signal processing unit 100, when supply of power is stopped in order to reduce power consumption after the supply of power, and then power is supplied again, a driving method can be as follows.

The signal processing unit 100 can have a structure where the transistor 121 and the capacitor 122 are added to a circuit for storing data in synchronization with the rise or fall of the clock signal CLK, i.e., a so-called edge sensitive latch circuit. Note that this embodiment is not limited to the edge sensitive latch circuit. The storage element of the present invention can have a structure in which the transistor 121 and the capacitor 122 are added to a circuit for storing data when the clock signal CLK has a high potential or a low potential, i.e., a so-called level sensitive latch circuit. An inverted signal of the clock signal CLK may be used as well as the clock signal CLK.

(Normal Operation)

A first period (T1) can be referred to as a normal operation period. In the first period (T1), in a state where the power supply terminal 111 of the logic circuit 101 is supplied with a high power supply potential $V_{dd}1$, a signal potential of data from an input terminal IN is input to the logic circuit 101 in synchronization with a clock signal CLK. A signal for turning on the transistor 121 is output from the logic circuit 101. The arithmetic processing is performed on the signal input in the logic circuit 101, and an arithmetic result (data) is supplied to the storage circuit 102.

The arithmetic result of the logic circuit 101 is supplied to the node 123 via the transistor 121. In other words, charge in accordance with the arithmetic result is accumulated in the capacitor 122.

(Operation before Stop of Supply of Power)

A second period (T2) can be referred to as a period during which operation before the stop of the supply of power is performed. In the second period (T2), a signal for turning off the transistor 121 is output from the logic circuit 101, and the transistor 121 is turned off. In this way, the charge accumulated in the capacitor 122 is held and a potential of the node 123 is kept constant.

Note that a control signal that is different from the clock signal CLK is input to the gate of the transistor 121. In other words, on and off states of the transistor 121 can be controlled independently from the logic circuit 101 by the control signal that is different from the clock signal CLK. Thus, the transistor 121 can be turned off before the stop of the supply of power to the logic circuit 101. In this manner, the arithmetic result can be accurately held in the capacitor 122.

(Stopping Supply of Power)

A third period (T3) and a fourth period (T4) can be referred to as a period during which supply of power is stopped. In the third period (T3), supply of the high power supply potential $V_{dd}1$ to the logic circuit 101 is stopped. Note that the transistor 121 remains off. Even after supply of the high power supply potential $V_{dd}1$ to the logic circuit 101 is stopped, the data supplied from the logic circuit 101 is held in the capacitor 122. The signal (potential) held in the capacitor 122 can be held for a long time because the transistor 121 has extremely small leakage current. In this way, the storage circuit 102 can hold the data even after supply of the high power supply potential $V_{dd}1$ is stopped.

Then, after supply of the high power supply potential $V_{dd}1$ is stopped, supply of the clock signal CLK is stopped in the fourth period (T4). Here, the fourth period (T4) can also be referred to as a clock signal stop period. The supply of the clock signal CLK is stopped, whereby the power consumption of the signal processing unit 100 can be further reduced.

Note that when at least one of the high power supply potential and the low power supply potential is not supplied, such a case can be regarded as the case where the power is not supplied (the supply of power is stopped). Alternatively, for example, when the high power supply potential is equal to the low power supply potential, such a case can be regarded as the case where the power is not supplied. For example, by setting both of the high power supply potential and the low power supply potential to a ground potential, such a case can be regarded as the case where the power is not supplied. When one or both of the power supply terminal 111 and the power supply terminal 112 are electrically floating (in a floating state), such a case can be regarded as the case where the power is not supplied.

The supply of the clock signal CLK may be stopped while the high power supply potential and the low power supply potential are supplied.

The power supply terminal 116 of the reading circuit 104 is supplied with the high power supply potential $V_{dd}2$ from the power supply circuit 105 that is different from the power supply circuit 103. Thus, even while the operation of the signal processing unit 100 is stopped, the reading circuit 104 can operate to detect the data held in the storage circuit 102.

(Operation of Restarting Supply of Power)

A fifth period (T5) and a sixth period (T6) can be referred to as a period during which supply of power is restarted. In the fifth period (T5), supply of the clock signal CLK is started. Then, after the supply of the high power supply potential $V_{dd}1$ is restarted (the sixth period (T6)), the transistor 121 is turned on. In this manner, a normal operation period that is similar to the first period (T1) can be restarted (a seventh period (T7)).

With the signal processing unit 100 that is one embodiment of the present invention and the driving method thereof, data can be held in the storage circuit 102 even while the power is not supplied to the logic circuit 101 in which the arithmetic processing is performed in synchronization with the clock signal CLK. Here, the transistor 121 included in the storage circuit 102 has extremely small off-state current. For example, the off-state current of the transistor 121 is significantly smaller than that of a transistor in which a channel is formed in silicon having crystallinity.

Thus, even while power is not supplied to the logic circuit 101, the signal held in the storage circuit 102 can be held for a long time. The signal processing unit 100 can hold content (data) even while supply of power is stopped, and non-destructive reading can be performed on the data held in the node 123 even while the operation of the signal processing unit 100 is stopped.

Further, a control signal that is different from the clock signal CLK is input to the gate of the transistor 121. In other words, on and off state of the transistor 121 can be independently controlled by the control signal that is different from the clock signal CLK. Thus, the transistor 121 can be turned off before the stop of the supply of power to the logic circuit 101. In this manner, data can be accurately held in the capacitor 122. After the supply of power is restarted, the transistor 121 is turned on, so that variation in potential of the node 123 that holds data can be suppressed. Accordingly, the signal (potential) held in the capacitor 122 can be accurately held.

By applying the storage circuit 102 to the signal processing unit 100, data can be prevented from being lost due to the stop of supply of power. Further, shortly after the supply of power is restarted, the signal processing unit 100 can return to the state same as that before the supply of power is stopped.

In particular, by applying the storage circuit 102 to each of a CPU, a memory, and a peripheral control device, supply of power can be stopped in the entire system including the CPU. In addition, after the supply of power is restarted, same as that before supply of power is stopped can be provided for a short time. Since the power can be off even for a short time, the power consumption of the entire system can be reduced.

Further, FIG. 3 illustrates an example in which, during the seventh period (T7), supply of power to the reading circuit 104 is stopped and thus, the operation of the reading circuit 104 is stopped. The reading circuit 104 can be operated or stopped in any of the periods.

While the reading circuit 104 is operated, a signal in accordance with data held in the storage circuit 102 is output from the output terminal OUT. While the reading circuit 104 is stopped, it is not clear that what kind of output is supplied from the output terminal OUT (a Don't care state).

This embodiment can be combined with any of the above embodiments as appropriate.

(Embodiment 2)

In this embodiment, a structure that is different from that in FIG. 1 is described with reference to FIG. 4.

Figure 4:
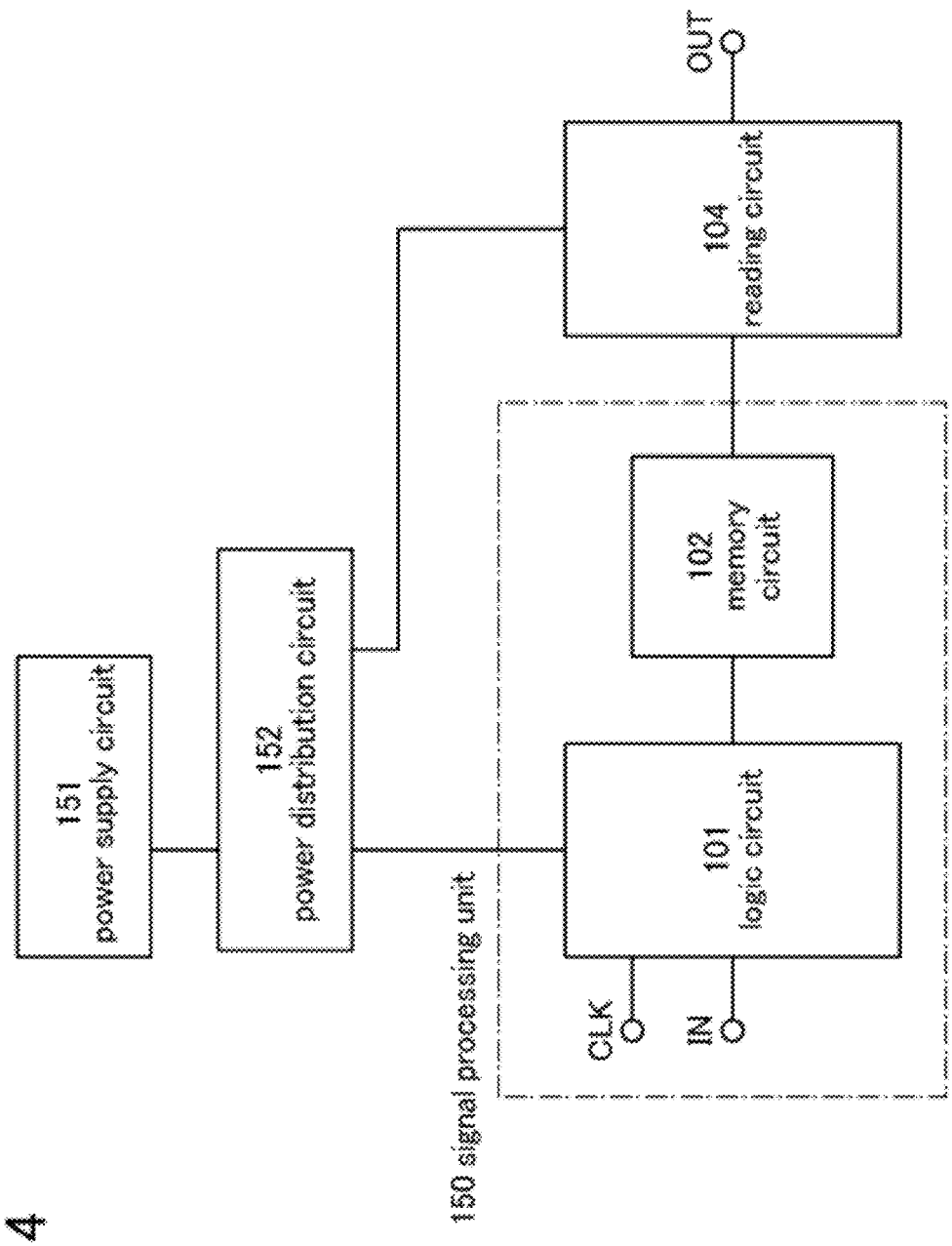
FIG. 4 is a block diagram illustrating a structure of a signal processing unit and a reading circuit.

A signal processing unit 150 illustrated in FIG. 4 has a structure that is similar to the signal processing unit 100 illustrated in FIG. 1 except the power supply circuit 103 is not provided. Power is supplied from a power supply circuit 151 to the signal processing unit 150 and the reading circuit 104 via a power distribution circuit 152.

The supply of power from the power supply circuit 151 to the logic circuit 101 and the supply of power from the power supply circuit 151 to the reading circuit 104 can be independently stopped by the power distribution circuit 152. The power distribution circuit 152 can supply plural levels of power in accordance with circuits connected to the power distribution circuit 152.

A plurality of power supply circuits are combined into one in such a way, so that a design of a semiconductor device is simple and the productivity can be improved.

(Embodiment 3)

In this embodiment, another example of a configuration of a storage circuit is described with reference to FIG. 5.

Figure 5:
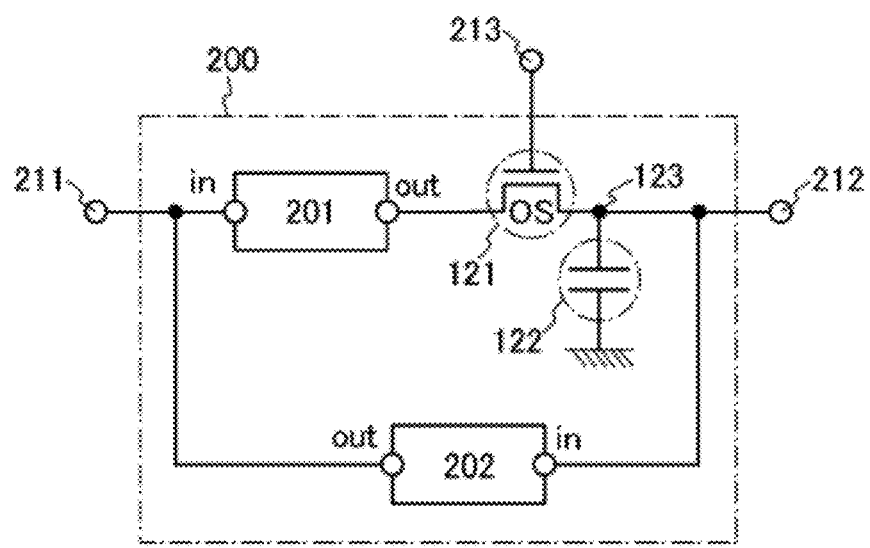
FIG. 5 is a circuit diagram illustrating a configuration of a storage circuit.

A storage circuit 200 illustrated in FIG. 5 includes a phase inverter 201, a phase inverter 202, the transistor 121 that includes an oxide semiconductor as a semiconductor layer in which a channel is formed, and the capacitor 122. Note that the storage circuit 200 may further include another circuit element such as a diode, a resistor, or an inductor, as needed.

Note that the capacitor 122 is not necessarily provided as long as the parasitic capacitance of the transistor or the like is actively utilized.

An output terminal (represented as "out" in the diagram) of the phase inverter 201 is electrically connected to one of a source and a drain of the transistor 121. The other of the source and the drain of the transistor 121 is electrically connected to one of a pair of electrodes of the capacitor 122 and an input terminal (represented as "in" in the diagram) of the phase inverter 202. An output terminal (represented as "out" in the diagram) of the phase inverter 202 is electrically connected to an input terminal (represented as "in" in the diagram) of the phase inverter 201. A signal corresponding to data input from an input terminal 211 of the storage circuit 200 is input to the phase inverter 201. The phase inverter 201 outputs an inverted signal of a signal input while power is supplied. The phase inverter 202 outputs an inverted signal of a signal input while power is supplied. As each of the phase inverter 201 and the phase inverter 202, an inverter, a NAND circuit, a NOR circuit, or the like can be used.

Note that each of the phase inverter 201 and the phase inverter 202 may output an inverted signal of a signal input in synchronization with either one or both of the clock signal CLK and the inverted signal of the clock signal CLK or may have a floating (high impedance) output while power is supplied. A three-state buffer, a clocked inverter, or the like can be used as each of the phase inverter 201 and the phase inverter 202.

Further, a control signal that is different from the clock signal CLK and the inverted signal of the clock signal CLK is input from a terminal 213 to the gate of the transistor 121. In other words, on and off state of the transistor can be independently controlled by the control signal that is different from the clock signal and the inverted signal of the clock signal.

The power may be supplied to the phase inverter 201 and the phase inverter 202 from the power supply circuit 103 described in Embodiment 1 or via the power distribution circuit 152 described in Embodiment 2.

Further, an arithmetic circuit to which one or both of the clock signal CLK and the inverted signal of the clock signal CLK are input may be provided in the storage circuit 200.

In the case where power is supplied and the transistor 121 is on, a feedback loop is formed by the phase inverter 201 and the phase inverter 202. Data is held with this feedback loop. Thus, in the case where power is supplied and the transistor 121 is on, a flip-flop circuit or a latch circuit can be formed by the phase inverter 201 and the phase inverter 202. In other words, the configuration illustrated in FIG. 5 corresponds to the structure of a flip-flop circuit or a latch circuit to which the transistor 121 and the capacitor 122 transistor that are added.

Specifically, the one of the pair of electrodes of the capacitor is electrically connected to the node 123 in which data in the flip-flop circuit or the latch circuit is held and which is provided between an output terminal 212 of the storage circuit 200 and an output terminal (out) of the phase inverter 201 included in the flip-flop circuit or the latch circuit. The transistor 121 is added so that the node 123 to which the one electrode of the capacitor 122 is connected is electrically connected to the output terminal (out) of the phase inverter 201 included in the flip-flop circuit or the latch circuit selectively.

In the configuration illustrated in FIG. 5, the potential (potential of the node 123) of the one of the pair of electrodes of the capacitor 122 can be an output potential of the storage circuit 200. The output potential is a potential corresponding to data input to the storage circuit 200.

FIG. 5 illustrates an example of a configuration in which the other of the pair of electrodes of the capacitor 122 is grounded (supplied with a ground potential). However, the structure is not limited thereto, and a fixed potential (e.g., a reference potential) can be input to the other of the pair of electrodes of the capacitor 122.

In the configuration illustrated in FIG. 5, in the case where the phase inverter 201 and the phase inverter 202 each include a transistor, the transistor can be a transistor in which a channel is formed in a layer made of a semiconductor other than an oxide semiconductor or a substrate made of a semiconductor other than an oxide semiconductor. For example, the transistor can be a transistor in which a channel is in a silicon layer or a silicon substrate. All the transistors that are used in the phase inverter 201 and the phase inverter 202 can be transistors each of which includes an oxide semiconductor layer in which a channel is formed. Alternatively, one of the transistors that are used in the phase inverter 201 and the phase inverter 202 can be a transistor which includes an oxide semiconductor layer in which a channel is formed, and the other transistor can be a transistor in which a channel is formed in a layer made of a semiconductor other than an oxide semiconductor or a substrate made of a semiconductor other than an oxide semiconductor.

With the use of the combination of the transistor in which a channel is in the silicon layer or the silicon substrate and the transistor that includes an oxide semiconductor layer in which a channel is formed in the storage circuit 200, the operating speed of the storage circuit 200 is increased and the power consumption can be reduced.

In the case where the storage circuit 200 disclosed in this embodiment is used as a storage circuit of the signal processing unit 100, the signal processing unit 100 including the storage circuit 200 can be operated similarly to the signal processing unit 100 in Embodiment 1. A plurality of storage circuits 200 may be formed in the signal processing unit 100.

This embodiment can be combined with any of the above embodiments as appropriate.

(Embodiment 4)

In this embodiment, the structure of a CPU is described as an example of the semiconductor device according to one embodiment of the present invention.

Figure 6:
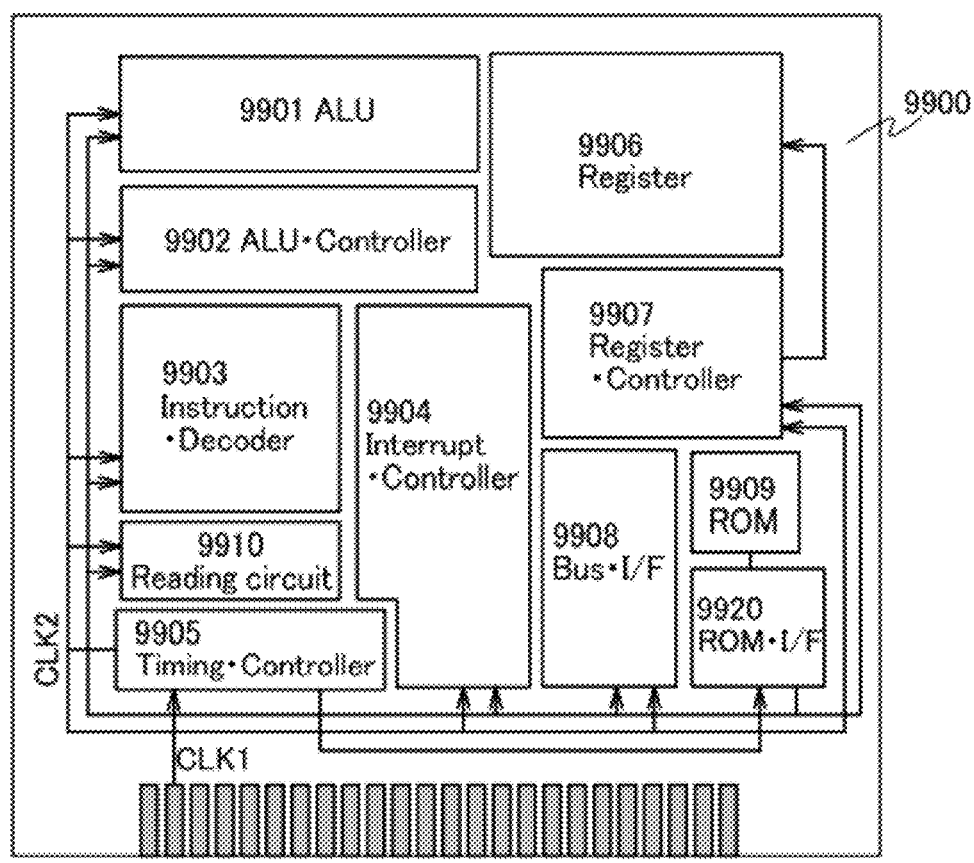
FIG. 6 is a block diagram of a CPU.

FIG. 6 illustrates the structure of a CPU in this embodiment. The CPU in FIG. 6 mainly includes an ALU 9901, an ALU controller 9902, an instruction decoder 9903, an interrupt controller 9904, a timing controller 9905, a register 9906, a register controller 9907, a bus I/F 9908, a rewritable ROM 9909, a ROM I/F 9920, and a reading circuit 9910 over a substrate 9900.

An instruction decoder 9903 described in this embodiment corresponds to the signal processing unit 100 described in the above embodiments, and includes the logic circuit 101 and the storage circuit 102 that are not shown. Further, a reading circuit 9910 corresponds to the reading circuit 104 described in the above embodiments.

Note that "ALU" means "arithmetic logic unit", "bus I/F" means "bus interface", and "ROM I/F" means "ROM interface". Further, the ROM 9909 and the ROM I/F 9920 may be provided over different chips. The CPU in FIG. 6 is just an example in which the structure is simplified, and an actual CPU may have a variety of structures depending on the uses.

An instruction that is input to the CPU via the bus I/F 9908 is input to the instruction decoder 9903, arithmetic processing (decoding) is performed by the logic circuit 101, and the arithmetic result is held in the storage circuit 102. The arithmetic result (instruction decoded) held in the storage circuit 102 is read by the reading circuit 9910 and input to the ALU controller 9902, the interrupt controller 9904, the register controller 9907, and the timing controller 9905.

Note that supply of power to the instruction decoder 9903 is stopped after the arithmetic processing. Even when supply of power is stopped after the arithmetic processing, the reading circuit 9910 can read the arithmetic result (instruction decoded).

The ALU controller 9902, the interrupt controller 9904, the register controller 9907, and the timing controller 9905 conduct various controls based on the decoded instruction. Specifically, the ALU controller 9902 generates signals for controlling the operation of the ALU 9901. During execution of the program of the CPU, the interrupt controller 9904 judges an interrupt request from an external input/output device or a peripheral circuit based on its priority or a masked state, and processes the request. The register controller 9907 generates an address of the register 9906, and reads and writes data from and to the register 9906 in accordance with the state of the CPU.

The timing controller 9905 generates signals for controlling the operation timing of the ALU 9901, the ALU controller 9902, the instruction decoder 9903, the interrupt controller 9904, and the register controller 9907. For example, the timing controller 9905 includes an internal clock generator for generating an internal clock signal CLK2 based on a reference clock signal CLK1 and supplies the clock signal CLK2 to the circuits.

Supply of power to the instruction decoder 9903 described in this embodiment can be stopped after arithmetic processing until subsequent arithmetic processing. The storage circuit 102 included in the instruction decoder 9903 can hold an arithmetic result even while supply of power is stopped; therefore, the arithmetic result can be read even while supply of power to the instruction decoder 9903 is stopped.

Note that the signal processing unit 100 and the reading circuit 104 described in the above embodiments can be applied to all the circuits included in the CPU.

In this manner, even in the case where part or all of the operation of the CPU is temporarily stopped or part or all of the supply of power is temporarily stopped, data can be held and power consumption can be reduced. Specifically, for example, while the user of a personal computer stops input of data to an input device such as a keyboard, the operation of the CPU can be stopped, so that the power consumption can be reduced.

Although the CPU is described as an example in this embodiment, the signal processing device of the present invention is not limited to the CPU and can be applied to an LSI such as a microprocessor, an image processing circuit, a DSP, or an FPGA.

This embodiment can be combined with any of the above embodiments as appropriate.

(Embodiment 5)

In this embodiment, a transistor that includes an oxide semiconductor as a semiconductor layer in which a channel is formed and a transistor that includes silicon as a semiconductor layer in which a channel is formed are given as examples for explaining a manufacturing method of a transistor applicable to the signal processing unit 100 and the reading circuit 104 that are described in the above embodiments.

Figure 7A:
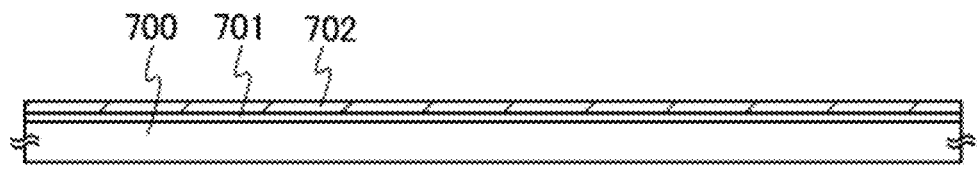
FIGS. 7A to 7D illustrate manufacturing steps of a transistor.

As illustrated in FIG. 7A, an insulating film 701 and a semiconductor film 702 that is separated from a single crystal semiconductor substrate are formed over a substrate 700.

Although there is no particular limitation on a material that can be used as the substrate 700, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 700. In the case where the temperature of heat treatment to be performed later is high, a glass substrate with a strain point of 730° C. or higher is preferably used as a glass substrate.

In this embodiment, an example in which the semiconductor film 702 is formed using single crystal silicon is given below as the method for forming a transistor 110. Note that a specific example of a method for forming the single crystal semiconductor film 702 is briefly described. First, an ion beam including ions that are accelerated by an electric field enters a bond substrate that is the single crystal semiconductor substrate and a fragile layer that is fragile because of local disorder of the crystal structure is formed in a region at a certain depth from a surface of the bond substrate. The depth at which the fragile layer is formed can be adjusted by the acceleration energy of the ion beam and the angle at which the ion beam enters. Then, the bond substrate and the substrate 700 that is provided with the insulating film 701 are attached to each other so that the insulating film 701 is sandwiched therebetween. After the bond substrate and the substrate 700 overlap with each other, a pressure of approximately 1 to 500 N/cm$^2$, preferably 11 to 20 N/cm$^2$ is applied to part of the bond substrate and part of the substrate 700 so that the substrates are attached to each other. When the pressure is applied to part of the bond substrate and part of the substrate 700, bonding between the bond substrate and the insulating film 701 starts from the parts, which results in bonding of the entire surface where the bond substrate and the insulating film 701 are in close contact with each other. After that, heat treatment is performed, so that microvoids that exist in the fragile layer are combined, and the volume of the microvoids is increased. Accordingly, a single crystal semiconductor film that is part of the bond substrate is separated from the bond substrate along the fragile layer. The temperature of the heat treatment is set so as not to exceed the strain point of the substrate 700. Then, the single crystal semiconductor film is processed into a desired shape by etching or the like, so that the semiconductor film 702 can be formed.

In order to control the threshold voltage, impurity elements imparting p-type conductivity, such as boron, aluminum, or gallium, or impurity elements imparting n-type conductivity, such as phosphorus or arsenic, may be added to the semiconductor film 702. Impurity elements for controlling the threshold voltage may be added to the semiconductor film that is not etched to have a predetermined shape or may be added to the semiconductor film 702 that is etched to have a predetermined shape. Alternatively, the impurity element for controlling the threshold voltage may be added to the bond substrate. Alternatively, the impurity element may be added to the bond substrate in order to roughly control the threshold voltage, and the impurity element may be further added to the semiconductor film which is not etched to have a predetermined shape or the semiconductor film 702 which is etched to have a predetermined shape in order to finely control the threshold voltage.

Note that although the single crystal semiconductor film is used in this embodiment, the present invention is not limited to this structure. For example, a polycrystalline, microcrystalline, or amorphous semiconductor film that is formed over the insulating film 701 by vapor deposition may be used. Alternatively, the semiconductor film may be crystallized by a known technique. As a known crystallization technique, laser crystallization using a laser beam or crystallization using a catalytic element can be used. Alternatively, crystallization using a catalytic element and laser crystallization can be used in combination. When a heat-resistant substrate such as a quartz substrate is used, crystallization combined with thermal crystallization using an electrically heated oven, lamp heating crystallization using infrared light, crystallization using a catalytic element, or high-temperature heating at approximately 950° C. may be used.

Figure 7B:
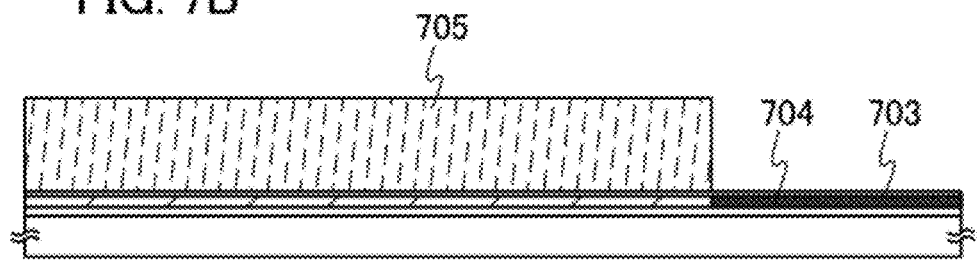

Next, as illustrated in FIG. 7B, a gate insulating film 703 is formed over the semiconductor film 702. After that, a mask 705 is formed over the gate insulating film 703. Impurity elements imparting conductivity is added to part of the semiconductor film 702, so that an impurity region 704 is formed.

The gate insulating film 703 can be formed by oxidation or nitridation of a surface of the semiconductor film 702 by high-density plasma treatment, heat treatment, or the like. The high-density plasma treatment is performed using, for example, a mixed gas of a rare gas such as He, Ar, Kr, or Xe; and oxygen, nitrogen oxide, ammonia, nitrogen, hydrogen, or the like. In that case, when plasma is excited by introduction of microwaves, plasma with a low electron temperature and high density can be generated. By oxidation or nitridation of the surface of the semiconductor film with oxygen radicals (including OH radicals in some cases) or nitrogen radicals (including NH radicals in some cases) generated by such high-density plasma, an insulating film with a thickness of 1 to 20 nm, preferably 5 to 10 nm can be formed to be in contact with the semiconductor film. For example, nitrous oxide ($N_2O$) is diluted with Ar by 1 to 3 times (flow rate) and a microwave (2.45 GHz) electric power of 3 to 5 kW is applied with a pressure of 10 to 30 Pa so that the oxidation or nitridation of the surface of the semiconductor film 702 is performed. By this treatment, an insulating film with a thickness of 1 to 10 nm (preferably 2 to 6 nm) is formed. Further, nitrous oxide ($N_2O$) and silane ($SiH_4$) are introduced and a microwave (2.45 GHz) electric power of 3 to 5 kW is applied with a pressure of 10 to 30 Pa so that a silicon oxynitride film is formed by vapor deposition, thereby forming a gate insulating film. With a combination of solid-phase reaction and a reaction by vapor deposition, a gate insulating film having low interface state density and high withstand voltage can be formed.

The oxidation or nitridation of the semiconductor film by the high-density plasma treatment proceeds by solid-phase reaction. Thus, interface state density between the gate insulating film 703 and the semiconductor film 702 can be extremely low. Further, by direct oxidation or nitridation of the semiconductor film 702 by high-density plasma treatment, variation in the thickness of the insulating film to be formed can be suppressed. Further, in the case where the semiconductor film has crystallinity, the surface of the semiconductor film is oxidized by solid-phase reaction by high-density plasma treatment, so that it is possible to suppress fast oxidation only in a crystal grain boundary. Thus, a uniform gate insulating film with low interface state density can be formed. Variation in the characteristics of a transistor whose gate insulating film partly or entirely includes an insulating film formed by high-density plasma treatment can be suppressed.

The gate insulating film 703 may be formed using a single layer or a stack of layers of a film including silicon oxide, silicon nitride, silicon nitride oxide, silicon oxynitride, aluminum oxide, aluminum nitride, zirconium oxide, yttrium oxide, lanthanum oxide, cesium oxide, tantalum oxide, magnesium oxide, hafnium oxide, hafnium silicate ($HfSi_xO_y$, (x>0, y>0)), hafnium silicate ($HfSi_xO_y$ (x>0, y>0)) to which nitrogen is added, hafnium aluminate ($HfAl_xO_y$, (x>0, y>0)) to which nitrogen is added, or the like by plasma CVD, sputtering, or the like.

Note that in this specification, oxynitride is a substance that includes more oxygen than nitrogen, and nitride oxide is a substance that includes more nitrogen than oxygen.

The thickness of the gate insulating film 703 can be, for example, 1 to 100 nm inclusive, preferably 10 to 50 nm inclusive. In this embodiment, a single-layer insulating film containing silicon oxide is formed as the gate insulating film 703 by plasma CVD.

Figure 7C:
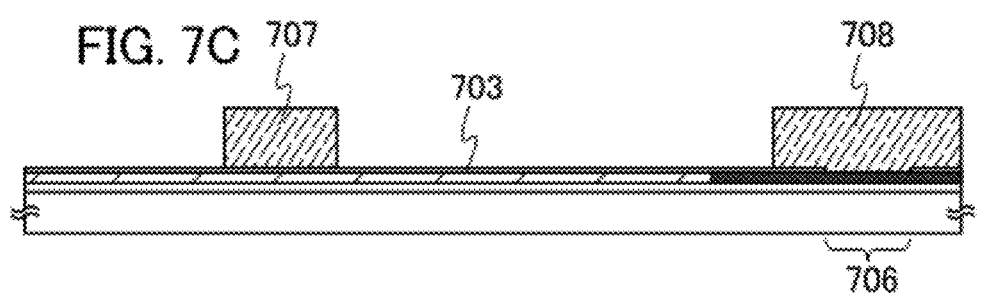

Then, after the mask 705 is removed, as illustrated in FIG. 7C, part of the gate insulating film 703 is removed, an opening 706 is formed in a region overlapping with the impurity region 704 by etching or the like, and a gate electrode 707 and a conductive film 708 are then formed.

A conductive film is formed to cover the opening 706 and then is processed into a predetermined shape, so that the gate electrode 707 and the conductive film 708 can be formed. The conductive film 708 is in contact with the impurity region 704 through the opening 706. The conductive film can be formed by CVD, sputtering, vapor deposition, spin coating, or the like. For the conductive film, tantalum (Ta), tungsten (W), titanium (Ti), molybdenum (Mo), aluminum (Al), copper (Cu), chromium (Cr), niobium (Nb), or the like can be used. An alloy containing the metal as its main component or a compound containing the metal may be used. Alternatively, the conductive film may be formed using a semiconductor such as polycrystalline silicon doped with impurity elements such as phosphorus that imparts conductivity to the semiconductor film.

Note that although the gate electrode 707 and the conductive film 708 are formed using a single-layer conductive film in this embodiment, this embodiment is not limited to this structure. The gate electrode 707 and the conductive film 708 may be formed using a plurality of stacked conductive films.

As a combination of two conductive films, tantalum nitride or tantalum can be used for a first conductive film and tungsten can be used for a second conductive film. As well as the example, any of the following combination can be used: tungsten nitride and tungsten; molybdenum nitride and molybdenum; aluminum and tantalum; aluminum and titanium; and the like. Since tungsten and tantalum nitride have high heat resistance, heat treatment for thermal activation can be performed in a step performed after the two conductive films are formed. Alternatively, as the combination of the two conductive films, for example, nickel silicide and silicon doped with impurity elements imparting n-type conductivity, tungsten silicide and silicon doped with impurity elements imparting n-type conductivity, or the like can be used.

In the case of a three-layer structure in which three conductive films are stacked, a stacked structure of a molybdenum film, an aluminum film, and a molybdenum film is preferably used.

A light-transmitting oxide conductive film of indium oxide, indium tin oxide, indium zinc oxide, zinc oxide, zinc aluminum oxide, zinc aluminum oxynitride, zinc gallium oxide, or the like can be used as the gate electrode 707 and the conductive film 708.

Alternatively, the gate electrode 707 and the conductive film 708 may be selectively formed by a droplet discharge method without the use of a mask. A droplet discharge method is a method for forming a predetermined pattern by discharge or ejection of a droplet containing a predetermined composition from an orifice, and includes an inkjet method or the like in its category.

In addition, the gate electrode 707 and the conductive film 708 may be formed by forming a conductive film, and the conductive film is etched by dry etching with inductively coupled plasma (ICP) under appropriately controlled conditions (e.g., the amount of power applied to a coiled electrode layer, the amount of power applied to an electrode layer on the substrate side, and the electrode temperature on the substrate side) to have a desired tapered shape. Further, an angle and the like of the tapered shape may be controlled by the shape of a mask. Note that for an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 7D:
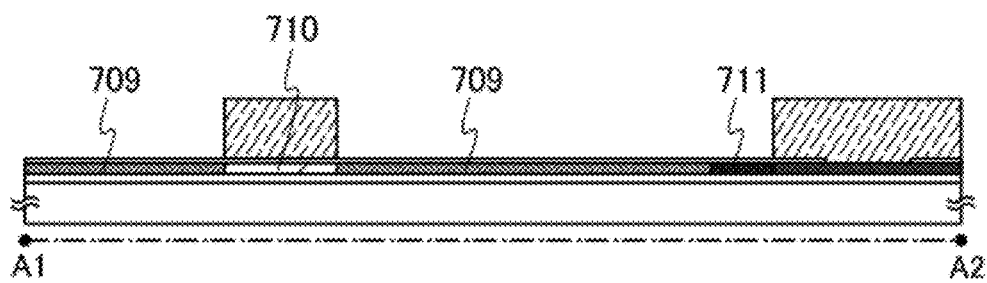

Next, as illustrated in FIG. 7D, when impurity elements imparting one conductivity is added to the semiconductor film 702 with the gate electrode 707 and the conductive film 708 used as a mask, a channel formation region 710 overlapping with the gate electrode 707, a pair of impurity regions 709 sandwiching the channel formation region 710, and an impurity region 711 obtained by further addition of impurity elements to part of the impurity region 704 are formed in the semiconductor film 702.

In this embodiment, the case where impurity elements imparting p-type conductivity (e.g., boron) is added to the semiconductor film 702 is described.

Next, as illustrated in FIG. 8A, an insulating film 712 and an insulating film 713 are formed to cover the gate insulating film 703, the gate electrode 707, and the conductive film 708. Specifically, the insulating films 712 and 713 may be formed using a single layer or a stack of layers of an inorganic insulating film of silicon oxide, silicon nitride, silicon nitride oxide, silicon oxynitride, aluminum nitride, aluminum oxide, aluminum nitride oxide, aluminum oxynitride, hafnium oxide, zirconium oxide, yttrium oxide, lanthanum oxide, cesium oxide, tantalum oxide, magnesium oxide, or the like. Note that when the insulating films 712 and 713 are formed using a low dielectric constant (low-k) material, capacitance due to overlap of electrodes or wirings can be sufficiently reduced. Note that a porous insulating film including such a material may be employed as the insulating films 712 and 713. Since the porous insulating film has lower dielectric constant than a dense insulating film, parasitic capacitance due to electrodes or wirings can be further reduced.

In this embodiment, an example in which silicon oxynitride is used for the insulating film 712 and silicon nitride oxide is used for the insulating film 713 is described. In addition, in this embodiment, although an example in which the insulating films 712 and 713 are formed over the gate electrode 707 and the conductive film 708 is shown, in the present invention, only one insulating film may be formed over the gate electrode 707 and the conductive film 708, or a plurality of insulating films of three or more layers may be stacked.

Next, as illustrated in FIG. 8B, the insulating films 712 and 713 are subjected to chemical mechanical polishing (CMP) or etching, so that a surface of the gate electrode 707 and the conductive film 708 is exposed. Note that in order to improve the characteristics of a transistor 109 that is formed later, surfaces of the insulating films 712 and 713 are preferably flattened as much as possible.

Through the above steps, the transistor 110 can be formed.

Next, a method for forming the transistor 109 is described. First, as illustrated in FIG. 8C, an oxide semiconductor layer 716 is formed over the insulating film 712 or the insulating film 713.

The oxide semiconductor layer 716 can be formed by processing an oxide semiconductor film formed over the insulating films 712 and 713 into a desired shape. The thickness of the oxide semiconductor film is 2 to 200 nm inclusive, preferably 3 to 50 nm, more preferably 3 to 20 nm inclusive. The oxide semiconductor film is formed by sputtering using a metal oxide containing In and Zn as a target, for example. As a sputter gas, a rare gas (e.g., argon), oxygen, or a mixed gas of a rare gas and oxygen can be used.

Note that before the oxide semiconductor film is formed by sputtering, dust on surfaces of the insulating films 712 and 713 is preferably removed by reverse sputtering in which an argon gas is introduced and plasma is generated. The reverse sputtering is a method in which, without application of voltage to a target side, an RF power source is used for application of voltage to a substrate side in an argon atmosphere and plasma is generated in the vicinity of the substrate so that a surface is modified. Note that nitrogen, helium, or the like may be used instead of the argon atmosphere. Alternatively, an argon atmosphere to which oxygen, nitrous oxide, or the like is added may be used. Alternatively, an argon atmosphere to which chlorine, carbon tetrafluoride, or the like is added may be used.

An oxide semiconductor to be used preferably contains at least indium (In) or zinc (Zn). It is particularly preferable that the oxide semiconductor contain In and Zn. As a stabilizer for reducing variation in electrical characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, for example, an In—Ga—Zn-based oxide means an oxide containing In, Ga, and Zn as its main component, and there is no particular limitation on the ratio of In, Ga, and Zn. Further, the In—Ga—Zn-based oxide may contain a metal element other than In, Ga, and Zn.

As the oxide semiconductor, a thin film including a material expressed by a chemical formula $InMO_3(ZnO)_m$ (m>0) can be used. Here, M represents one or more metal elements selected from Sn, Zn, Ga, Al, Fe, Mn, and Co. As example of M, Ga, Ga and Al, Ga and Mn, Ga and Co, or the like can be given. As the oxide semiconductor, a material expressed by $In_3SnO_5(ZnO)_n$ (n>0 and n is an integer) may also be used.

For example, an oxide semiconductor film of an In—Ga—Zn-based oxide with an atomic ratio of In:Ga:Zn=1:1:1 or 2:2:1 or any of oxides whose composition is in the neighborhood of the above compositions can be used. Alternatively, an oxide semiconductor film of an In—Sn—Zn-based oxide with an atomic ratio of In:Sn:Zn=1:1:1, 2:1:3, or 2:1:5, or any of oxides whose composition is in the neighborhood of the above compositions may be used.

In the case where the oxide semiconductor is formed using an In—Zn-based oxide, the atomic ratio is set so that In/Zn ranges from 0.5 to 50, preferably from 1 to 20, further preferably from 1.5 to 15. When the atomic ratio of Zn is in the above-preferred range, the field-effect mobility of a transistor can be improved. Here, when the atomic ratio of the compound is In:Zn:O=X:Y:Z, the relation Z>1.5X+Y is satisfied.

However, the present invention is not limited to the above compositions, and an oxide having an appropriate composition may be used depending on necessary electric characteristics of a transistor (e.g., field-effect mobility, threshold voltage, or variation). In order to obtain necessary semiconductor characteristics, it is preferable that the carrier concentration, the impurity concentration, the defect density, the atomic ratio of a metal element to oxygen, the interatomic distance, the density, and the like of the oxide semiconductor be set to be appropriate.

For example, with an In—Sn—Zn-based oxide, a high field-effect mobility can be obtained with relative ease. However, a field-effect mobility can be increased by reducing the defect density in a bulk also in the case of using the In—Ga—Zn-based oxide.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a crystalline portion or a non-amorphous structure.

In the case of an oxide semiconductor in an amorphous state, a flat surface can be obtained with relative ease, so that when a transistor is manufactured with the use of such an oxide semiconductor, interface scattering can be reduced, and relatively high field-effect mobility can be obtained with relative ease.

In an oxide semiconductor having crystallinity, defects in the bulk can be further reduced and when surface flatness is improved, a field-effect mobility higher than that of an oxide semiconductor in an amorphous state can be obtained. In order to improve the surface flatness, the oxide semiconductor is preferably formed over a flat surface. Specifically, the oxide semiconductor may be formed over a surface with an average surface roughness ($R_a$) of less than or equal to 1 nm, preferably less than or equal to 0.3 nm, further preferably less than or equal to 0.1 nm.

Note that the average surface roughness ($R_a$) is obtained by expanding, into three dimensions, center line average roughness that is defined by JIS B 0601 to be able to apply it to a surface. $R_a$ can be expressed as an "average value of the absolute values of deviations from a reference surface to a designated surface" and is defined by the following formula.

$$Ra = \frac{1}{S_0} \int_{y_1}^{y_2} \int_{x_1}^{x_2} |f(x, y) - Z_0| dx dy \quad \text{[FORMULA 1]}$$

In the above formula, $S_0$ represents the area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be measured using an atomic force microscope (AFM).

In this embodiment, a 30-nm-thick thin film of an In—Ga—Zn-based oxide that is obtained by sputtering using a metal oxide target containing indium (In), gallium (Ga), and zinc (Zn) is used as the oxide semiconductor film. A target with a composition ratio of metals, In:Ga:Zn=1:1:0.5, In:Ga:Zn=1:1:1, or In:Ga:Zn=1:1:2 in an atomic ratio can be used as the target, for example. The relative density of the metal oxide target for forming the oxide semiconductor is higher than or equal to 90% and lower than or equal to 100%, preferably higher than or equal to 95% and lower than 100%. With the use of the target with a high relative density, a dense oxide semiconductor film can be formed. Note that an In—Ga—Zn-based oxide can be referred to as IGZO.

In the case where an In—Sn—Zn-based oxide is used for the oxide semiconductor film, a target for formation of the In—Sn—Zn-based oxide by sputtering may have a composition ratio of In:Sn:Zn=1:2:2, In:Sn:Zn=2:1:3, In:Sn:Zn=1:1:1, or In:Sn:Zn=20:45:35 in an atomic ratio, for example.

Note that in the case where the oxide semiconductor film is formed using a target containing indium (In) and zinc (Zn), the atomic ratio of the target is In/Zn=0.5 to 50, preferably 1 to 20, more preferably 1.5 to 15. The field-effect mobility can be improved by keeping the ratio of Zn within the above range.

In this embodiment, the substrate is held in a deposition chamber kept in a reduced pressure state, a sputtering gas from which hydrogen and moisture have been removed is introduced into the deposition chamber from which remaining water is being removed, and the oxide semiconductor film is formed with the use of the above target. A highly purified gas is preferably used as the sputtering gas. For example, in the case where argon is used for the sputtering gas, it is preferable that the purity be 9N, the dew point be −121° C., the content of $H_2O$ be lower than or equal to 0.1 ppb, and the content of $H_2$ be lower than or equal to 0.5 ppb. In the case where oxygen is used for the sputtering gas, it is preferable that the purity be 8N, the dew point be −112° C., the content of $H_2O$ be lower than or equal to 1 ppb, and the content of $H_2$ be lower than or equal to 1 ppb.

The oxide semiconductor preferably contains a larger amount of oxygen than the stoichiometric proportion. When the amount of oxygen is in excess of stoichiometry, generation of carriers that results from oxygen deficiency in the oxide semiconductor can be suppressed.

The substrate temperature may be higher than or equal to 100° C. and lower than or equal to 600° C. inclusive, preferably higher than or equal to 200° C. and lower than or equal to 400° C. inclusive during deposition. By formation of the oxide semiconductor film while the substrate is heated, the concentration of impurities included in the formed oxide semiconductor film can be lowered. In addition, damage by sputtering can be reduced. In order to remove water remaining in the deposition chamber, an adsorption vacuum pump is preferably used. For example, a cryopump, an ion pump, or a titanium sublimation pump is preferably used. A turbo pump to which a cold trap is added may be used as an exhaustion means. For example, when a gas in the deposition chamber is exhausted with the use of a cryopump, a hydrogen atom, a compound containing a hydrogen atom, such as water ($H_2O$) (preferably, also a compound containing a carbon atom), and the like are exhausted. Thus, the concentration of impurities contained in the oxide semiconductor film formed in the deposition chamber can be lowered.

As an example of the deposition condition, the following condition is employed: the distance between the substrate and the target is 100 mm, the pressure is 0.6 Pa, the direct current (DC) power is 0.5 kW, and oxygen is used as a sputter gas (the proportion of the oxygen flow rate is 100%). Note that it is preferable that pulsed direct-current (DC) power be used because dust generated during deposition can be reduced and the film thickness can be uniform.

Further, when the leakage rate of the deposition chamber of the sputtering apparatus is set lower than or equal to $1 \times 10^{-10}$ Pa·m³/s, entry of impurities such as alkali metal or hydride into the oxide semiconductor film that is being formed by sputtering can be reduced. Furthermore, with the use of the adsorption vacuum pump as an evacuation system, counter flow of impurities such as alkali metal, a hydrogen atom, a hydrogen molecule, water, a hydroxyl group, or hydride from the evacuation system can be reduced.

When the purity of the target is set to 99.99% or higher, alkali metal, a hydrogen atom, a hydrogen molecule, water, a hydroxyl group, hydride, or the like mixed into the oxide semiconductor film can be reduced. In addition, with the use of the target, the concentration of an alkali metal such as lithium, sodium, or potassium can be reduced in the oxide semiconductor film.

Note that in order that hydrogen, a hydroxyl group, and water be contained in the oxide semiconductor film as little as possible, it is preferable that impurities such as hydrogen or water that is adsorbed on the substrate 700 be eliminated and exhausted by preheating of the substrate 700 over which the insulating films 712 and 713 are formed in a preheating chamber of a sputtering apparatus, as pretreatment for deposition. The temperature of the preheating is higher than or equal to 100° C. and lower than or equal to 400° C. inclusive, preferably higher than or equal to 150° C. and lower than or equal to 300° C. inclusive. As an exhaustion means provided in the preheating chamber, a cryopump is preferable. Note that the preheating treatment can be omitted. This preheating may be similarly performed on the substrate 700 over which conductive films 719 and 720 are formed before the formation of a gate insulating film 721.

Note that etching for forming the oxide semiconductor layer 716 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching, reactive ion etching (RIE) can be used. For generation of plasma, a capacitively coupled plasma (CCP) method, an inductively coupled plasma (ICP) method, an electron cyclotron resonance (ECR) method, a helicon wave plasma (HWP) method, a microwave-excited surface wave plasma (SWP) method, or the like can be used. In the case where dry etching is employed, in order to etch the film into a desired shape, the etching conditions (e.g., the amount of power applied to a coiled electrode, the amount of power applied to an electrode on the substrate side, and the temperature of the electrode on the substrate side) are adjusted as appropriate.

As an etchant used for the wet etching, a mixed solution of phosphoric acid, acetic acid, and nitric acid, organic acid such as citric acid or oxalic acid, or the like can be used. In this embodiment, ITO-07N (produced by KANTO CHEMICAL CO., INC.) is used.

A resist mask for forming the oxide semiconductor layer 716 may be formed by an inkjet method. When the resist mask is formed by an inkjet method, a photomask is not used; thus, manufacturing cost can be reduced.

Note that it is preferable that reverse sputtering be performed before the formation of a conductive film in a subsequent step so that resist residues and the like that attach onto surfaces of the oxide semiconductor layer 716 and the insulating films 712 and 713 are removed.

Note that the oxide semiconductor film formed by sputtering or the like contains a large amount of water or hydrogen (including a hydroxyl group) as impurities in some cases. Water or hydrogen easily forms a donor level and thus serve as impurities in the oxide semiconductor. Thus, in one embodiment of the present invention, in order to reduce impurities such as water or hydrogen in the oxide semiconductor film (in order to perform dehydration or dehydrogenation), the oxide semiconductor layer 716 is subjected to heat treatment in a reduced-pressure atmosphere, an inert gas atmosphere of nitrogen, a rare gas, or the like, an oxygen gas atmosphere, or ultra dry air (the moisture amount is 20 ppm (−55° C. by conversion into a dew point) or less, preferably 1 ppm or less, more preferably 10 ppb or less, in the case where measurement is performed by a dew point meter in a cavity ring down laser spectroscopy (CRDS) method).

By performing heat treatment on the oxide semiconductor layer 716, water or hydrogen in the oxide semiconductor layer 716 can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 to 6 minutes. When RTA is used for the heat treatment, dehydration or dehydrogenation can be performed in a short time; thus, treatment can be performed even at a temperature higher than the strain point of a glass substrate.

In this embodiment, an electric furnace that is one of heat treatment apparatuses is used.

Note that the heat treatment apparatus is not limited to an electric furnace, and may be provided with a device for heating an object by thermal conduction or thermal radiation from a heater such as a resistance heater. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. An inert gas that does not react with an object by heat treatment, such as nitrogen or a rare gas (e.g., argon), is used as the gas.

In the heat treatment, it is preferable that water, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6N (99.9999%) or higher, more preferably 7N (99.99999%) or higher (that is, the impurity concentration is 1 ppm or lower, preferably 0.1 ppm or lower).

Note that it has been pointed out that an oxide semiconductor is insensitive to impurities, there is no problem when a considerable amount of metal impurities is contained in the film, and soda-lime glass which contains a large amount of alkali metal such as sodium and is inexpensive can be used (Kamiya, Nomura, and Hosono, "Carrier Transport Properties and Electronic Structures of Amorphous Oxide Semiconductors: The present status", *KOTAI BUTSURI* (*SOLID STATE PHYSICS*), 2009, Vol. 44, pp. 621-633). However, such consideration is not appropriate. Alkali metal is not an element included in an oxide semiconductor and thus is an impurity. Alkaline earth metal is also an impurity in the case where alkaline earth metal is not included in an oxide semiconductor. Alkali metal, in particular, Na becomes $Na^+$ when an insulating film that is in contact with an oxide semiconductor layer is oxide and Na diffuses into the insulating film. In addition, in the oxide semiconductor layer, Na cuts or enters a bond between metal and oxygen that are included in an oxide semiconductor. As a result, for example, deterioration of characteristics of a transistor, such as a normally-on state of the transistor due to shift of the threshold voltage in a negative direction, or a decrease in field-effect mobility, occurs. Variation in characteristics also occurs. Such deterioration of characteristics of the transistor and variation in characteristics due to the impurity markedly appear when the concentration of hydrogen in the oxide semiconductor layer is extremely low. Thus, when the concentration of hydrogen in the oxide semiconductor layer is $1 \times 10^{18}$ atoms/cm$^3$ or lower, preferably $1 \times 10^{17}$ atoms/cm$^3$ or lower, the concentration of the impurity is preferably lowered. Specifically, the measurement value of a Na concentration by secondary ion mass spectrometry is preferably $5 \times 10^{16}$ atoms/cm$^3$ or less, more preferably $1 \times 10^{16}$ atoms/cm$^3$ or less, still more preferably $1 \times 10^{15}$ atoms/cm$^3$ or less. Similarly, the measurement value of a Li concentration is preferably $5 \times 10^{15}$ atoms/cm$^3$ or less, more preferably $1 \times 10^{15}$ atoms/cm$^3$ or less. Similarly, the measurement value of a K concentration is preferably $5 \times 10^{15}$ atoms/cm$^3$ or less, more preferably $1 \times 10^{15}$ atoms/cm$^3$ or less.

Through the above steps, the highly purified oxide semiconductor layer 716 with low concentration of hydrogen can be formed.

After the oxide semiconductor layer 716 is formed, oxygen may be introduced thereinto by ion implantation. Oxygen can be alternatively introduced by a plasma doping method. Specifically, oxygen is turned into plasma with the use of radio-frequency (RF) power, and oxygen radicals or oxygen ions are introduced into the oxide semiconductor layer 716. At this time, it is preferable to apply a bias to the substrate over which the oxide semiconductor layer 716 is formed. By increasing the bias applied to the substrate, oxygen can be introduced more deeply.

Oxygen (an oxygen radical, an oxygen atom, and/or an oxygen ion) introduced into the oxide semiconductor layer 716 by plasma doping may be supplied from a plasma generation apparatus with the use of a gas containing oxygen or from an ozone generation apparatus.

After the introduction of the oxygen to the oxide semiconductor layer 716, the heat treatment may be performed (preferably at higher than or equal to 200° C. and lower than or equal to 600° C., for example, at higher than or equal to 250° C. and lower than or equal to 550° C.). For example, the heat treatment is performed at 450° C. for one hour in a nitrogen atmosphere. It is preferable that the above atmosphere do not contain water, hydrogen, or the like.

By introduction of oxygen into the oxide semiconductor layer 716 and heating, it is possible to supply oxygen, which is one of the main components of the oxide semiconductor and is reduced at the same time as a step for removing impurities, so that the oxide semiconductor layer 716 can be made to be i-type (intrinsic).

Note that the oxide semiconductor layer 716 may be either amorphous or crystalline. When a crystalline oxide semiconductor is used for the oxide semiconductor layer 716, the insulating film 713 that is in contact with the oxide semiconductor layer 716 preferably has a sufficient planarity so that crystals of an oxide semiconductor layer 716 are easily grown. Specifically, the average surface roughness ($R_a$) is 1 nm or less, preferably 0.3 nm or less. $R_a$ can be measured using an atomic force microscope (AFM). Alternatively, an insulating film that is in contact with the oxide semiconductor layer 716 and has a sufficient planarity may be provided over the insulating film 713.

As the oxide semiconductor having crystallinity, an oxide semiconductor including a crystal with c-axis alignment (also referred to as c-axis aligned crystalline oxide semiconductor (CAAC-OS)), which has a triangular or hexagonal atomic arrangement when seen from the direction of an a-b plane, a surface, or an interface may be used. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, CAAC-OS includes a phase which has a triangular, hexagonal, regular triangular, or regular hexagonal atomic order when seen from the direction perpendicular to the a-b plane and in which metal atoms are arranged in a layered manner or metal atoms and oxygen atoms are arranged in a layered manner when seen from the direction perpendicular to the c-axis direction.

The CAAC-OS is not a single crystal but this does not mean that the CAAC-OS is composed of only an amorphous component. Although the CAAC-OS includes a crystallized portion (a crystalline portion), a boundary between one crystalline portion and another crystalline portion is not clear in some cases.

Nitrogen may be substituted for part of oxygen included in the CAAC-OS. The c-axes of crystalline portions included in the CAAC-OS may be aligned in a certain direction (e.g., a direction perpendicular to a surface of a substrate over which the CAAC-OS is formed or a surface of the CAAC-OS). Alternatively, the normals of the a-b planes of the crystalline portions included in the CAAC-OS may be aligned in a certain direction (e.g., a direction perpendicular to a surface of a substrate over which the CAAC-OS is formed or a surface of the CAAC-OS).

The CAAC-OS can be a conductor or an insulator depending on its composition or the like. Further, the CAAC-OS transmits or does not transmit visible light depending on its composition or the like.

As an example of the CAAC-OS, there is an oxide semiconductor that is formed into a film shape and has a triangular or hexagonal atomic order when seen from the direction perpendicular to a surface of the film or a surface of a substrate over which the oxide semiconductor is formed, and in which metal atoms are arranged in a layered manner or metal atoms and oxygen atoms (or nitrogen atoms) are arranged in a layered manner when a cross section of the film is observed.

The CAAC-OS is described in detail with reference to FIGS. 13A to 13E, FIGS. 14A to 14C, and FIGS. 15A to 15C. In FIGS. 13A to 13E, FIGS. 14A to 14C, and FIGS. 15A to 15C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 13A to 13E, O surrounded by a circle represents tetracoordinate O and O surrounded by a double circle represents tricoordinate O.

Figure 13A:
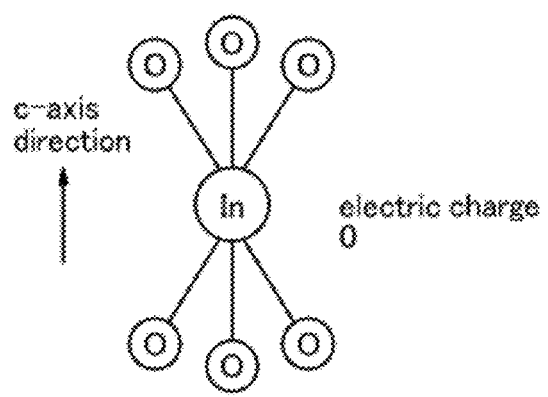
FIGS. 13A to 13E illustrate structures of oxide semiconductor materials.

FIG. 13A illustrates a structure including one hexacoordinate In atom and six tetracoordinate oxygen (hereinafter referred to as tetracoordinate O) atoms proximate to the In atom. Here, a structure in which one metal atom and oxygen atoms proximate thereto are only illustrated is referred to as a sub unit. The structure in FIG. 13A is actually an octahedral structure, but is illustrated as a planar structure for simplicity. Note that three tetracoordinate O atoms exist in each of an upper half and a lower half in FIG. 13A. In the sub unit illustrated in FIG. 13A, electric charge is 0.

Figure 13D:
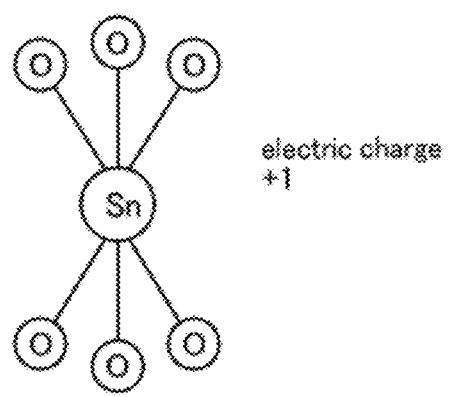
Figure 13B:
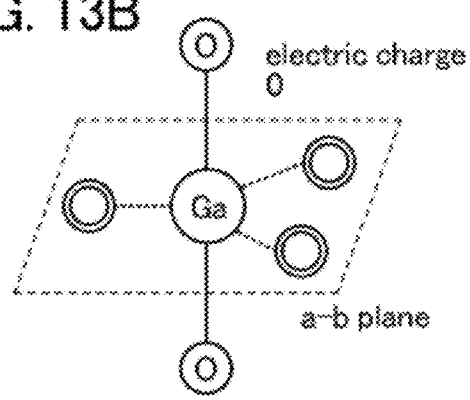

FIG. 13B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 13B. An In atom can also have the structure illustrated in FIG. 13B because an In atom can have five ligands. In the sub unit illustrated in FIG. 13B, electric charge is 0.

Figure 13E:
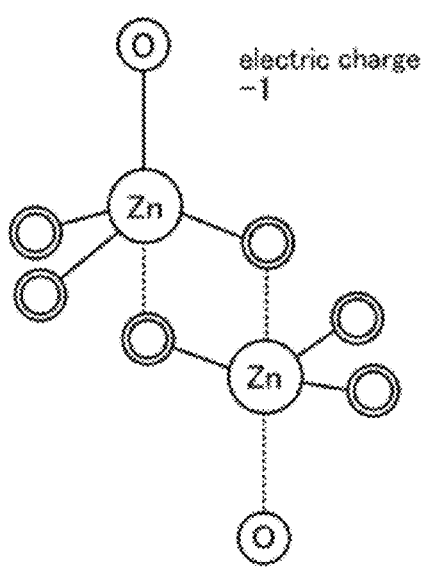
Figure 13C:
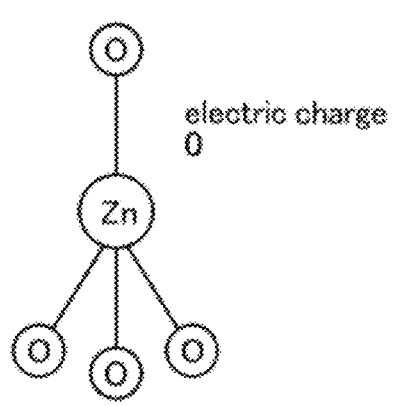

FIG. 13C illustrates a structure including one tetracoordinate Zn atom and four tetracoordinate O atoms proximate to the Zn atom. Alternatively, three tetracoordinate O atoms may exist in the upper half and one tetracoordinate O atom may exist in the lower half in FIG. 13C. In FIG. 13C, one tetracoordinate O atom exists in an upper half and three tetracoordinate O atoms exist in a lower half. In the sub unit illustrated in FIG. 13C, electric charge is 0.

FIG. 13D illustrates a structure including one hexacoordinate Sn atom and six tetracoordinate O atoms proximate to the Sn atom. In FIG. 13D, three tetracoordinate O atoms exist in each of an upper half and a lower half. In the sub unit illustrated in FIG. 13D, electric charge is +1.

FIG. 13E illustrates a sub unit including two Zn atoms. In FIG. 13E, one tetracoordinate O atom exists in each of an upper half and a lower half. In the sub unit illustrated in FIG. 13E, electric charge is −1.

Here, a plurality of sub units form a group, and a plurality of groups form one cycle that is called a unit.

Now, a rule of bonding between the sub units is described. The three O atoms in the upper half with respect to the hexacoordinate In atom each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of sub units including the metal atoms can be bonded. For example, in the case where the hexacoordinate metal (In or Sn) atom is bonded through three tetracoordinate O atoms in the lower half, it is bonded to the pentacoordinate metal (Ga or In) atom, or the tetracoordinate metal (Zn) atom.

A metal atom whose coordination number is 4, 5, or 6 is bonded to another metal atom through a tetracoordinate O atom in the c-axis direction. In addition to the above, a group can be formed in a different manner by combining sub units so that the total electric charge of the layered structure is 0.

Figure 14A:
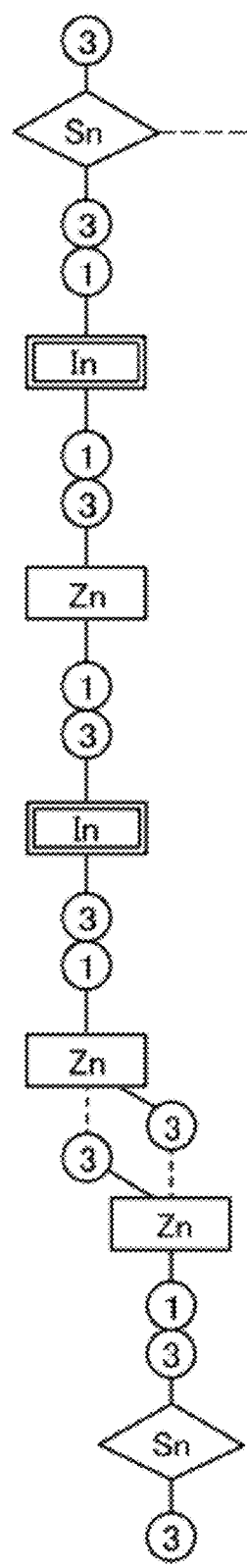
FIGS. 14A to 14C illustrate a structure of an oxide semiconductor material.
Figure 14B:
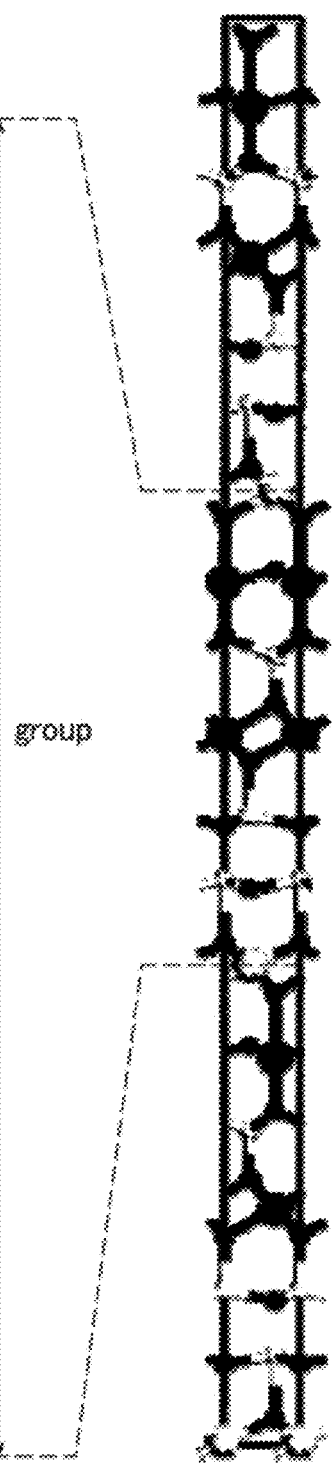
Figure 14C:
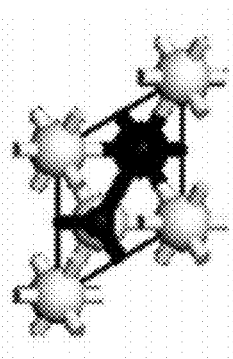

FIG. 14A illustrates a model of a group included in a layered structure of an In—Sn—Zn-based oxide. FIG. 14B illustrates a unit including three groups. Note that FIG. 14C illustrates an atomic arrangement in the case where the layered structure in FIG. 14B is observed from the c-axis direction.

In FIG. 14A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 14A, one tetracoordinate O atom existing in each of an upper half and a lower half with respect to an In atom is denoted by circled 1. FIG. 14A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the group included in the layered structure of the In—Sn—Zn-based oxide in FIG. 14A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a sub unit that includes two Zn atoms and is proximate to one tetracoordinate O atom in an upper half, and the sub unit is bonded to a Sn atom proximate to three tetracoordinate O atoms in each of an upper half and a lower half through one tetracoordinate O atom in a lower half with respect to the sub unit. A plurality of such groups are bonded, so that one cycle that is called a unit is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a sub unit including a Sn atom is +1. Therefore, electric charge of −1, which cancels +1, is needed to form a layered structure including a Sn atom. As a structure having electric charge of −1, the sub unit including two Zn atoms as illustrated in FIG. 14C can be given. For example, with one sub unit including two Zn atoms, electric charge of one sub unit including a Sn atom can be cancelled, so that the total electric charge of the layered structure can be 0.

An In atom can have either five ligands or six ligands. Specifically, a crystal of an In—Sn—Zn-based oxide ($In_2SnZn_3O_8$) can be formed using a unit illustrated in FIG. 14B. Note that a layered structure of the obtained In—Sn—Zn-based oxide can be expressed as a composition formula, $In_2SnZn_2O_7(ZnO)_m$, (m is 0 or a natural number). As larger m is, the crystallinity of the In—Sn—Zn-based oxide is improved, which is preferable.

The above-described rule also applies to the following materials: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Pm—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

As an example, FIG. 15A illustrates a model of a group included in a layered structure of an In—Ga—Zn-based oxide.

In the group included in the layered structure of the In—Ga—Zn-based oxide in FIG. 15A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such groups are bonded, so that one cycle that is called a unit is formed.

FIG. 15B illustrates a unit including three groups. Note that FIG. 15C illustrates an atomic arrangement in the case where the layered structure in FIG. 15B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a sub unit including any of an In atom, a Zn atom, and a Ga atom is 0. As a result, the total electric charge of a group having a combination of such sub units is always 0.

In order to form the layered structure of the In—Ga—Zn-based oxide, a unit can be formed using not only the group illustrated in FIG. 15A but also a group in which the arrangement of the In atom, the Ga atom, and the Zn atom is different from that in FIG. 15A.

Figure 9A:
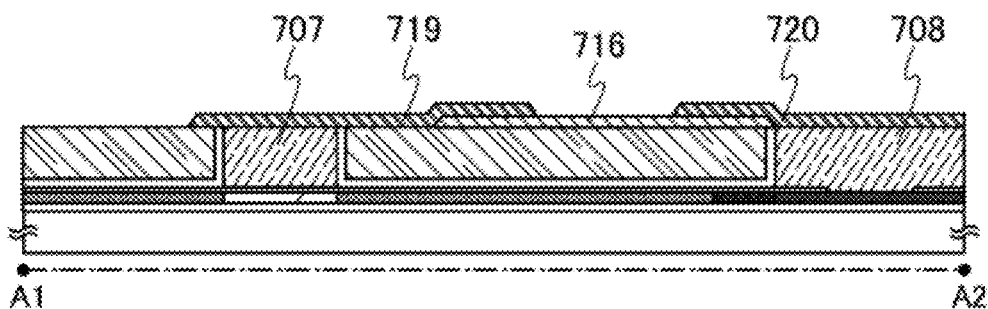
FIGS. 9A to 9C illustrate manufacturing steps of a transistor.

Next, as illustrated in FIG. 9A, the conductive film 719 which is in contact with the gate electrode 707 and the oxide semiconductor layer 716 and the conductive film 720 which is in contact with the conductive film 708 and the oxide semiconductor layer 716 are formed. The conductive films 719 and 720 function as a source and drain electrodes.

Specifically, the conductive films 719 and 720 can be formed in such a manner that a conductive film is formed to cover the gate electrode 707 and the conductive film 708 by sputtering or vacuum vapor deposition and then is processed into a predetermined shape.

As the conductive film for forming the conductive films 719 and 720, any of the following materials can be used: an element selected from aluminum, chromium, copper, tantalum, titanium, molybdenum, or tungsten; an alloy including any of these elements; an alloy film including the above elements in combination; and the like. Alternatively, a structure may be employed in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film for forming the conductive films 719 and 720 may have a single-layer structure or a stacked structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Mo—Ti alloy, Ti, and Mo have high adhesion with an oxide film. Thus, for the conductive films 719 and 720, a stacked structure is employed in which a conductive film including a Cu—Mg—Al alloy, a Mo—Ti alloy, Ti, or Mo is used for a lower layer and a conductive film including Cu is used for an upper layer. Consequently, the adhesion between an insulating film that is an oxide film and the conductive films 719 and 720 can be increased.

For the conductive film for forming the conductive films 719 and 720, a conductive metal oxide may be used. As the conductive metal oxide, indium oxide, tin oxide, zinc oxide, indium oxide-tin oxide, indium oxide-zinc oxide, or the conductive metal oxide material containing silicon or silicon oxide can be used.

In the case where heat treatment is performed after the formation of the conductive film, the conductive film preferably has heat resistance high enough to withstand the heat treatment.

Note that each material and etching conditions are adjusted as appropriate so that the oxide semiconductor layer 716 is not removed as much as possible during etching of the conductive film. Depending on the etching conditions, an exposed portion of the oxide semiconductor layer 716 is partly etched, so that a groove (a depression portion) is formed in some cases.

In this embodiment, a titanium film is used as the conductive film. Thus, the conductive film can be selectively etched by wet etching using a solution (an ammonia hydrogen peroxide mixture) containing ammonia and hydrogen peroxide water. Specifically, an ammonia hydrogen peroxide mixture in which oxygenated water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron trichloride ($BCl_3$), or the like.

Note that in order to reduce the number of photomasks and steps in a photolithography process, an etching process may be performed using a multi-tone mask through which light is transmitted to have a plurality of intensities. A resist mask formed using a multi-tone mask has a plurality of thicknesses, and can be changed in shape by etching; thus, the resist mask can be used in a plurality of etching processes for processing films into different patterns. Accordingly, a resist mask corresponding to at least two or more kinds of different patterns can be formed by one multi-tone mask. Thus, the number of exposure masks and the number of corresponding photolithography processes can be reduced, so that the process can be simplified.

Further, an oxide conductive film that functions as a source and drain regions may be provided between the oxide semiconductor layer 716 and the conductive films 719 and 720 that function as a source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, etching for forming the oxide conductive film and etching for forming the conductive films 719 and 720 may be performed concurrently.

With provision of the oxide conductive film that functions as a source and drain regions, resistance between the oxide semiconductor layer 716 and the conductive films 719 and 720 can be lowered, so that the transistor can operate at high speed. In addition, with provision of the oxide conductive film that functions as a source and drain regions, the withstand voltage of the transistor can be increased.

Next, plasma treatment may be performed using a gas such as $N_2O$, $N_2$, or Ar. With this plasma treatment, water and the like which attach to a surface of the oxide semiconductor layer exposed are removed. Alternatively, plasma treatment may be performed using a mixture gas of oxygen and argon.

Figure 9B:
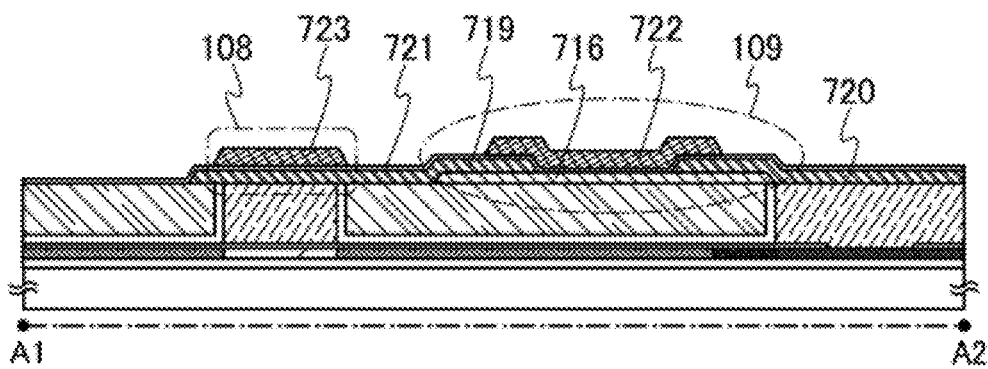

After the plasma treatment, as illustrated in FIG. 9B, the gate insulating film 721 is formed to cover the conductive films 719 and 720 and the oxide semiconductor layer 716. Then, a gate electrode 722 is formed over the gate insulating film 721 to overlap with the oxide semiconductor layer 716, and a conductive film 723 is formed over the gate insulating film 721 to overlap with the conductive film 719.

The gate insulating film 721 can be formed using a material and a stacked structure that are similar to those of the gate insulating film 703. Note that the gate insulating film 721 preferably includes impurities such as water or hydrogen as little as possible, and the gate insulating film 721 may be formed using a single-layer insulating film or a plurality of insulating films stacked. When hydrogen is contained in the gate insulating film 721, hydrogen enters the oxide semiconductor layer 716 or oxygen in the oxide semiconductor layer 716 is extracted by hydrogen, whereby the oxide semiconductor layer 716 has lower resistance (n-type conductivity); thus, a parasitic channel might be formed.

Thus, it is important that a manufacturing method in which hydrogen is not used be employed in order to form the gate insulating film 721 containing hydrogen as little as possible. It is preferable that the gate insulating film 721 also include an oxygen-excess region for the following reason. When the gate insulating film 721 includes an oxygen-excess region, oxygen can be prevented from moving from the oxide semiconductor layer 716 to the gate insulating film 721, and oxygen can be supplied from the gate insulating film 721 to the oxide semiconductor layer 716.

The gate insulating film 721 may be formed using a material that has a high barrier property against an alkali metal, hydrogen, and oxygen. The gate insulating film 721 may be formed by stacking an insulating film including an oxygen-excess region and an insulating film having a high barrier property. As the insulating film having a high barrier property, a silicon nitride film, a silicon nitride oxide film, an aluminum nitride film, an aluminum oxide film, an aluminum oxynitride film, an aluminum nitride oxide film, or the like can be used, for example. In the case where the gate insulating film 721 may be formed by stacking an insulating film including an oxygen-excess region and an insulating film having a high barrier property, the insulating film including an oxygen-excess region can be formed in contact with the oxide semiconductor layer 716.

When the insulating film having a high barrier property is used, impurities can be prevented from entering the oxide semiconductor layer 716, an interface between the oxide semiconductor layer 716 and the insulating film, and the vicinity thereof, and oxygen can be prevented from being released from the oxide semiconductor layer 716.

In this embodiment, the gate insulating film 721 with a structure in which a 100-nm-thick silicon nitride film formed by sputtering is stacked over a 200-nm-thick silicon oxide film formed by sputtering is formed. The substrate temperature during deposition is in the range of room temperature to 300° C., and is 100° C. in this embodiment.

After the gate insulating film 721 is formed, heat treatment may be performed. The heat treatment is performed in a nitrogen atmosphere, ultra-dry air, or a rare gas (e.g., argon or helium) atmosphere preferably at higher than or equal to 200° C. and lower than or equal to 400° C., for example, higher than or equal to 250° C. and lower than or equal to 350° C. It is preferable that the content of water in the gas be 20 ppm or lower, preferably 1 ppm or lower, more preferably 10 ppb or lower. In this embodiment, for example, heat treatment is performed at 250° C. for 1 hour in a nitrogen atmosphere. Alternatively, RTA treatment for a short time at a high temperature may be performed before the formation of the conductive films 719 and 720 in a manner similar to that of the heat treatment performed on the oxide semiconductor layer for reduction of water or hydrogen. Even when oxygen defects are generated in the oxide semiconductor layer 716 by the heat treatment performed on the oxide semiconductor layer 716 by performing heat treatment after provision of the gate insulating film 721 containing oxygen, oxygen is supplied to the oxide semiconductor layer 716 from the gate insulating film 721.

By the supply of oxygen to the oxide semiconductor layer 716, oxygen defects that serve as donors can be reduced in the oxide semiconductor layer 716 and the stoichiometric ratio can be satisfied. It is preferable that the proportion of oxygen in the oxide semiconductor layer 716 be higher than that in the stoichiometric composition. As a result, the oxide semiconductor layer 716 can be made substantially intrinsic and variation in electrical characteristics of the transistor due to oxygen defects can be reduced; thus, electrical characteristics can be improved. The timing of this heat treatment is not particularly limited as long as it is after the formation of the gate insulating film 721. When this heat treatment serves as heat treatment in another step (e.g., heat treatment during formation of a resin film or heat treatment for lowering the resistance of a transparent conductive film), the oxide semiconductor layer 716 can be made substantially intrinsic without an increase in the number of steps.

Alternatively, the oxygen defects that serve as donors in the oxide semiconductor layer 716 may be reduced by subjecting the oxide semiconductor layer 716 to heat treatment in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, or the like. Alternatively, the purity of the oxygen gas which is introduced into the heat treatment apparatus is preferably 6N (99.9999%) or higher, more preferably 7N (99.99999%) or higher (that is, the impurity concentration in oxygen is 1 ppm or lower, preferably 0.1 ppm or lower).

The gate electrode 722 and the conductive film 723 can be formed in such a manner that a conductive film is formed over the gate insulating film 721 and then is etched. The gate electrode 722 and the conductive film 723 can be formed using a material similar to those of the gate electrode 707 and the conductive films 719 and 720.

The thickness of each of the gate electrode 722 and the conductive film 723 is 10 to 400 nm, preferably 100 to 200 nm In this embodiment, after a 150-nm-thick conductive film for the gate electrode is formed by sputtering using a tungsten target, the conductive film is processed into a desired shape by etching, so that the gate electrode 722 and the conductive film 723 are formed. A resist mask may be formed by an inkjet method. When the resist mask is formed by an inkjet method, a photomask is not used; thus, manufacturing cost can be reduced.

Through the above steps, the transistor 109 is formed.

Note that a portion where the conductive film 719 and the conductive film 723 overlap with each other with the gate insulating film 721 provided therebetween corresponds to a capacitor 108.

Although the transistor 109 is described as a single-gate transistor, a multi-gate transistor including a plurality of channel formation regions can be formed when the plurality of gate electrodes that are electrically connected to each other are included when needed.

Note that an insulating film which is in contact with the oxide semiconductor layer 716 (in this embodiment, corresponding to the gate insulating film 721) may be formed using an insulating material containing an element that belongs to Group 13 and oxygen. Many oxide semiconductor materials contain an element that belongs to Group 13, and an insulating material containing an element that belongs to Group 13 works well with an oxide semiconductor. By using such an insulating material containing an element that belongs to Group 13 for the insulating film that is in contact with the oxide semiconductor layer, the state of an interface with the oxide semiconductor layer can be kept well.

An insulating material containing an element that belongs to Group 13 is an insulating material containing one or more elements that belong to Group 13. Examples of the insulating material containing an element that belongs to Group 13 include gallium oxide, aluminum oxide, aluminum gallium oxide, and gallium aluminum oxide. Here, aluminum gallium oxide is a material whose content of aluminum is larger than the content of gallium in an atomic percent, and gallium aluminum oxide is a material whose content of gallium is larger than or equal to the content of aluminum in an atomic percent.

For example, in the case where an insulating film is formed in contact with an oxide semiconductor layer containing gallium, when a material containing gallium oxide is used for the insulating film, favorable characteristics can be kept at the interface between the oxide semiconductor layer and the insulating film. For example, when the oxide semiconductor layer and the insulating film containing gallium oxide are provided in contact with each other, pileup of hydrogen at the interface between the oxide semiconductor layer and the insulating film can be reduced. Note that a similar effect can be obtained in the case where an element that belongs to the same group as a constituent element of the oxide semiconductor is used for the insulating film. For example, it is effective to form an insulating film with the use of a material containing aluminum oxide. Aluminum oxide is a material having a barrier property and does not easily transmit water. Thus, it is preferable to use the material including aluminum oxide in order to prevent water from entering the oxide semiconductor layer.

Similarly to the gate insulating film 721, the insulating film 713 is preferably formed using a material including an oxygen-excess region (a region containing oxygen at a proportion exceeding the stoichiometric composition). An insulating film including an oxygen-excess region may be formed between the insulating film 713 and the oxide semiconductor layer 716.

Oxygen doping is performed on an insulating film, so that the insulating film including an oxygen-excess region can be formed. Oxygen doping is addition of oxygen to a bulk. Note that the term "bulk" is used in order to clarify that oxygen is added not only to a surface of a thin film but also to the inside of the thin film. In addition, the term "oxygen doping" includes "oxygen plasma doping" in which oxygen that is made to be plasma is added to a bulk. The oxygen doping may be performed by ion implantation, ion doping, or plasma doping.

For example, in the case where the insulating film which is in contact with the oxide semiconductor layer 716 is formed using gallium oxide, the composition of gallium oxide can be set to be $Ga_2O_X$ (X=3+α, 0<α<1) by heat treatment in an oxygen atmosphere or oxygen doping.

In the case where the insulating film which is in contact with the oxide semiconductor layer 716 is formed using aluminum oxide, the composition of aluminum oxide can be set to be $Al_2O_X$ (X=3+α, 0<α<1) by heat treatment in an oxygen atmosphere or oxygen doping.

In the case where the insulating film which is in contact with the oxide semiconductor layer 716 is formed using gallium aluminum oxide (aluminum gallium oxide), the composition of gallium aluminum oxide (aluminum gallium oxide) can be set to be $Ga_XAl_{2-X}O_{3+a}$ (0<X<2, 0<a<1) by heat treatment in an oxygen atmosphere or oxygen doping.

When the insulating film including an oxygen-excess region is formed in contact with the oxide semiconductor layer 716 and heat treatment is performed, oxygen that excessively exists in the insulating film is supplied to the oxide semiconductor layer, and oxygen deficiency in the oxide semiconductor layer or at the interface between the oxide semiconductor layer and the insulating film is reduced. Thus, the oxide semiconductor layer can be an intrinsic or substantially intrinsic oxide semiconductor layer.

The insulating film including an oxygen-excess region may be applied to either the insulating film placed on an upper side of the oxide semiconductor layer or the insulating film placed on a lower side of the oxide semiconductor layer of the insulating films which are in contact with the oxide semiconductor layer 716; however, it is preferable to apply such an insulating film to both the insulating films which are in contact with the oxide semiconductor layer 716. The above effect can be enhanced with a structure where the oxide semiconductor layer 716 is sandwiched between the insulating films each including an oxygen-excess region, which are used as the insulating films in contact with the oxide semiconductor layer 716 and positioned on the upper side and the lower side of the oxide semiconductor layer 716.

The insulating films on the upper side and the lower side of the oxide semiconductor layer 716 may contain the same constituent element or different constituent elements. For example, the insulating films on the upper side and the lower side may be both formed using gallium oxide whose composition is $Ga_2O_X$ (X=3+α, 0<α<1). Alternatively, one of the insulating films on the upper side and the lower side may be formed using $Ga_2O_X$ (X=3+α, 0<α<1) and the other may be formed using aluminum oxide whose composition is $Al_2O_X$ (X=3+α, 0<α<1).

The insulating film that is in contact with the oxide semiconductor layer 716 may be formed by a stack of insulating films each including an oxygen-excess region. For example, the insulating film on the upper side of the oxide semiconductor layer 716 may be formed as follows: gallium oxide whose composition is $Ga_2O_X$ (X=3+α, 0<α<1) is formed and gallium aluminum oxide (aluminum gallium oxide) whose composition is $Ga_XAl_{2-X}O_{3+a}$ (0<X<2, 0<α<1) may be formed thereover.

Figure 9C:
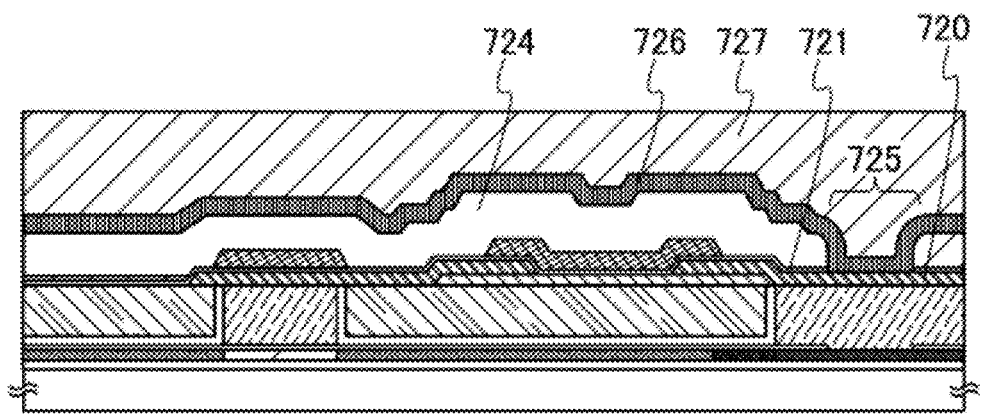

Next, as illustrated in FIG. 9C, an insulating film 724 is formed to cover the gate insulating film 721, the conductive film 723, and the gate electrode 722. The insulating film 724 can be formed by PVD, CVD, or the like. The insulating film 724 can be formed using a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is lowered, parasitic capacitance generated between wirings or electrodes can be reduced, which results in higher speed operation. Note that although the insulating film 724 has a single-layer structure in this embodiment, one embodiment of the present invention is not limited to this structure. The insulating film 724 may have a stacked structure of two or more layers.

Next, an opening 725 is formed in the gate insulating film 721 and the insulating film 724, so that part of the conductive film 720 is exposed. After that, a wiring 726 that is in contact with the conductive film 720 through the opening 725 is formed over the insulating film 724.

A conductive film is formed by PVD or CVD and then is etched, so that the wiring 726 is formed. As the material of the conductive film, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used.

Specifically, for example, it is possible to employ a method in which a thin titanium film is formed in a region including the opening of the insulating film 724 by PVD and a thin titanium film (with a thickness of approximately 5 nm) is formed by PVD, and then an aluminum film is formed so as to be embedded in the opening 725. Here, the titanium film formed by PVD has a function of reducing an oxide film (e.g., a native oxide film) formed on a surface over which the titanium film is formed, to decrease the contact resistance with the lower electrode or the like (here, the conductive film 720). In addition, hillocks of the aluminum film can be prevented. A copper film may be formed by a plating method after a barrier film of titanium, titanium nitride, or the like is formed.

The opening 725 formed in the insulating film 724 is preferably formed in a region overlapping with the conductive film 708. With provision of the opening 725 in such a region, the increase in element area due to a contact region can be prevented.

Here, the case where a connection position of the impurity region 704 and the conductive film 720 and a connection position of the conductive film 720 and the wiring 726 overlap with each other without the use of the conductive film 708 is described. In that case, an opening (also referred to as an opening in a lower portion) is formed in the insulating films 712 and 713 that are formed over the impurity region 704, and the conductive film 720 is formed to cover the opening in the lower portion. After that, an opening (also referred to as an opening in an upper portion) is formed in the gate insulating films 721 and 724 in a region overlapping with the opening in the lower portion, and the wiring 726 is formed. When the opening in the upper portion is formed in the region overlapping with the opening in the lower portion, the conductive film 720 formed in the opening in the lower portion might be disconnected by etching. In order to avoid the disconnection, the openings in the lower portion and in the upper portion are formed so as not to overlap with each other, so that a problem of the increase in element area occurs.

As described in this embodiment, with the use of the conductive film 708, the opening in the upper portion can be formed without disconnection of the conductive film 720. Thus, the openings in the lower portion and in the upper portion can be formed to overlap with each other, so that the increase in element area due to the openings can be suppressed. In other words, the degree of integration of the semiconductor device can be increased.

Next, an insulating film 727 is formed to cover the wiring 726. Through the series of steps, the signal processing unit 100 and the reading circuit 104 can be formed.

Note that in the manufacturing method, the conductive films 719 and 720 functioning as a source and drain electrodes are formed after the formation of the oxide semiconductor layer 716. Thus, as illustrated in FIG. 9B, in the transistor 109 obtained by the manufacturing method, the conductive films 719 and 720 are formed over the oxide semiconductor layer 716. However, in the transistor 109, the conductive films functioning as a source and drain electrodes may be formed below the oxide semiconductor layer 716, that is, between the oxide semiconductor layer 716 and the insulating films 712 and 713.

Figure 10:
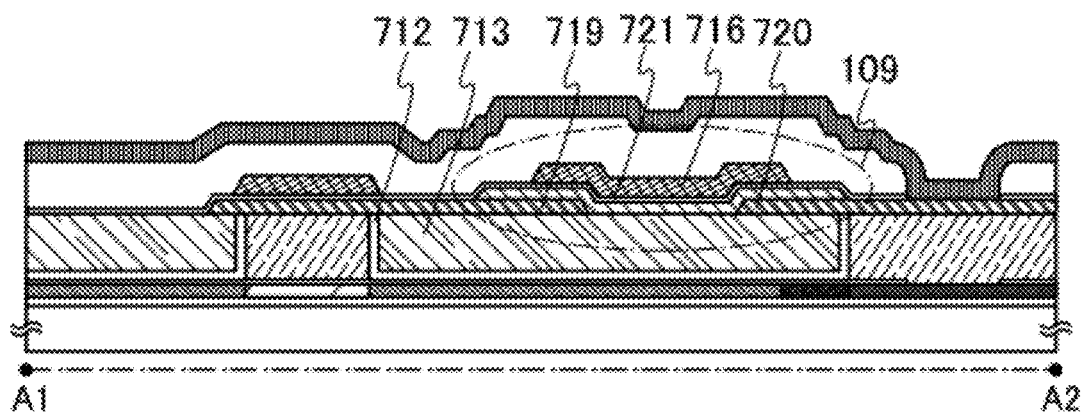
FIG. 10 is a cross-sectional view illustrating a structure of a transistor.

FIG. 10 is a cross-sectional view of the transistor 109 at the time when the conductive films 719 and 720 functioning as a source and drain electrodes are provided between the oxide semiconductor layer 716 and the insulating films 712 and 713. The transistor 109 illustrated in FIG. 10 can be obtained in such a manner that the conductive films 719 and 720 are formed after the formation of the insulating film 713, and then the oxide semiconductor layer 716 is formed.

This embodiment can be combined with any of the above embodiments as appropriate.

(Embodiment 6)

In this embodiment, a transistor including an oxide semiconductor layer with a structure different from the structure in Embodiment 5 is described.

Figure 11A:
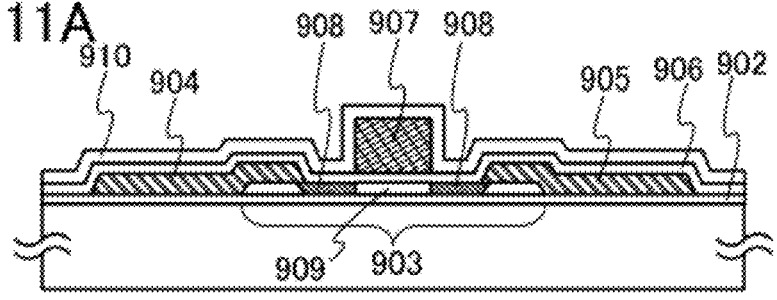
FIGS. 11A to 11D are cross-sectional views each illustrating a structure of a transistor including an oxide semiconductor.

A transistor 901 illustrated in FIG. 11A includes an oxide semiconductor layer 903 that is formed over a base film 902 and functions as an active layer; a source electrode 904 and a drain electrode 905 that are formed over the oxide semiconductor layer 903; a gate insulating film 906 that is formed over the oxide semiconductor layer 903, the source electrode 904, and the drain electrode 905; a gate electrode 907 that is over the gate insulating film 906 and overlaps with the oxide semiconductor layer 903; and a protective insulating film 910 that is over the gate electrode 907 and covers the oxide semiconductor layer 903.

The transistor 901 illustrated in FIG. 11A is a top-gate transistor in which the gate electrode 907 is formed over the oxide semiconductor layer 903 and is also a top-contact transistor in which the source electrode 904 and the drain electrode 905 are formed over the oxide semiconductor layer 903. In the transistor 901, the source electrode 904 and the drain electrode 905 do not overlap with the gate electrode 907. In other words, a gap that is larger than the thickness of the gate insulating film 906 is provided between the source electrode 904 and the gate electrode 907 and between the drain electrode 905 and the gate electrode 907. Thus, in the transistor 901, parasitic capacitance formed between the source electrode 904 and the gate electrode 907 and between the drain electrode 905 and the gate electrode 907 can be reduced. Consequently, high-speed operation can be performed.

The oxide semiconductor layer 903 includes a pair of high-concentration regions 908 that can be obtained by addition of a dopant imparting n-type conductivity to the oxide semiconductor layer 903 after the formation of the gate electrode 907. In addition, in the oxide semiconductor layer 903, a region that overlaps with the gate electrode 907 with the gate insulating film 906 provided therebetween is a channel formation region 909. The oxide semiconductor layer 903 includes the channel formation region 909 between the pair of high-concentration regions 908. Addition of a dopant for formation of the pair of high-concentration regions 908 can be performed by ion implantation. A rare gas such as helium, argon, or xenon, nitrogen, phosphorus, arsenic, antimony, boron, or the like can be used as the dopant, for example.

For example, in the case where nitrogen is used as the dopant, the concentration of nitrogen atoms in the high-concentration region 908 is preferably $5 \times 10^{19}/cm^3$ or higher and $1 \times 10^{22}/cm^3$ or lower.

The high-concentration region 908 to which the dopant imparting n-type conductivity is added has higher conductivity than other regions in the oxide semiconductor layer 903.

Thus, with provision of the high-concentration regions 908 in the oxide semiconductor layer 903, resistance between the source electrode 904 and the drain electrode 905 can be lowered.

In the case where an In—Ga—Zn-based oxide is used for the oxide semiconductor layer 903, an oxide semiconductor in the high-concentration regions 908 has a wurtzite crystal structure by heat treatment at higher than or equal to 300° C. and lower than or equal to 600° C. for 1 hour after the addition of nitrogen. When the oxide semiconductor in the high-concentration regions 908 has a wurtzite crystal structure, the conductivity of the high-concentration regions 908 can be further increased and the resistance between the source electrode 904 and the drain electrode 905 can be further lowered. Note that in order to effectively lower the resistance between the source electrode 904 and the drain electrode 905 by formation of an oxide semiconductor with a wurtzite crystal structure, the concentration of nitrogen atoms in the high-concentration region 908 is preferably $1\times10^{20}/cm^3$ or higher and 7 at. % or lower in the case where nitrogen is used as the dopant. Even in the case where the concentration of nitrogen atoms is lower than the above range, an oxide semiconductor with a wurtzite crystal structure can be obtained in some cases.

Alternatively, the oxide semiconductor layer 903 may be formed using a CAAC-OS. In the case where the oxide semiconductor layer 903 is formed using a CAAC-OS, the conductivity of the oxide semiconductor layer 903 can be increased as compared to the case where an amorphous semiconductor is used. Thus, the resistance between the source electrode 904 and the drain electrode 905 can be lowered.

When the resistance between the source electrode 904 and the drain electrode 905 is lowered, high on-state current and high-speed operation can be secured even when the transistor 901 is miniaturized. In addition, by miniaturization of the transistor 901, the area of a semiconductor device including the transistor can be reduced, so that the number of transistors per unit area can be increased.

Figure 11B:
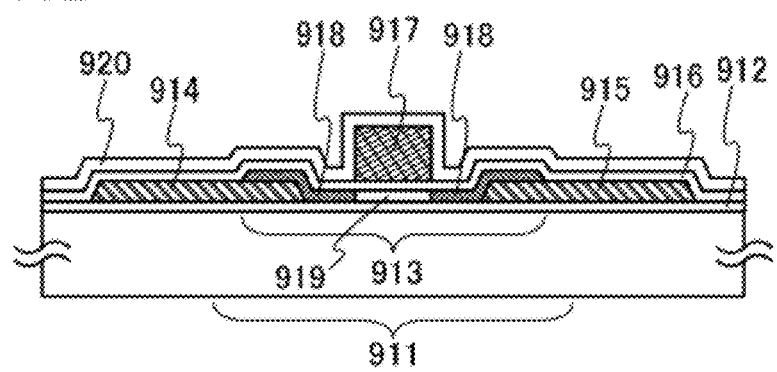

A transistor 911 illustrated in FIG. 11B includes a source electrode 914 and a drain electrode 915 that are formed over a base film 912; an oxide semiconductor layer 913 that is formed over the source electrode 914 and the drain electrode 915 and functions as an active layer; a gate insulating film 916 that is formed over the oxide semiconductor layer 913, the source electrode 914, and the drain electrode 915; a gate electrode 917 that overlaps with the oxide semiconductor layer 913 over the gate insulating film 916; and a protective insulating film 920 that covers the oxide semiconductor layer 913 over the gate electrode 917.

The transistor 911 illustrated in FIG. 11B is a top-gate transistor in which the gate electrode 917 is formed over the oxide semiconductor layer 913 and is also a bottom-contact transistor in which the source electrode 914 and the drain electrode 915 are formed below the oxide semiconductor layer 913. As in the transistor 901, in the transistor 911, the source electrode 914 and the drain electrode 915 do not overlap with the gate electrode 917. Thus, parasitic capacitance formed between the source electrode 914 and the gate electrode 917 and between the drain electrode 915 and the gate electrode 917 can be reduced. Consequently, high-speed operation can be performed.

The oxide semiconductor layer 913 includes a pair of high-concentration regions 918 that can be obtained by addition of a dopant imparting n-type conductivity to the oxide semiconductor layer 913 after the formation of the gate electrode 917. In addition, in the oxide semiconductor layer 913, a region that overlaps with the gate electrode 917 with the gate insulating film 916 provided therebetween is a channel formation region 919. The oxide semiconductor layer 913 includes the channel formation region 919 between the pair of high-concentration regions 918.

The pair of high-concentration regions 918 can be formed by ion implantation as in the high-concentration regions 908 of the transistor 901. The high-concentration regions 908 can be referred to for the kind of a dopant used for the formation of the high-concentration regions 918.

For example, in the case where nitrogen is used as the dopant, the concentration of nitrogen atoms in the high-concentration region 918 is preferably $5\times10^{19}/cm^3$ or higher and $1\times10^{22}/cm^3$ or lower.

The high-concentration region 918 to which the dopant imparting n-type conductivity is added has higher conductivity than other regions in the oxide semiconductor layer 913. Thus, with provision of the high-concentration regions 918 in the oxide semiconductor layer 913, resistance between the source electrode 914 and the drain electrode 915 can be lowered.

In the case where an In—Ga—Zn-based oxide is used for the oxide semiconductor layer 913, an oxide semiconductor in the high-concentration regions 918 has a wurtzite crystal structure by heat treatment at approximately higher than or equal to 300° C. and lower than or equal to 600° C. after the addition of nitrogen. When the oxide semiconductor in the high-concentration regions 918 has a wurtzite crystal structure, the conductivity of the high-concentration regions 918 can be further increased and the resistance between the source electrode 914 and the drain electrode 915 can be further lowered. Note that in order to effectively lower the resistance between the source electrode 914 and the drain electrode 915 by formation of an oxide semiconductor with a wurtzite crystal structure, the concentration of nitrogen atoms in the high-concentration region 918 is preferably $1\times10^{20}/cm^3$ or higher and 7 at. % or lower in the case where nitrogen is used as the dopant. Even in the case where the concentration of nitrogen atoms is lower than the above range, an oxide semiconductor with a wurtzite crystal structure can be obtained in some cases.

Alternatively, the oxide semiconductor layer 913 may be formed using a CAAC-OS. In the case where the oxide semiconductor layer 913 is formed using a CAAC-OS, the conductivity of the oxide semiconductor layer 913 can be increased as compared to the case where an amorphous semiconductor is used. Thus, the resistance between the source electrode 914 and the drain electrode 915 can be lowered.

When the resistance between the source electrode 914 and the drain electrode 915 is lowered, high on-state current and high-speed operation can be secured even when the transistor 911 is miniaturized. In addition, by miniaturization of the transistor 911, the area of a semiconductor device including the transistor can be reduced, so that the number of transistors per unit area can be increased.

Figure 11C:
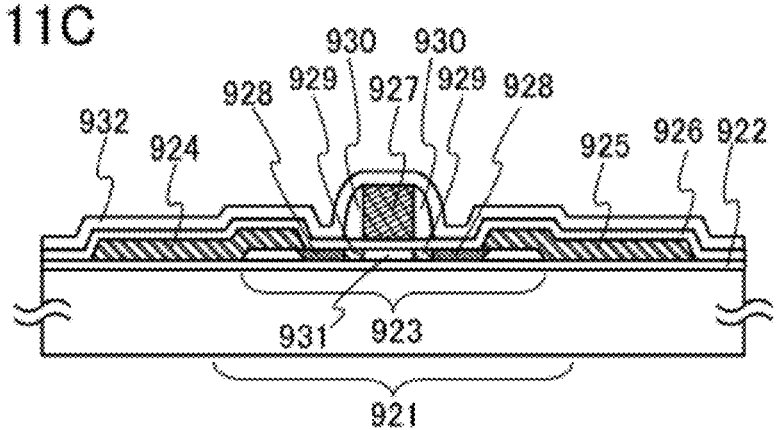

A transistor 921 illustrated in FIG. 11C includes an oxide semiconductor layer 923 that is formed over a base film 922 and functions as an active layer; a source electrode 924 and a drain electrode 925 that are formed over the oxide semiconductor layer 923; a gate insulating film 926 that is formed over the oxide semiconductor layer 923, the source electrode 924, and the drain electrode 925; a gate electrode 927 that overlaps with the oxide semiconductor layer 923 over the gate insulating film 926; and a protective insulating film 932 that covers the oxide semiconductor layer 923 over the gate electrode 927. The transistor 921 further includes sidewalls 930 that are provided at ends of the gate electrode 927 and are formed using an insulating film.

The transistor 921 illustrated in FIG. 11C is a top-gate transistor in which the gate electrode 927 is formed over the oxide semiconductor layer 923 and is also a top-contact transistor in which the source electrode 924 and the drain electrode 925 are formed over the oxide semiconductor layer 923. As in the transistor 901, in the transistor 921, the source electrode 924 and the drain electrode 925 do not overlap with the gate electrode 927. Thus, parasitic capacitance formed between the source electrode 924 and the gate electrode 927 and between the drain electrode 925 and the gate electrode 927 can be reduced. Consequently, high-speed operation can be performed.

The oxide semiconductor layer 923 includes a pair of high-concentration regions 928 and a pair of low-concentration regions 929 that can be obtained by addition of a dopant imparting n-type conductivity to the oxide semiconductor layer 923 after the formation of the gate electrode 927. In addition, in the oxide semiconductor layer 923, a region that overlaps with the gate electrode 927 with the gate insulating film 926 provided therebetween is a channel formation region 931. The oxide semiconductor layer 923 includes the pair of low-concentration regions 929 between the pair of high-concentration regions 928 and the channel formation region 931 between the pair of low-concentration regions 929. Further, the pair of low-concentration regions 929 is provided in a region of the oxide semiconductor layer 923 that overlaps with the sidewalls 930 with the gate insulating film 926 provided therebetween.

The pair of high-concentration regions 928 and the pair of low-concentration regions 929 can be formed by ion implantation as in the high-concentration regions 908 of the transistor 901. The high-concentration regions 908 can be referred to for the kind of a dopant used for the formation of the high-concentration regions 928.

For example, in the case where nitrogen is used as the dopant, the concentration of nitrogen atoms in the high-concentration region 928 is preferably $5 \times 10^{19}/cm^3$ or higher and $1 \times 10^{22}/cm^3$ or lower. Further, for example, in the case where nitrogen is used as the dopant, the concentration of nitrogen atoms in the low-concentration region 929 is preferably $5 \times 10^{18}/cm^3$ or higher and lower than $5 \times 10^{19}/cm^3$.

The high-concentration region 928 to which the dopant imparting n-type conductivity is added has higher conductivity than other regions in the oxide semiconductor layer 923. Thus, with provision of the high-concentration regions 928 in the oxide semiconductor layer 923, resistance between the source electrode 924 and the drain electrode 925 can be lowered. Further, with provision of the low-concentration region 929 between the channel formation region 931 and the high-concentration region 928, a negative shift in threshold voltage due to a short channel effect can be reduced.

In the case where an In—Ga—Zn-based oxide is used for the oxide semiconductor layer 923, an oxide semiconductor in the high-concentration regions 928 has a wurtzite crystal structure by heat treatment at approximately higher than or equal to 300° C. and lower than or equal to 600° C. after the addition of nitrogen. Further, depending on the concentration of nitrogen, the low-concentration region 929 has a wurtzite crystal structure in some cases. When the oxide semiconductor in the high-concentration regions 928 has a wurtzite crystal structure, the conductivity of the high-concentration regions 928 can be further increased and the resistance between the source electrode 924 and the drain electrode 925 can be further lowered. Note that in order to effectively lower the resistance between the source electrode 924 and the drain electrode 925 by formation of an oxide semiconductor with a wurtzite crystal structure, the concentration of nitrogen atoms in the high-concentration region 928 is preferably $1 \times 10^{20}/cm^3$ or higher and 7 at. % or lower in the case where nitrogen is used as the dopant. Even in the case where the concentration of nitrogen atoms is lower than the above range, an oxide semiconductor with a wurtzite crystal structure can be obtained in some cases.

Alternatively, the oxide semiconductor layer 923 may be formed using a CAAC-OS. In the case where the oxide semiconductor layer 923 is formed using a CAAC-OS, the conductivity of the oxide semiconductor layer 923 can be increased as compared to the case where an amorphous semiconductor is used. Thus, the resistance between the source electrode 924 and the drain electrode 925 can be lowered.

When the resistance between the source electrode 924 and the drain electrode 925 is lowered, high on-state current and high-speed operation can be secured even when the transistor 921 is miniaturized. In addition, by miniaturization of the transistor 921, the area of a semiconductor device including the transistor can be reduced, so that the number of transistors per unit area can be increased.

Figure 11D:
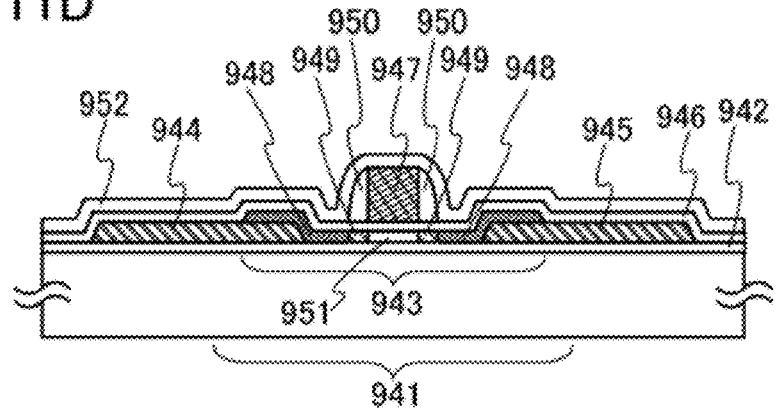

A transistor 941 illustrated in FIG. 11D includes a source electrode 944 and a drain electrode 945 that are formed over a base film 942; an oxide semiconductor layer 943 that is formed over the source electrode 944 and the drain electrode 945 and functions as an active layer; a gate insulating film 946 that is formed over the oxide semiconductor layer 943, the source electrode 944, and the drain electrode 945; a gate electrode 947 that overlaps with the oxide semiconductor layer 943 over the gate insulating film 946; and a protective insulating film 952 that covers the oxide semiconductor layer 943 over the gate electrode 947. The transistor 941 further includes sidewalls 950 that are provided at ends of the gate electrode 947 and are formed using an insulating film.

The transistor 941 illustrated in FIG. 11D is a top-gate transistor in which the gate electrode 947 is formed over the oxide semiconductor layer 943 and is also a bottom-contact transistor in which the source electrode 944 and the drain electrode 945 are formed below the oxide semiconductor layer 943. As in the transistor 901, in the transistor 941, the source electrode 944 and the drain electrode 945 do not overlap with the gate electrode 947. Thus, parasitic capacitance formed between the source electrode 944 and the gate electrode 947 and between the drain electrode 945 and the gate electrode 947 can be reduced. Consequently, high-speed operation can be performed.

The oxide semiconductor layer 943 includes a pair of high-concentration regions 948 and a pair of low-concentration regions 949 that can be obtained by addition of a dopant imparting n-type conductivity to the oxide semiconductor layer 943 after the formation of the gate electrode 947. In addition, in the oxide semiconductor layer 943, a region that overlaps with the gate electrode 947 with the gate insulating film 946 provided therebetween is a channel formation region 951. The oxide semiconductor layer 943 includes the pair of low-concentration regions 949 between the pair of high-concentration regions 948 and the channel formation region 951 between the pair of low-concentration regions 949. Further, the pair of low-concentration regions 949 is provided in a region of the oxide semiconductor layer 943 that overlaps with the sidewalls 950 with the gate insulating film 946 provided therebetween.

The pair of high-concentration regions 948 and the pair of low-concentration regions 949 can be formed by ion implantation as in the high-concentration regions 908 of the transistor 901. The high-concentration regions 908 can be referred to for the kind of a dopant used for the formation of the high-concentration regions 948.

For example, in the case where nitrogen is used as the dopant, the concentration of nitrogen atoms in the high-concentration region 948 is preferably $5\times10^{19}/\text{cm}^3$ or higher and $1\times10^{22}/\text{cm}^3$ or lower. Further, for example, in the case where nitrogen is used as the dopant, the concentration of nitrogen atoms in the low-concentration region 949 is preferably $5\times10^{18}/\text{cm}^3$ or higher and lower than $5\times10^{19}/\text{cm}^3$.

The high-concentration region 948 to which the dopant imparting n-type conductivity is added has higher conductivity than other regions in the oxide semiconductor layer 943. Thus, with provision of the high-concentration regions 948 in the oxide semiconductor layer 943, resistance between the source electrode 944 and the drain electrode 945 can be lowered. Further, with provision of the low-concentration region 949 between the channel formation region 951 and the high-concentration region 948, a negative shift in threshold voltage due to a short channel effect can be reduced.

In the case where an In—Ga—Zn-based oxide is used for the oxide semiconductor layer 943, an oxide semiconductor in the high-concentration regions 948 has a wurtzite crystal structure by heat treatment at approximately higher than or equal to 300° C. and lower than or equal to 600° C. after the addition of nitrogen. Further, depending on the concentration of nitrogen, the low-concentration region 949 has a wurtzite crystal structure in some cases. When the oxide semiconductor in the high-concentration regions 948 has a wurtzite crystal structure, the conductivity of the high-concentration regions 948 can be further increased and the resistance between the source electrode 944 and the drain electrode 945 can be further lowered. Note that in order to effectively lower the resistance between the source electrode 944 and the drain electrode 945 by formation of an oxide semiconductor with a wurtzite crystal structure, the concentration of nitrogen atoms in the high-concentration region 948 is preferably $1\times10^{20}/\text{cm}^3$ or higher and 7 at. % or lower in the case where nitrogen is used as the dopant. Even in the case where the concentration of nitrogen atoms is lower than the above range, an oxide semiconductor with a wurtzite crystal structure can be obtained in some cases.

Alternatively, the oxide semiconductor layer 943 may be formed using a CAAC-OS. In the case where the oxide semiconductor layer 943 is formed using a CAAC-OS, the conductivity of the oxide semiconductor layer 943 can be increased as compared to the case where an amorphous semiconductor is used. Thus, the resistance between the source electrode 944 and the drain electrode 945 can be lowered.

When the resistance between the source electrode 944 and the drain electrode 945 is lowered, high on-state current and high-speed operation can be secured even when the transistor 941 is miniaturized. In addition, by miniaturization of the transistor 941, the area of a semiconductor device including the transistor can be reduced, so that the number of transistors per unit area can be increased.

Note that as one of methods for forming a high-concentration region functioning as a source region or a drain region in a transistor including an oxide semiconductor through a self-aligning process, a method has been disclosed by which a surface of an oxide semiconductor layer is exposed, argon plasma treatment is performed, and the resistance of a region in the oxide semiconductor layer that is exposed to plasma is lowered (S. Jeon et al., "180 nm Gate Length Amorphous InGaZnO Thin Film Transistor for High Density Image Sensor Applications", IEDM Tech. Dig., pp. 504-507, 2010).

However, in the manufacturing method, it is necessary to remove a gate insulating film partly so that a region serving as a source region or a drain region is exposed after the formation of the gate insulating film. Thus, when the gate insulating film is removed, the oxide semiconductor layer that is the lower layer is over etched partly, so that the thickness of the region serving as the source region or the drain region is decreased. Consequently, the resistance of the source region or the drain region is increased and defects in characteristics of the transistor due to over etching easily occur.

In order to miniaturize the transistor, it is necessary to employ dry etching, which has high processing accuracy. The over etching particularly occurs easily in the case where dry etching, which cannot secure selective etching of the gate insulating film with respect to the oxide semiconductor layer sufficiently.

For example, over etching does not matter when the oxide semiconductor layer has sufficient large thickness. However, in the case where the channel length is 200 nm or less, it is necessary that the thickness of a region in the oxide semiconductor layer that serves as a channel formation region be 20 nm or less, preferably 10 nm or less in order to prevent a short channel effect. In the case where such a thin oxide semiconductor layer is used, the over etching of the oxide semiconductor layer is unfavorable because the resistance of the source region or the drain region is increased and defects in characteristics of the transistor occur as described above.

However, when a dopant is added to the oxide semiconductor layer while the oxide semiconductor layer is not exposed and the gate insulating film is left as in one embodiment of the present invention, the over etching of the oxide semiconductor layer can be prevented and excessive damage to the oxide semiconductor layer can be reduced. Further, an interface between the oxide semiconductor layer and the gate insulating film is kept clean. Thus, the characteristics and reliability of the transistor can be improved.

A base film or a protective insulating film positioned below the semiconductor layer is preferably formed using a material that has a high barrier property against an alkali metal, hydrogen, and oxygen. For example, as the insulating film having a high barrier property, a silicon nitride film, a silicon nitride oxide film, an aluminum nitride film, an aluminum oxide film, an aluminum oxynitride film, an aluminum nitride oxide film, or the like can be used. As the base film and the protective insulating film, a single layer or a stack of layers of the insulating film having a high barrier property, or a stack of layers of the insulating film having a high barrier property and the insulating film having a low barrier property may be used.

Covering the oxide semiconductor layer with an insulating film having a high barrier property can prevent entry of impurities from the outside and oxygen from releasing from the oxide semiconductor layer. Therefore, reliability of the transistor can be improved.

This embodiment can be combined with any of the above embodiments as appropriate.

(Embodiment 7)

A signal processing unit according to one embodiment of the present invention is used, so that a highly reliable electronic device and a low-power electronic device can be provided. In particular, in the case where a portable electronic device that has difficulty in continuously receiving power, an advantage of an increase in continuous operating time can be obtained when a low-power signal processing unit according to one embodiment of the present invention is added as a component of the device.

The signal processing unit according to one embodiment of the present invention can be used for display devices, personal computers, or image reproducing devices provided with recording media (typically, devices which reproduce the content of recording media such as digital versatile discs (DVDs) and have displays for displaying the reproduced images).

Further, as an electronic device which can include the signal processing unit according to one embodiment of the present invention, cellular phones, portable game machines, personal digital assistants, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. The specific examples of these electric devices are illustrated in FIGS. 12A to 12F.

Figure 12A:
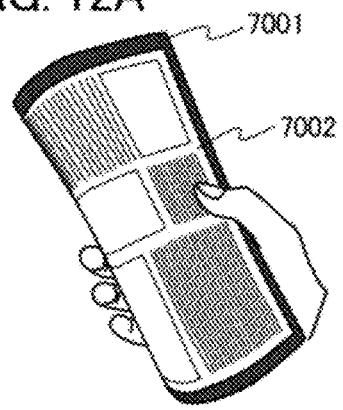
FIGS. 12A to 12F are views each illustrating a structure of an electronic device.

FIG. 12A illustrates an e-book reader including a housing 7001, a display portion 7002, and the like. The signal processing unit according to one embodiment of the present invention can be used for an integrated circuit used for controlling driving of the e-book reader. With use of the signal processing unit according to one embodiment of the present invention for the integrated circuit for controlling driving of the e-book reader, the e-book reader can reduce power consumption. When a flexible substrate is used, the signal processing unit can have flexibility, whereby a user-friendly e-book reader that is flexible and lightweight can be provided.

Figure 12B:
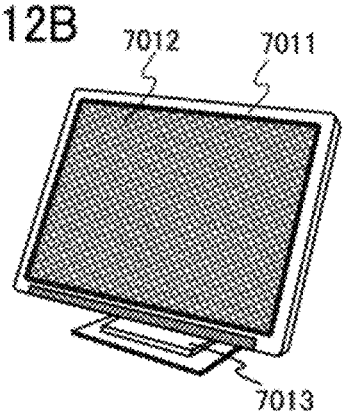

FIG. 12B illustrates a display device including a housing 7011, a display portion 7012, a support 7013, and the like. The signal processing unit according to one embodiment of the present invention can be used for an integrated circuit used for controlling driving of the display device. With use of the signal processing unit according to one embodiment of the present invention for the integrated circuit for controlling driving of the display device, the display device can reduce power consumption. Note that a display device includes all display devices for displaying information, such as display devices for personal computers, for receiving television broadcast, and for displaying advertisement, in its category.

Figure 12C:
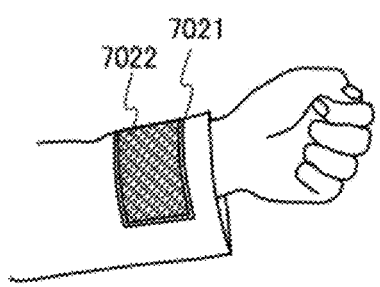

FIG. 12C illustrates a display device including a housing 7021, a display portion 7022, and the like. The signal processing unit according to one embodiment of the present invention can be used for an integrated circuit used for controlling driving of the display device. With use of the signal processing unit according to one embodiment of the present invention for the integrated circuit for controlling driving of the display device, the display device can reduce power consumption. Moreover, with the use of a flexible substrate, the signal processing unit can have flexibility. Thus, a user-friendly display device that is flexible and lightweight can be provided. Accordingly, as illustrated in FIG. 12C, the display device can be used while being fixed to fabric or the like, and an application range of the display device is markedly widened.

Figure 12D:
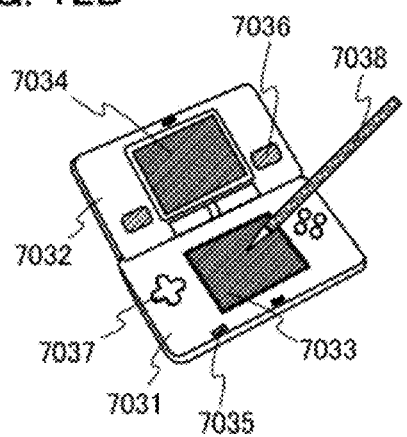

FIG. 12D illustrates a portable game machine including a housing 7031, a housing 7032, a display portion 7033, a display portion 7034, a microphone 7035, a speaker 7036, an operation key 7037, a stylus 7038, and the like. The signal processing unit according to one embodiment of the present invention can be used for an integrated circuit used for controlling driving of the portable game machine. With use of the signal processing unit according to one embodiment of the present invention for the integrated circuit for controlling driving of the portable game machine, the portable game machine with low power consumption can be provided. Although the portable game machine illustrated in FIG. 12D includes the two display portions 7033 and 7034, the number of display portions included in the portable game machine is not limited to two.

Figure 12E:
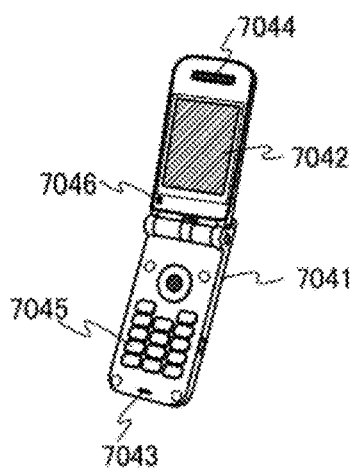

FIG. 12E illustrates a mobile phone including a housing 7041, a display portion 7042, an audio input portion 7043, an audio output portion 7044, operation keys 7045, a light-receiving portion 7046, and the like. Light received in the light-receiving portion 7046 is converted into electrical signals, whereby external images can be loaded. The signal processing unit according to one embodiment of the present invention can be used for an integrated circuit used for controlling driving of the mobile phone. With use of the signal processing unit according to one embodiment of the present invention for the integrated circuit for controlling driving of the mobile phone, the mobile phone can reduce power consumption.

Figure 12F:
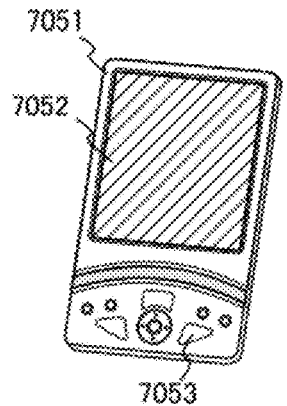

FIG. 12F illustrates a portable information terminal including a housing 7051, a display portion 7052, operation keys 7053, and the like. In the portable information terminal illustrated in FIG. 12F, a modem may be incorporated in the housing 7051. The signal processing unit according to one embodiment of the present invention can be used for an integrated circuit used for controlling driving of the portable information terminal With use of the signal processing unit according to one embodiment of the present invention for the integrated circuit for controlling driving of the portable information terminal, a portable information terminal can reduce power consumption.

This embodiment can be combined with any of the above embodiments as appropriate.

(Embodiment 8)

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the mobility on the assumption that no defect exists inside the semiconductor can be calculated theoretically.

Assuming that the original mobility (Hall mobility) of a semiconductor and the measured field-effect mobility are $\mu_0$ and $\mu$, respectively, and a potential barrier (e.g., a grain boundary) exists in the semiconductor, the measured field-effect mobility can be expressed as the following formula.

$$\mu = \mu_0 \exp\left(-\frac{E}{kT}\right) \qquad \text{[FORMULA 2]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \qquad \text{[FORMULA 3]}$$

Here, e represents the elementary charge, N represents the average defect density per unit area in a channel, c represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W\mu V_g V_d C_{ox}}{L} \exp\left(-\frac{E}{kT}\right) \quad \text{[FORMULA 4]}$$

Here, L represents the channel length and W represents the channel width, and L and W are each 10 µm in this case. In addition, $V_d$ represents the drain voltage. When dividing both sides of the above equation by $V_g$ and then taking logarithms of both sides, the following formula can be obtained.

$$\ln\left(\frac{I_d}{V_g}\right) = \quad \text{[FORMULA 5]}$$
$$\ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g}$$

The right side of Formula 5 is a function of $V_g$. From the formula, it is found that the defect density N can be obtained from the slope of a line in which $\ln(I_d/V_g)$ is the ordinate and $1/V_g$ is the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1\times10^{12}/cm^2$.

Based on the defect density obtained in this manner, or the like, $\mu_0$ is calculated to be 120 cm$^2$/Vs from Formula 2 and Formula 3. The measured mobility of an In—Sn—Zn oxide including a defect is approximately 35 cm$^2$/Vs. However, assuming that no defect exists inside the semiconductor and at the interface between the semiconductor and an insulating film, the mobility $\mu_0$ of the oxide semiconductor can be expected to be 120 cm$^2$/Vs.

Note that even when no defect exists inside a semiconductor, scattering at an interface between the channel and a gate insulating film affects the transport property of the transistor. In other words, the field-effect mobility $\mu_1$ at a position that is distance x away from the interface between the channel and the gate insulating film can be expressed as the following formula.

$$\frac{1}{\mu_1} = \frac{1}{\mu_0} + \frac{D}{B}\exp\left(-\frac{x}{G}\right) \quad \text{[FORMULA 6]}$$

Here, D represents the electric field in the gate direction, and B and G are constants. B and G can be obtained from actual measurement results; according to the above measurement results, B is $4.75\times10^7$ cm/s and G is 10 nm (the depth to which interface scattering reaches). When D is increased (i.e., when the gate voltage is increased), the second term of Formula 6 is increased and accordingly the field-effect mobility $\mu_1$ is decreased.

Figure 16:
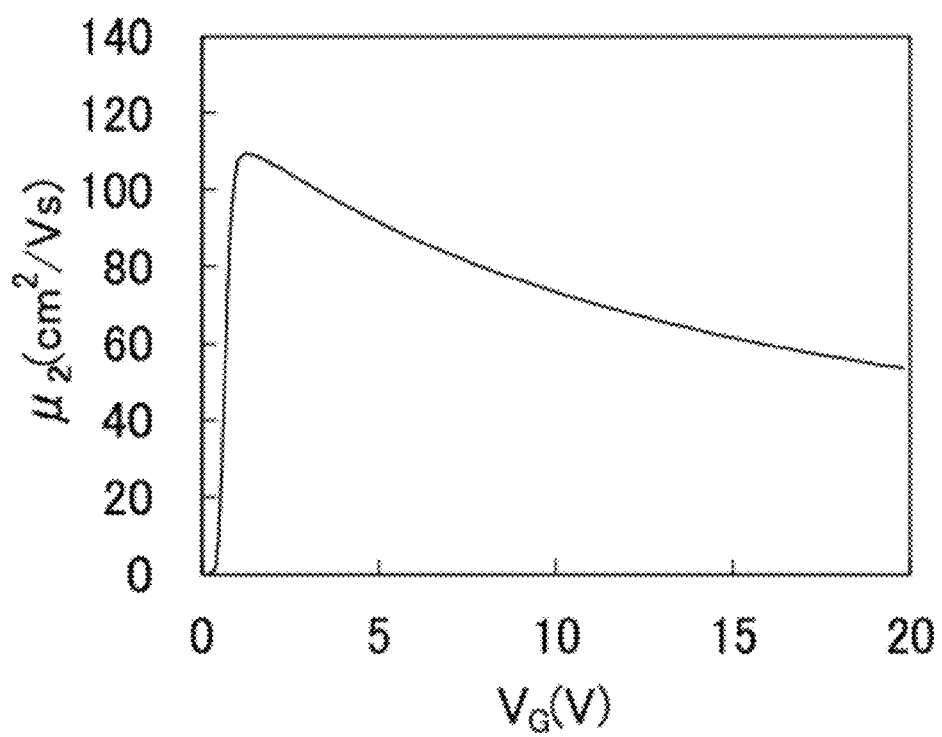
FIG. 16 is a graph showing gate voltage dependence of mobility obtained by calculation.

Calculation results of the field-effect mobility $\mu_2$ of a transistor whose channel includes an ideal oxide semiconductor without a defect inside the semiconductor are shown in FIG. 16. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by sputtering.

Further, the work functions of a gate, a source, and a drain were assumed to be 5.5 eV, 4.6 eV, and 4.6 eV, respectively.

The thickness of a gate insulating film was assumed to be 100 nm, and the relative permittivity thereof was assumed to be 4.1. The channel length and the channel width were each assumed to be 10 µm, and the drain voltage $V_d$ was assumed to be 0.1 V.

As shown in FIG. 16, the mobility has a peak of 100 cm$^2$/Vs or higher at a gate voltage that is a little over 1 V and is decreased as the gate voltage becomes higher because interface scattering is increased. Note that in order to reduce the interface scattering, it is preferable that a surface of the semiconductor layer be flat at the atomic level (atomic layer flatness).

Calculation results of characteristics of minute transistors that are manufactured using an oxide semiconductor having such mobility are shown in FIGS. 17A to 17C, FIGS. 18A to 18C, and FIGS. 19A to 19C. FIGS. 20A and 20B illustrate cross-sectional structures of the transistors used for the calculation. The transistors illustrated in FIGS. 20A and 20B each include a semiconductor region 1003a and a semiconductor region 1003c that have n$^+$-type conductivity in an oxide semiconductor layer. The resistivities of the semiconductor region 1003a and the semiconductor region 1003c are $2\times10^{-3}$ Ωcm.

The transistor illustrated in FIG. 20A is formed over a base film 1001 and an embedded insulator 1002 which is embedded in the base film 1001 and formed of aluminum oxide. The transistor includes the semiconductor region 1003a, the semiconductor region 1003c, an intrinsic semiconductor region 1003b serving as a channel formation region therebetween, and a gate 1005. The width of the gate 1005 is 33 nm.

A gate insulating film 1004 is formed between the gate 1005 and the semiconductor region 1003b. In addition, a sidewall 1006a and a sidewall 1006b are formed on both side surfaces of the gate 1005, and an insulator 1007 is formed over the gate 1005 to prevent a short circuit between the gate 1005 and another wiring. The width of the sidewall is 5 nm. A source 1008a and a drain 1008b are provided in contact with the semiconductor region 1003a and the semiconductor region 1003c, respectively. Note that the channel width of this transistor is 40 nm.

The transistor of FIG. 20B is the same as the transistor of FIG. 20A in that it is formed over the base film 1001 and the embedded insulator 1002 formed of aluminum oxide and that it includes the semiconductor region 1003a, the semiconductor region 1003c, the intrinsic semiconductor region 1003b provided therebetween, the gate 1005 having a width of 33 nm, the gate insulating film 1004, the sidewall 1006a, the sidewall 1006b, the insulator 1007, the source 1008a, and the drain 1008b.

The transistor illustrated in FIG. 20A is different from the transistor illustrated in FIG. 20B in the conductivity type of semiconductor regions under the sidewall 1006a and the sidewall 1006b. In the transistor illustrated in FIG. 20A, the semiconductor regions under the sidewall 1006a and the sidewall 1006b are part of the semiconductor region 1003a having n$^+$-type conductivity and part of the semiconductor region 1003c having n$^+$-type conductivity, whereas in the transistor illustrated in FIG. 20B, the semiconductor regions under the sidewall 1006a and the sidewall 1006b are part of the intrinsic semiconductor region 1003b. In other words, a region having a width of $L_{off}$ which overlaps with neither the semiconductor region 1003a (the semiconductor region 1003c) nor the gate 1005 is provided. This region is called an offset region, and the width $L_{off}$ is called an offset length. As is seen from the drawing, the offset length is equal to the width of the sidewall 1006a (the sidewall 1006b).

Figure 17A:
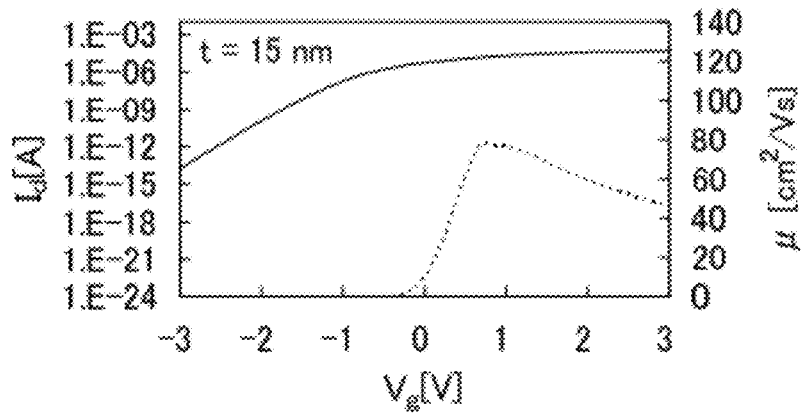
FIGS. 17A to 17C are graphs each showing gate voltage dependence of drain current and mobility, which is obtained by calculation.
Figure 17B:
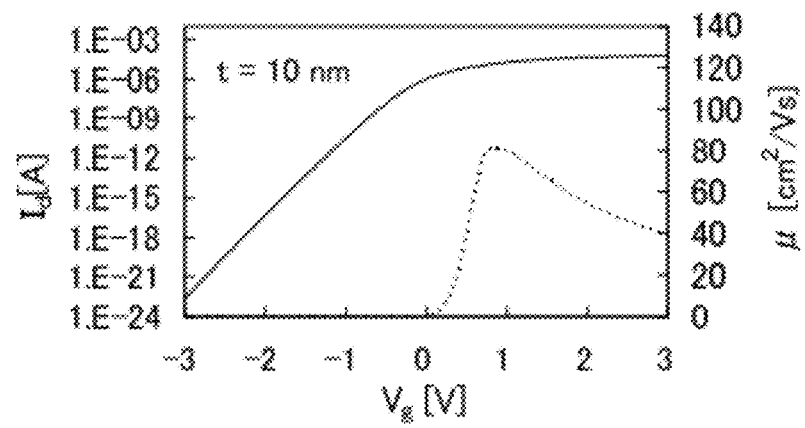
Figure 17C:
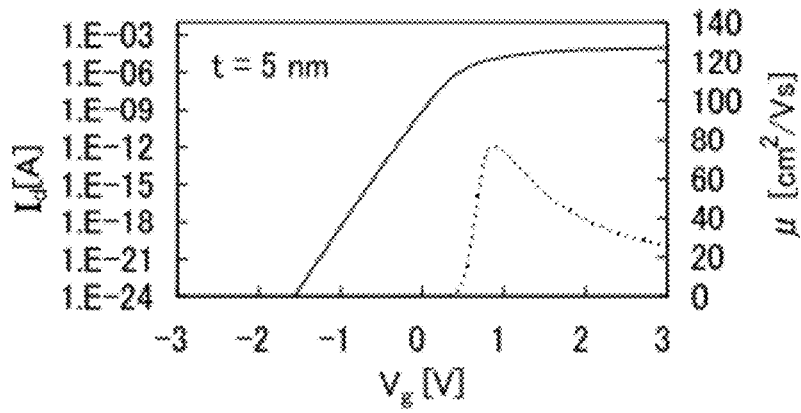

The other parameters used in calculation are as described above. For the calculation, device simulation software Sentaurus Device manufactured by Synopsys, Inc. was used. FIGS. 17A to 17C show the gate voltage ($V_g$: a potential difference between the gate and the source) dependence of the drain current ($I_d$, a solid line) and the field-effect mobility ($\mu$, a dotted line) of the transistor having the structure illustrated in FIG. 20A. The drain current $I_d$ is obtained by calculation under the assumption that the drain voltage (a potential difference between the drain and the source) is +1 V and the field-effect mobility $\mu$ is obtained by calculation under the assumption that the drain voltage is +0.1 V.

FIG. 17A shows the gate voltage dependence of the transistor in the case where the thickness of the gate insulating film is 15 nm, FIG. 17B shows that of the transistor in the case where the thickness of the gate insulating film is 10 nm, and FIG. 17C shows that of the transistor in the case where the thickness of the gate insulating film is 5 nm. As the gate insulating film is thinner, the drain current $I_d$ (off-state current) particularly in an off state is significantly decreased. In contrast, there is no noticeable change in the peak value of the field-effect mobility $\mu$ and the drain current $I_d$ in an on state (on-state current). The graphs show that the drain current exceeds 10 μA, which is required in a memory element and the like, at a gate voltage of around 1 V.

Figure 18A:
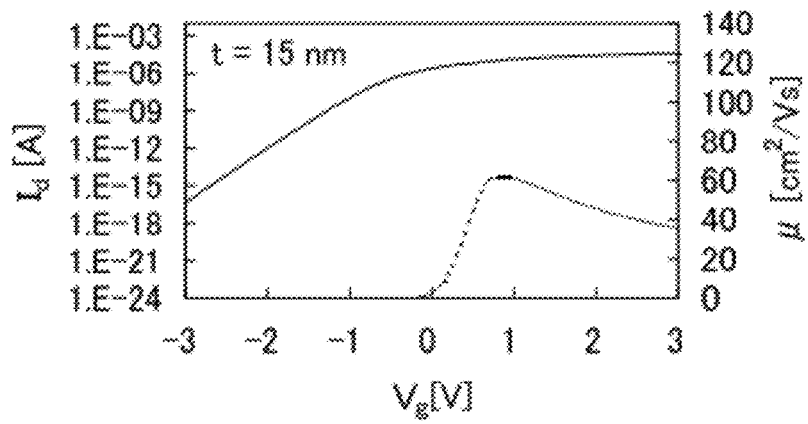
FIGS. 18A to 18C are graphs each showing gate voltage dependence of drain current and mobility, which is obtained by calculation.
Figure 18B:
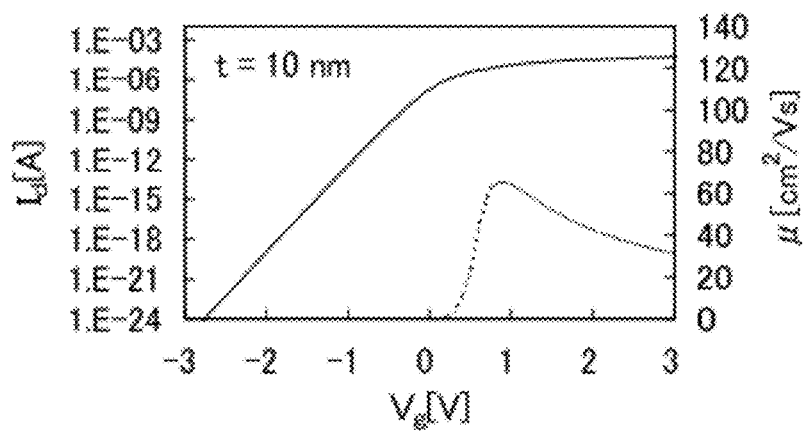
Figure 18C:
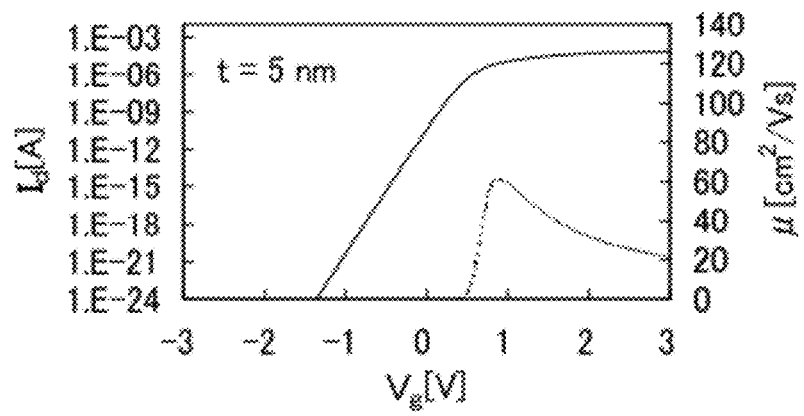

FIGS. 18A to 18C show the gate voltage $V_g$ dependence of the drain current $I_d$ (a solid line) and the field-effect mobility $\mu$ (a dotted line) of the transistor having the structure illustrated in FIG. 20B where the offset length $L_{off}$ is 5 nm. The drain current $I_d$ is obtained by calculation under the assumption that the drain voltage is +1 V and the field-effect mobility $\mu$ is obtained by calculation under the assumption that the drain voltage is +0.1 V. FIG. 18A shows the gate voltage dependence of the transistor in the case where the thickness of the gate insulating film is 15 nm, FIG. 18B shows that of the transistor in the case where the thickness of the gate insulating film is 10 nm, and FIG. 18C shows that of the transistor in the case where the thickness of the gate insulating film is 5 nm.

Figure 19A:
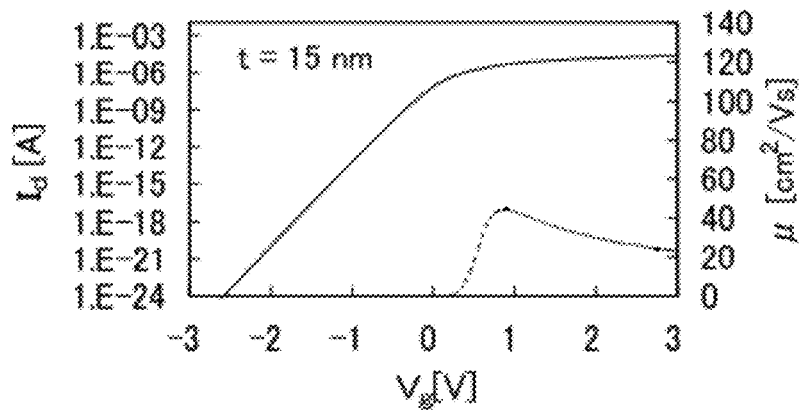
FIGS. 19A to 19C are graphs each showing gate voltage dependence of drain current and mobility, which is obtained by calculation.
Figure 19B:
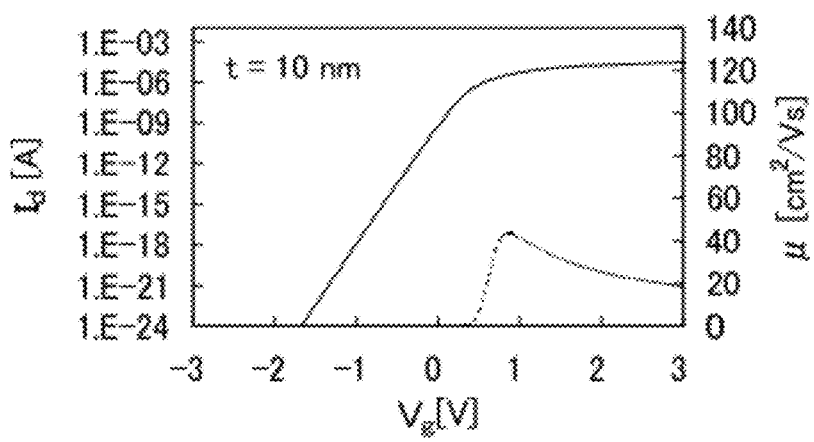
Figure 19C:
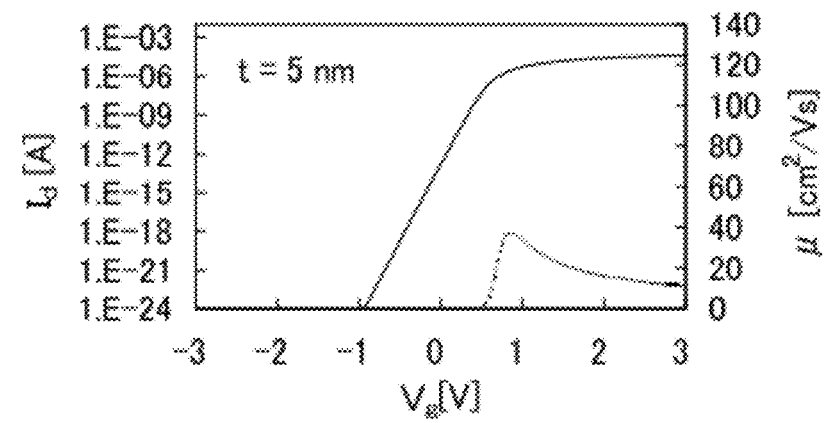

Further, FIGS. 19A to 19C show the gate voltage dependence of the drain current $I_d$ (a solid line) and the field-effect mobility $\mu$ (a dotted line) of the transistor having the structure illustrated in FIG. 20B where the offset length $L_{off}$ is 15 nm. The drain current $I_d$ is obtained by calculation under the assumption that the drain voltage is +1 V and the field-effect mobility $\mu$ is obtained by calculation under the assumption that the drain voltage is +0.1 V. FIG. 19A shows the gate voltage dependence of the transistor in the case where the thickness of the gate insulating film is 15 nm, FIG. 19B shows that of the transistor in the case where the thickness of the gate insulating film is 10 nm, and FIG. 19C shows that of the transistor in the case where the thickness of the gate insulating film is 5 nm.

In either of the structures, as the gate insulating film is thinner, the off-state current is significantly decreased, whereas no noticeable change arises in the peak value of the field-effect mobility $\mu$ and the on-state current.

Note that the peak of the field-effect mobility $\mu$ is approximately 80 cm$^2$/Vs in FIGS. 17A to 17C, approximately 60 cm$^2$/Vs in FIGS. 18A to 18C, and approximately 40 cm$^2$/Vs in FIGS. 19A to 19C; thus, the peak of the field-effect mobility $\mu$ is decreased as the offset length $L_{off}$ is increased. Further, the same applies to the off-state current. The on-state current is decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

This embodiment can be implemented in appropriate combination with any of the above embodiments.

(Embodiment 9)

A transistor in which an oxide semiconductor containing In, Sn, and Zn as its main component is used as a channel formation region can have favorable characteristics by depositing the oxide semiconductor while heating a substrate or by performing heat treatment after an oxide semiconductor film is formed. Note that a main component refers to an element contained in composition at 5 at. % or higher.

By intentionally heating the substrate after formation of the oxide semiconductor film containing In, Sn, and Zn as its main component, the field-effect mobility of the transistor can be improved. Further, the threshold voltage of the transistor can be positively shifted to obtain a state closer to a normally-off state.

Figure 21A:
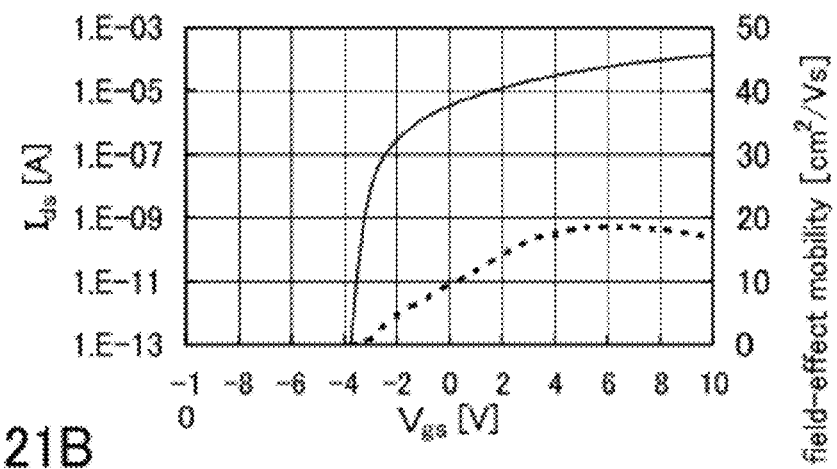
FIGS. 21A to 21C each show characteristics of a transistor including an oxide semiconductor film.
Figure 21B:
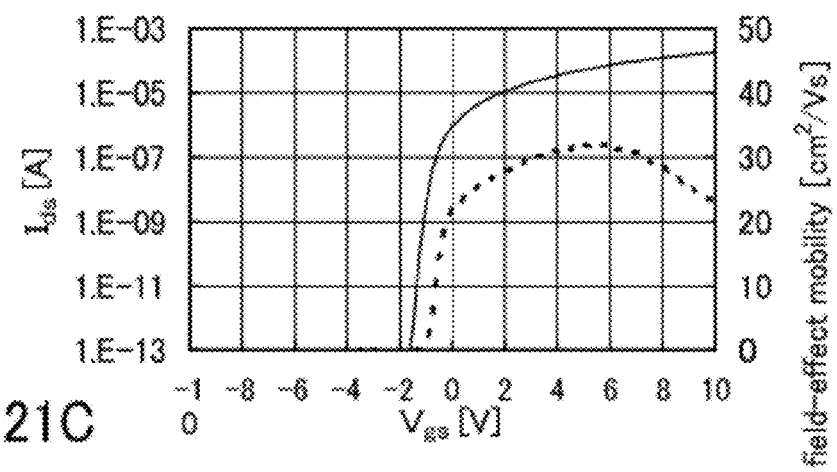
Figure 21C:
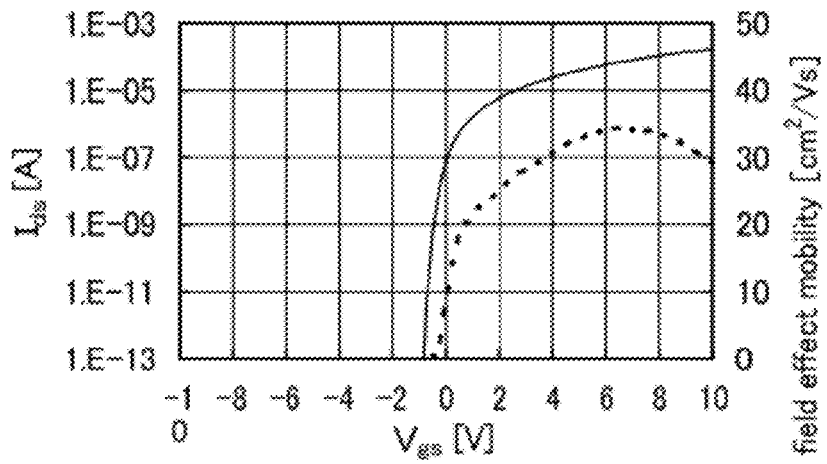

For example, FIGS. 21A to 21C each show characteristics of a transistor that uses an oxide semiconductor film containing In, Sn, and Zn as its main component and a gate insulating film with a thickness of 100 nm. The oxide semiconductor film had a channel length L of 3 μm and a channel width W of 10 μm. Note that $V_d$ was set to 10 V.

FIG. 21A shows characteristics of a transistor whose oxide semiconductor film containing In, Sn, and Zn as its main component was formed by sputtering without heating a substrate intentionally. The field-effect mobility of the transistor is 18.8 cm$^2$/Vs. On the other hand, when the oxide semiconductor film containing In, Sn, and Zn as its main component is formed while heating the substrate intentionally, the field-effect mobility can be improved. FIG. 21B shows characteristics of a transistor whose oxide semiconductor film containing In, Sn, and Zn as its main component was formed while heating a substrate at 200° C. The field-effect mobility of the transistor is 32.2 cm$^2$/Vs.

The field-effect mobility can be further improved by performing heat treatment after formation of the oxide semiconductor film containing In, Sn, and Zn as its main components. FIG. 21C shows characteristics of a transistor whose oxide semiconductor film containing In, Sn, and Zn as its main components was formed by sputtering at 200° C. and then subjected to heat treatment at 650° C. The field-effect mobility of the transistor is 34.5 cm$^2$/Vs.

The intentional heating of the substrate is expected to have an effect of reducing water taken into the oxide semiconductor film during the sputtering formation. Further, the heat treatment after film formation enables hydrogen, a hydroxyl group, water, or the like to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a highly purified non-single crystal oxide semiconductor, ideally, a field-effect mobility exceeding 100 cm$^2$/Vs is expected to be obtained.

The oxide semiconductor film containing In, Sn, and Zn as its main component may be crystallized in the following manner: oxygen ions are implanted into the oxide semiconductor film, hydrogen, a hydroxyl group, water, or the like included in the oxide semiconductor film is released by heat treatment, and the oxide semiconductor film is crystallized through the heat treatment or by another heat treatment performed later. By such crystallization treatment or recrystallization treatment, a non-single crystal oxide semiconductor film having favorable crystallinity can be obtained.

The intentional heating of the substrate during film formation and/or the heat treatment after the film formation contributes not only to improving field-effect mobility but also to obtaining a state closer to a normally-off state of the transistor. In a transistor in which an oxide semiconductor film that includes In, Sn, and Zn as its main component is used as a channel formation region and that is formed without heating a substrate intentionally, the threshold voltage tends to be shifted negatively. However, when the oxide semiconductor film formed while heating the substrate intentionally is used, the problem of the negative shift of the threshold voltage can be solved. That is, the threshold voltage is shifted to obtain a state closer to a normally-off state of the transistor; this tendency can be confirmed by comparison between FIGS. 21A and 21B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is higher than or equal to 150° C., preferably higher than or equal to 200° C., further preferably higher than or equal to 400° C. When film formation or heat treatment is performed at a high temperature, a state closer to a normally-off state of the transistor can be obtained.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_{ds}$ of 10 V. Then, the substrate temperature was set to 150° C. and $V_{ds}$ was set to 0.1 V. After that, 20 V of $V_{gs}$ was applied so that the intensity of an electric field applied to a gate insulating film was 2 MV/cm, and the condition was kept for one hour. Next, $V_{gs}$ was set to 0 V. Then, $V_{gs}$-$I_{ds}$ characteristics of the transistors were measured at a substrate temperature of 25° C. and $V_{ds}$ of 10 V. This process is called a positive BT test.

In a similar manner, first, $V_g$-$I_d$ characteristics of the transistors were measured at a substrate temperature of 25° C. and $V_{ds}$ of 10 V. Then, the substrate temperature was set to 150° C. and $V_{ds}$ was set to 0.1 V. After that, −20 V of $V_{gs}$ was applied so that the intensity of an electric field applied to the gate insulating film was −2 MV/cm, and the condition was kept for one hour. Next, $V_{gs}$ was set to 0 V. Then, $V_{gs}$-$I_{ds}$ characteristics of the transistors were measured at a substrate temperature of 25° C. and $V_{ds}$ of 10 V. This process is called a negative BT test.

Figure 22A:
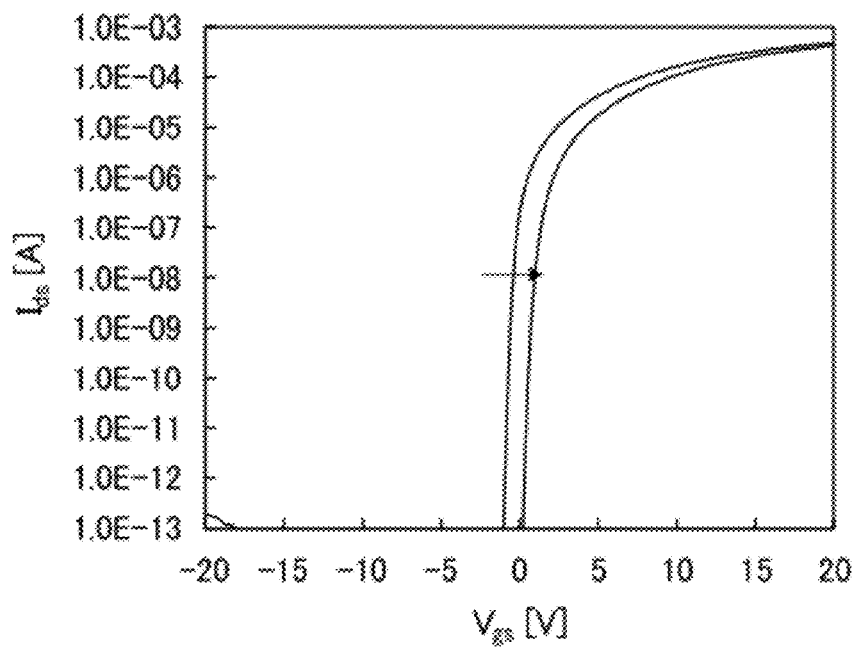
FIGS. 22A and 22B are graphs showing $V_{gs}$-$I_{ds}$ characteristics after a BT test of a transistor of Sample 1.
Figure 22B:
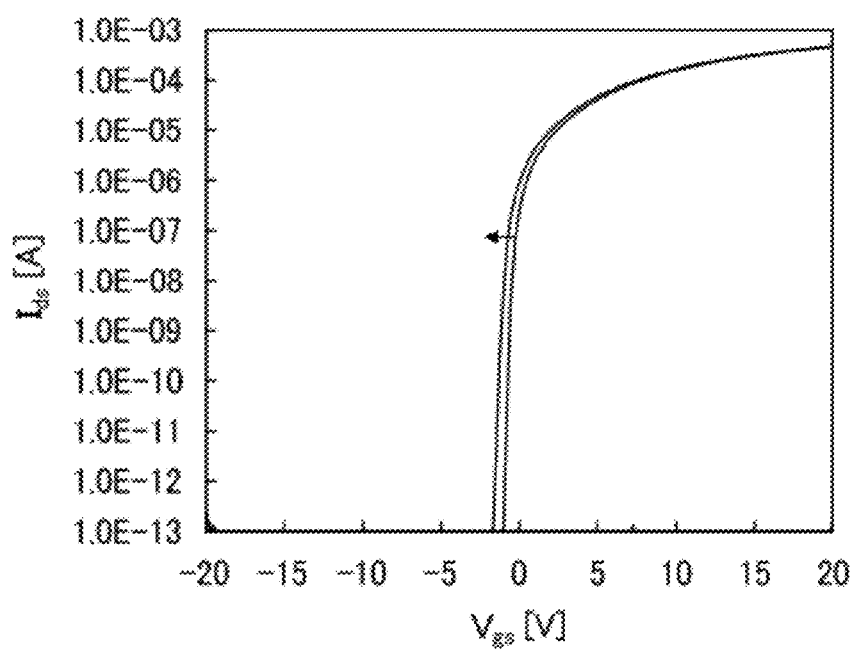
Figure 23A:
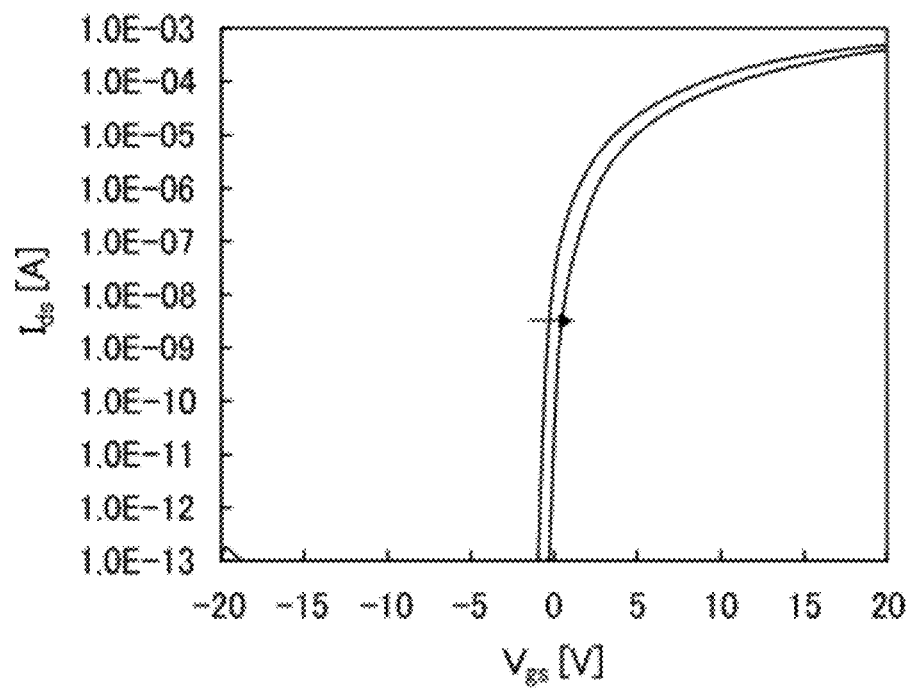
FIGS. 23A and 23B are graphs showing $V_{gs}$-$I_{ds}$ characteristics after a BT test of a transistor of Sample 2.
Figure 23B:
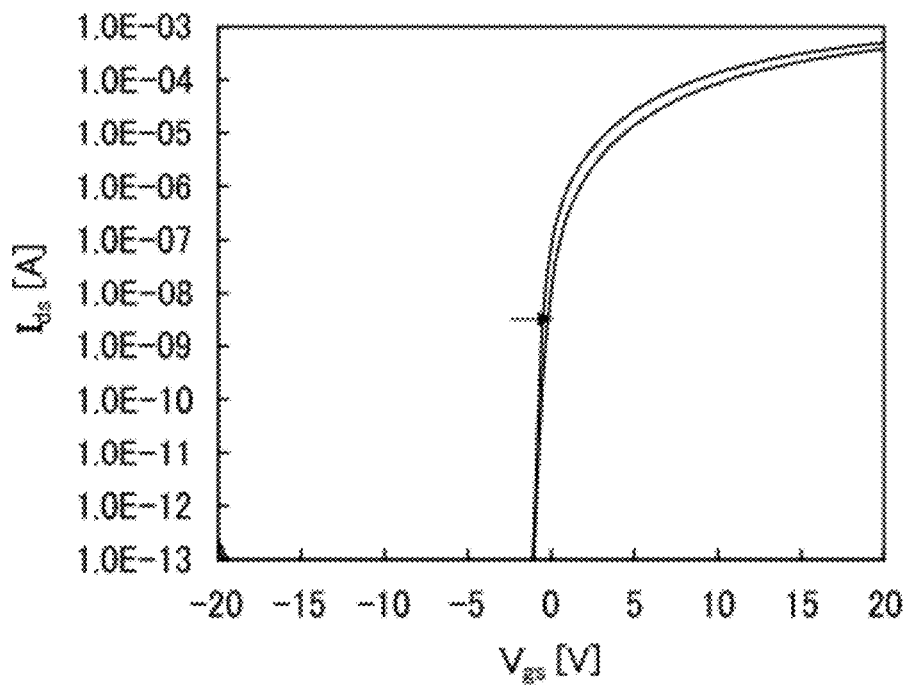

FIGS. 22A and 22B show a result of the positive BT test of Sample 1 and a result of the negative BT test of Sample 1, respectively. FIGS. 23A and 23B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability thereof is high.

The heat treatment can be performed in an oxygen atmosphere; alternatively, the heat treatment may be performed first in an atmosphere of an inert gas or nitrogen or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused at an interface between the oxide semiconductor and a film stacked over the oxide semiconductor; however, when excess oxygen is included in the oxide semiconductor film by the heat treatment, oxygen deficiency caused constantly can be compensated for with excess oxygen. The excess oxygen is oxygen existing mainly between lattices. When the concentration of excess oxygen is set to higher than or equal to $1\times10^{16}$ atoms/cm$^3$ and lower than or equal to $2\times10^{20}$ atoms/cm$^3$, excess oxygen can be included in the oxide semiconductor without causing crystal distortion or the like.

When heat treatment is performed so that a crystal is included at least in part of the oxide semiconductor, a more stable oxide semiconductor film can be obtained. For example, when an oxide semiconductor film which is formed by sputtering using a target having the composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn-based oxide was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B is described below.

An In—Sn—Zn-based oxide film with a thickness of 100 nm was formed over a quartz substrate that had been subjected to dehydrogenation treatment.

The In—Sn—Zn-based oxide film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set to 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 24:
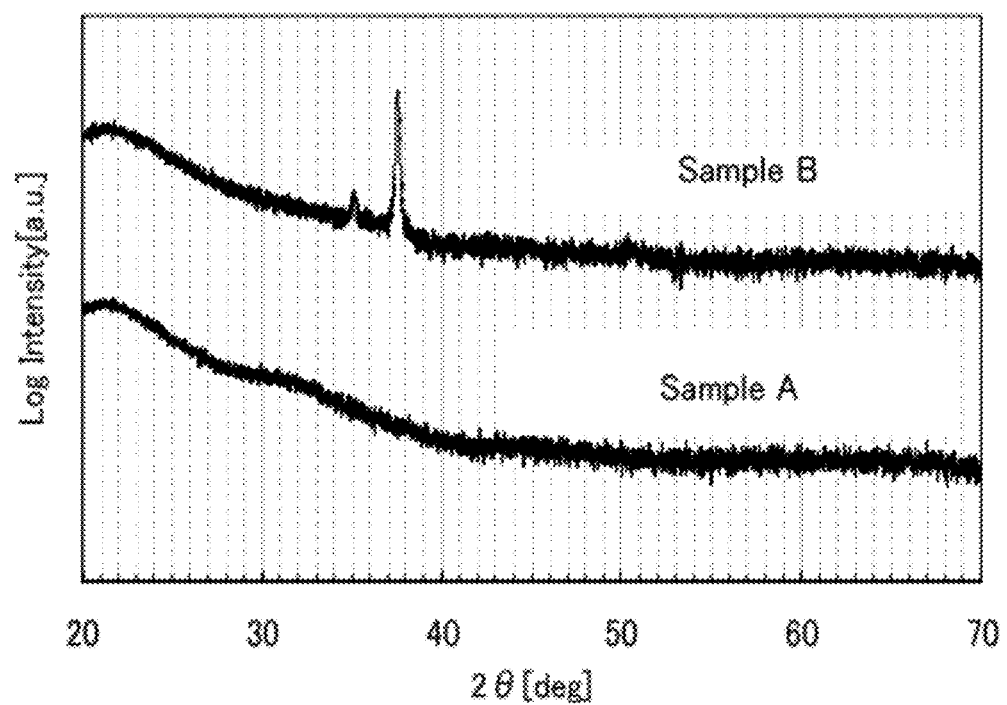
FIG. 24 is a graph showing XRD spectra of Sample A and Sample B.

FIG. 24 shows XRD spectra of Sample A and Sample B. No peak derived from crystal was observed in Sample A, whereas peaks derived from crystal were observed when 2θ was around 35 deg. and 37 deg. to 38 deg. in Sample B.

As described above, by intentionally heating a substrate during deposition of an oxide semiconductor containing In, Sn, and Zn as its main component and/or by performing heat treatment after the deposition, characteristics of a transistor can be improved.

These substrate heating and heat treatment have an effect of preventing hydrogen, a hydroxyl group, and the like, which are unfavorable impurities for an oxide semiconductor film, from being included in the film or an effect of removing such unfavorable impurities from the film. That is, an oxide semiconductor can be highly purified by removing hydrogen serving as a donor impurity from the oxide semiconductor film, whereby a state closer to a normally-off state of the transistor can be obtained. The purification of an oxide semiconductor enables the off-state current of the transistor to be 1 aA/μm or lower. Here, the unit of the off-state current is used to indicate current per micrometer of a channel width.

Figure 25:
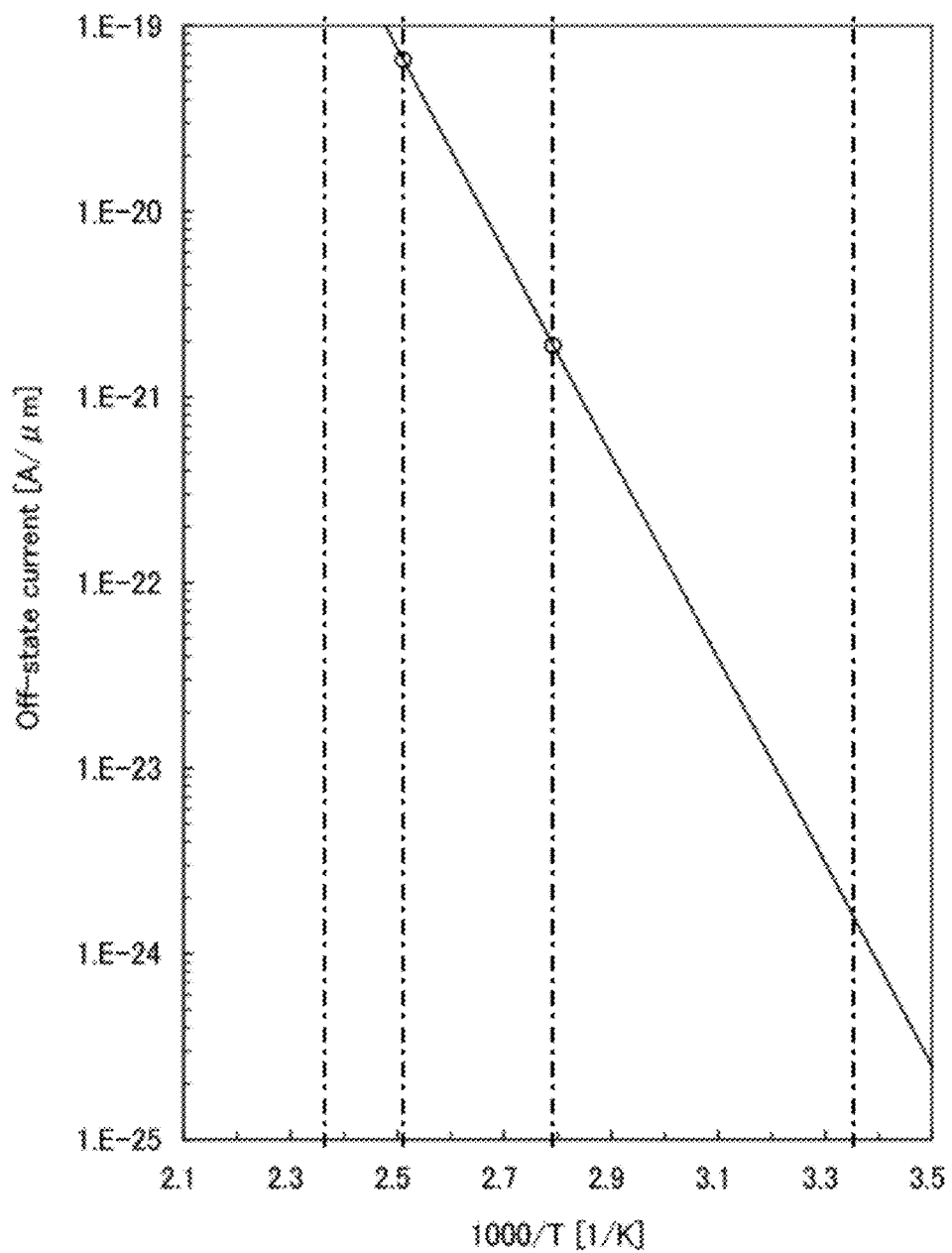
FIG. 25 is a graph showing the relation between off-state current of a transistor and substrate temperature in measurement.

FIG. 25 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as illustrated in FIG. 25, the off-state current can be 1 aA/μm ($1 \times 10^{-18}$ A/μm) or lower, 100 zA/μm ($1 \times 10^{-19}$ A/μm) or lower, and 1 zA/μm ($1 \times 10^{-21}$ A/μm) or lower when the substrate temperature is 125° C., 85° C., and room temperature (27° C.), respectively. Preferably, the off-state current can be 0.1 aA/μm ($1 \times 10^{-19}$ A/μm) or lower, 10 zA/μm ($1 \times 10^{-20}$ A/μm) or lower, and 0.1 zA/μm ($1 \times 10^{-22}$ A/μm) or lower at 125° C., 85° C., and room temperature, respectively.

Note that in order to prevent hydrogen or water from being included in the oxide semiconductor during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent water from being included in the film. In addition, it is preferable to use a target that is purified so as not to include impurities such as hydrogen, water, and the like. Although it is possible to remove water from an oxide semiconductor containing In, Sn, and Zn as its main component by heat treatment, a film that does not include water originally is preferably formed because water is released from the oxide semiconductor containing In, Sn, and Zn as its main component at a higher temperature than from an oxide semiconductor containing In, Ga, and Zn as its main component.

The relation between the substrate temperature and electrical characteristics of a transistor formed using a sample on which heat treatment at 650° C. was performed after formation of the oxide semiconductor film was evaluated.

The transistor used for the measurement has a channel length L of 3 μm, a channel width W of 10 μm, $L_{ov}$ of 0 μm, and $_dW$ of 0 μm. Note that $V_{ds}$ was set to 10 V. Note that measurement was performed at substrate temperatures of −40° C., −25° C., 25° C., 75° C., 125° C., and 150° C. Here, in a transistor, the width of a portion where a gate electrode overlaps with one of a pair of electrodes is referred to as $L_{ov}$, and the width of a portion of the pair of electrodes which does not overlap with an oxide semiconductor film is referred to as $_dW$.

Figure 26:
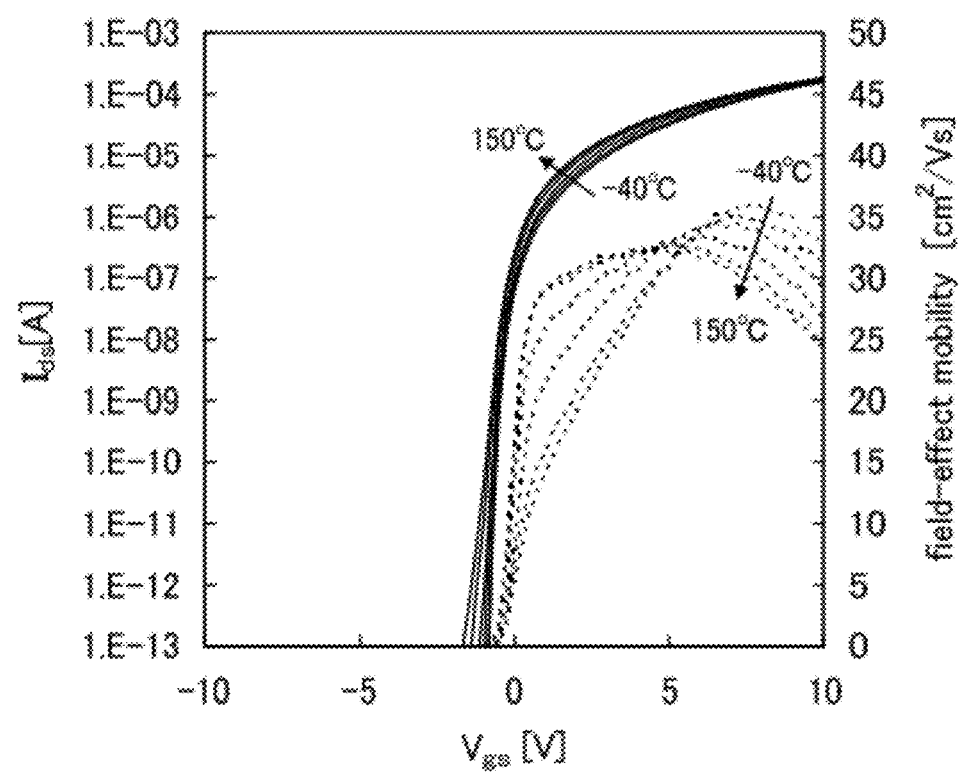
FIG. 26 is a graph showing $V_{gs}$ dependence of $I_{ds}$ and field effect mobility.
Figure 27A:
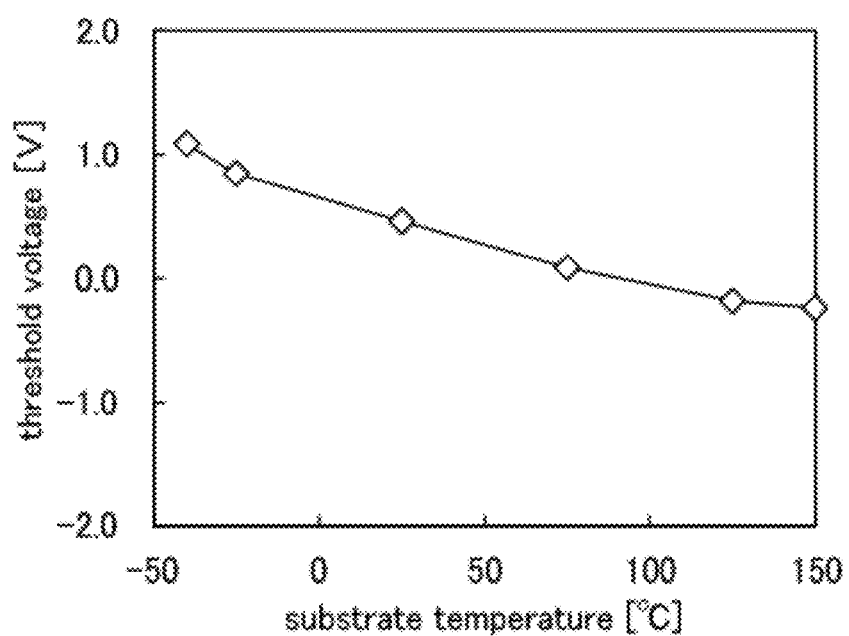
FIG. 27A is a graph showing the relation between substrate temperature and threshold voltage and FIG. 27B is a graph showing the relation between substrate temperature and field effect mobility.

FIG. 26 shows the $V_{gs}$ dependence of $I_{ds}$ (a solid line) and field-effect mobility (a dotted line). FIG. 27A shows a relation between the substrate temperature and the threshold voltage, and FIG. 27B shows a relation between the substrate temperature and the field-effect mobility.

From FIG. 27A, it is found that the threshold voltage gets lower as the substrate temperature increases. Note that the threshold voltage is decreased from 1.09 V to −0.23 V in the range from −40° C. to 150° C.

Figure 27B:
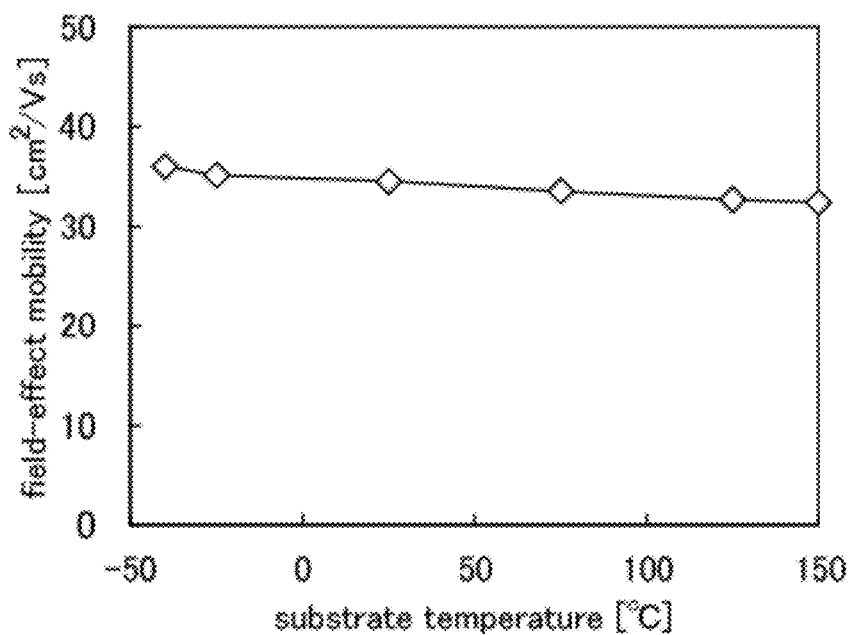

From FIG. 27B, it is found that the field-effect mobility gets lower as the substrate temperature increases. Note that the field-effect mobility is decreased from 36 cm²/Vs to 32 cm²/Vs in the range from −40° C. to 150° C. Thus, it is found that variation in electrical characteristics is small in the above temperature range.

In a transistor in which an oxide semiconductor containing In, Sn, and Zn as its main component is used as a channel formation region, a field-effect mobility of 30 cm²/Vs or higher, preferably 40 cm²/Vs or higher, further preferably 60 cm²/Vs or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electrical characteristics can be ensured in a temperature range needed for operation of a transistor. With such characteristics, an integrated circuit having a novel function can be fabricated without decreasing the operation speed even when a transistor that is formed using an oxide semiconductor is also provided in an integrated circuit formed using a Si semiconductor.

This embodiment can be implemented in appropriate combination with any of the above embodiments.

EXAMPLE 1

In this example, an example of a transistor that includes an In—Sn—Zn-based oxide as an oxide semiconductor film is described with reference to FIGS. 28A and 28B and the like.

Figure 28A:
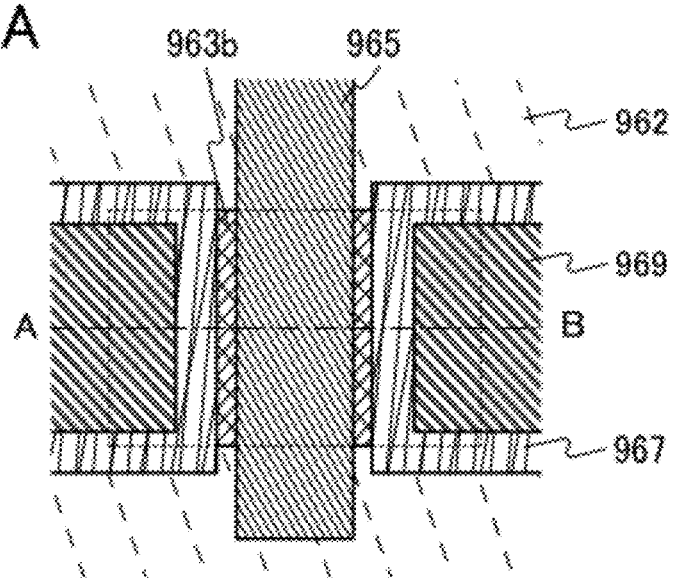
FIG. 28A is a top view of a semiconductor device and FIG. 28B is a cross-sectional view thereof.
Figure 28B:
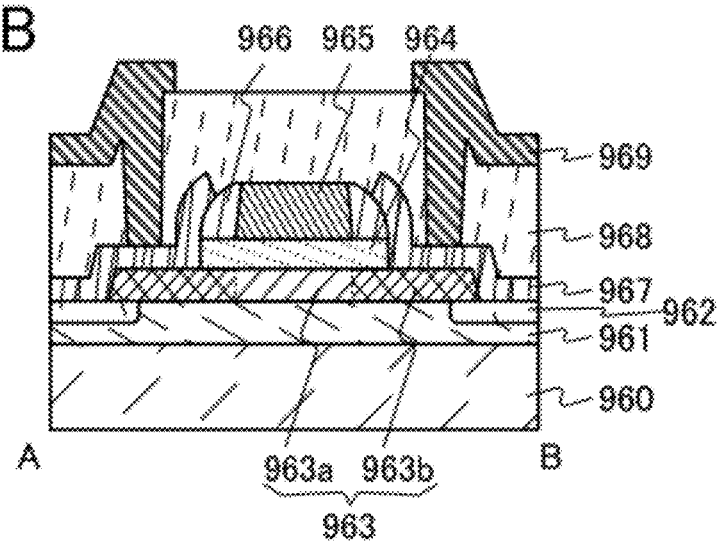

FIGS. 28A and 28B illustrate a coplanar transistor having a top-gate top-contact structure. FIG. 28A is a top view of the transistor. FIG. 28B is a cross-sectional view A-B along dashed-dotted line A-B in FIG. 28A.

The transistor illustrated in FIG. 28B includes a substrate 960; a base insulating film 961 provided over the substrate 960; a protective insulating film 962 provided in the periphery of the base insulating film 961; an oxide semiconductor film 963 provided over the base insulating film 961 and the protective insulating film 962 and including a high-resistance region 963a and low-resistance regions 963b; a gate insulating film 964 provided over the oxide semiconductor film 963; a gate electrode 965 provided to overlap with the oxide semiconductor film 963 with the gate insulating film 964 positioned therebetween; a sidewall insulating film 966 provided in contact with a side surface of the gate electrode 965; a pair of electrodes 967 provided in contact with at least the low-resistance regions 963b; an interlayer insulating film 968 provided to cover at least the oxide semiconductor film 963, the gate electrode 965, and the pair of electrodes 967; and a wiring 969 provided to be connected to at least one of the pair of electrodes 967 through an opening formed in the interlayer insulating film 968.

Although not illustrated, a protective film may be provided to cover the interlayer insulating film 968 and the wiring 969. With the protective film, a minute amount of leakage current generated by surface conduction of the interlayer insulating film 968 can be reduced and thus the off-state current of the transistor can be reduced.

EXAMPLE 2

In this example, another example of a transistor that includes an In—Sn—Zn-based oxide as an oxide semiconductor film is described.

Figure 29A:
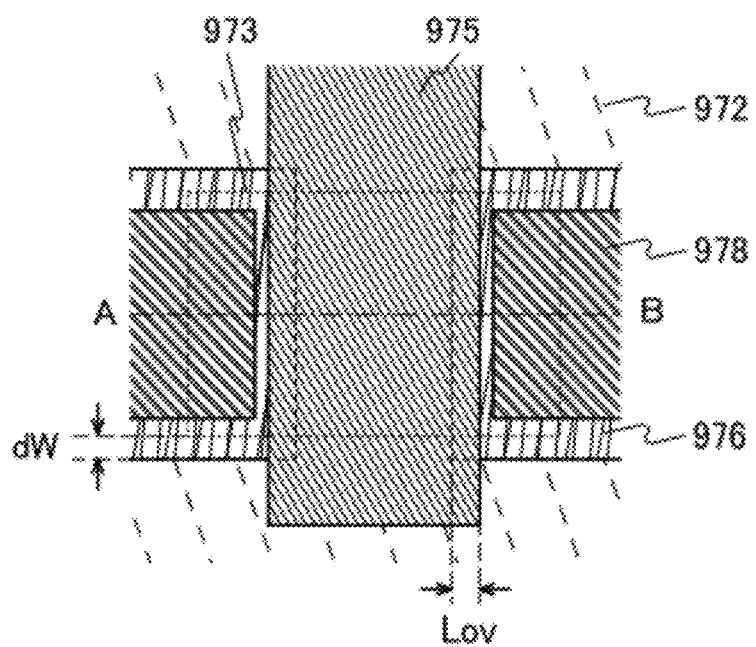
FIG. 29A is a top view of a semiconductor device and FIG. 29B is a cross-sectional view thereof.
Figure 29B:
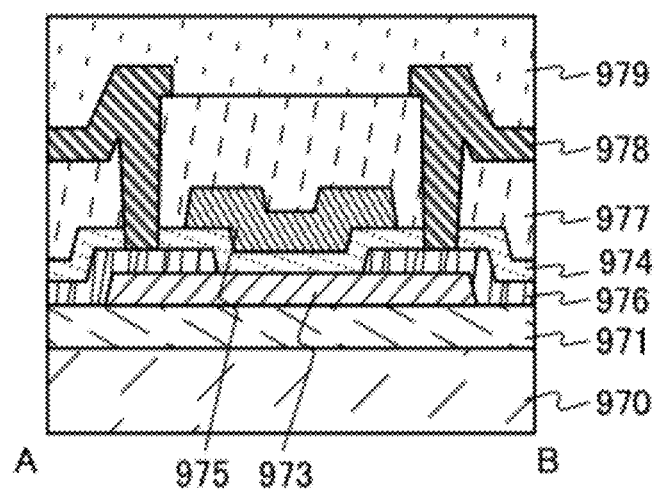

FIGS. 29A and 29B are a top view and a cross-sectional view illustrating the structure of a transistor manufactured in this manufacturing example. FIG. 29A is the top view of the transistor. FIG. 29B is the cross-sectional view along dashed-dotted line A-B in FIG. 29A.

The transistor illustrated in FIG. 29B includes a substrate 970; a base insulating film 971 provided over the substrate 970; an oxide semiconductor film 973 provided over the base insulating film 971; a pair of electrodes 976 in contact with the oxide semiconductor film 973; a gate insulating film 974 provided over the oxide semiconductor film 973 and the pair of electrodes 976; a gate electrode 975 provided to overlap with the oxide semiconductor film 973 with the gate insulating film 974 positioned therebetween; an interlayer insulating film 977 provided to cover the gate insulating film 974 and the gate electrode 975; wirings 978 connected to the pair of electrodes 976 through openings formed in the interlayer insulating film 977; and a protective film 979 provided to cover the interlayer insulating film 977 and the wirings 978.

As the substrate 970, a glass substrate can be used. As the base insulating film 971, a silicon oxide film can be used. As the oxide semiconductor film 973, an In—Sn—Zn-based oxide can be used. As the pair of electrodes 976, a tungsten film can be used. As the gate insulating film 974, a silicon oxide film can be used. The gate electrode 975 can have a stacked structure of a tantalum nitride film and a tungsten film. The interlayer insulating film 977 can have a stacked structure of a silicon oxynitride film and a polyimide film. The wirings 978 can each have a stacked structure in which a titanium film, an aluminum film, and a titanium film are formed in this order. As the protective film 979, a polyimide film can be used.

Note that in the transistor having the structure illustrated in FIG. 29A, the width of a portion where the gate electrode 975 overlaps with one of the pair of electrodes 976 is referred to as $L_{ov}$. Similarly, the width of a portion of the pair of electrodes 976, which does not overlap with the oxide semiconductor film 973, is referred to as $_dW$.

This application is based on Japanese Patent Application serial No. 2011-102574 filed with Japan Patent Office on Apr. 29, 2011 and Japanese Patent Application serial No. 2011-108903 filed with Japan Patent Office on May 14, 2011, the entire contents of which are hereby incorporated by reference.

What is claimed is:

1. A semiconductor device comprising:
a logic circuit to which a first power supply potential is supplied;
a storage circuit comprising a capacitor and a transistor; and
a reading circuit to which a second power supply potential is supplied,
wherein the transistor comprises an oxide semiconductor,
wherein one of a source and a drain of the transistor is electrically connected to the logic circuit,
wherein the other of the source and the drain of the transistor is electrically connected to one of the electrodes of the capacitor, and
wherein the other of the source and the drain of the transistor is electrically connected to the reading circuit.

2. The semiconductor device according to claim 1, wherein a gate of the transistor is electrically connected to the logic circuit.

3. The semiconductor device according to claim 1, wherein the first power supply potential is supplied from a first power source and the second power supply potential is supplied from a second power source.

4. The semiconductor device according to claim 1, wherein the first power supply potential and the second power supply potential are supplied from a power source via a power distribution circuit.

5. The semiconductor device according to claim 1, wherein the oxide semiconductor comprises In and one or more of elements selected from Sn, Zn, Ga, Al, Mn, and Co.

6. The semiconductor device according to claim 1, wherein the oxide semiconductor includes crystal.

7. An electronic device including the semiconductor device according to claim 1.

8. A semiconductor device comprising:
a power supply circuit;
a logic circuit; and
a storage circuit,
wherein the storage circuit comprises a capacitor and a transistor,
wherein the transistor is configured to control supply, holding, and release of charge in the capacitor,
wherein the power supply circuit is configured to supply power to the logic circuit and the storage circuit,
wherein the logic circuit is configured to store an arithmetic result of a signal input to the logic circuit in the storage circuit, and
wherein the storage circuit is configured to hold the arithmetic result even while supply of power is stopped in such a manner that the transistor is turned off before supply of power from the power supply circuit is stopped.

9. The semiconductor device according to claim 8, wherein the transistor comprises an oxide semiconductor.

10. The semiconductor device according to claim 9, wherein the oxide semiconductor comprises In and one or more of elements selected from Sn, Zn, Ga, Al, Mn, and Co.

11. The semiconductor device according to claim 9, wherein the oxide semiconductor includes crystal.

12. An electronic device including the semiconductor device according to claim 8.

13. A semiconductor device comprising:
a power supply circuit;
a logic circuit;
a storage circuit, and
a reading circuit electrically connected to the storage circuit,
wherein the storage circuit comprises a capacitor and a transistor,
wherein the transistor is configured to control supply, holding, and release of charge in the capacitor,
wherein the power supply circuit is configured to supply power to the logic circuit and the storage circuit,
wherein the logic circuit is configured to store an arithmetic result of a signal input to the logic circuit in the storage circuit, and
wherein the storage circuit is configured to hold the arithmetic result even while supply of power is stopped in such a manner that the transistor is turned off before supply of power from the power supply circuit is stopped, and wherein the arithmetic result held in the storage circuit is detected by the reading circuit.

14. The semiconductor device according to claim 13, wherein the arithmetic result held in the storage circuit is detected even while supply of power is stopped.

15. The semiconductor device according to claim 13, wherein the reading circuit is connected to a second power supply circuit.

16. The semiconductor device according to claim 13, wherein the transistor comprises an oxide semiconductor.

17. The semiconductor device according to claim 16, wherein the oxide semiconductor comprises In and one or more of elements selected from Sn, Zn, Ga, Al, Mn, and Co.

18. The semiconductor device according to claim 16, wherein the oxide semiconductor includes crystal.

19. An electronic device including the semiconductor device according to claim 13.

* * * * *

UNITED STATES PATENT AND TRADEMARK OFFICE
CERTIFICATE OF CORRECTION

PATENT NO. : 8,446,171 B2
APPLICATION NO. : 13/453160
DATED : May 21, 2013
INVENTOR(S) : Yasuyuki Takahashi It is certified that error appears in the above-identified patent and that said Letters Patent is hereby corrected as shown below:

In the Specification:

At column 42, line 58, "c represents" should be --$\varepsilon$ represents--.

Signed and Sealed this
Eighth Day of October, 2013

Teresa Stanek Rea
*Deputy Director of the United States Patent and Trademark Office*